(12) United States Patent
Yamazaki et al.

(10) Patent No.: US 7,636,078 B2
(45) Date of Patent: Dec. 22, 2009

(54) DISPLAY DEVICE AND ELECTRONIC DEVICE

(75) Inventors: Shunpei Yamazaki, Tokyo (JP); Jun Koyama, Kanagawa (JP); Yoshifumi Tanada, Kanagawa (JP); Mitsuaki Osame, Kanagawa (JP); Hajime Kimura, Kanagawa (JP); Ryota Fukumoto, Kanagawa (JP); Hiromi Yanai, Kanagawa (JP)

(73) Assignee: Semiconductor Energy Laboratory Co., Ltd., Atsugi-si, Kanagawa-ken (JP)

( * ) Notice: Subject to any disclaimer, the term of this patent is extended or adjusted under 35 U.S.C. 154(b) by 612 days.

(21) Appl. No.: 11/383,674

(22) Filed: May 16, 2006

(65) Prior Publication Data

US 2006/0273999 A1 Dec. 7, 2006

(30) Foreign Application Priority Data

May 20, 2005 (JP) ............................. 2005-148837

(51) Int. Cl.
*G09G 3/36* (2006.01)
*G09G 3/30* (2006.01)
*G06F 3/038* (2006.01)

(52) U.S. Cl. ........................... 345/100; 345/76; 345/98; 345/204

(58) Field of Classification Search ................... 345/76, 345/81, 89, 96, 100, 207, 690
See application file for complete search history.

(56) References Cited

U.S. PATENT DOCUMENTS

| 3,838,209 A | 9/1974 | Tsuchiya et al. |
| 4,386,345 A | 5/1983 | Narveson et al. |
| 5,333,243 A | 7/1994 | Best et al. |
| 5,363,118 A | 11/1994 | Okumura |

(Continued)

FOREIGN PATENT DOCUMENTS

EP  1 103 946 A2  5/2001

(Continued)

OTHER PUBLICATIONS

Washio et al., "TFT-LCDs with Monolithic Multi-Drivers for High Performance Video and Low-Power Text Modes", SID Digest '01, 2001, pp. 276-279.

*Primary Examiner*—Bipin Shalwala
*Assistant Examiner*—Ilana Spar
(74) *Attorney, Agent, or Firm*—Fish & Richardson P.C.

(57) ABSTRACT

It is an object of the present invention to provide a display device in which images can be seen under a dark place to intense external light. In the display device, display is performed by changing the gray scale number depending on external light intensity, and display modes can be switched depending on contents displayed on the screen. An analog mode and a digital mode are switched depending on external light intensity. In an analog digital switching circuit, when a video signal is an analog value, a signal is outputted to a pixel array without any change and, when the video signal is a digital value, the signal is outputted to a circuit that performs a digital operation such as a latch circuit. Consequently, display gray scales of a pixel are changed appropriately. Accordingly, a clear image can be displayed. For example, it is possible to ensure visibility in a wide range of a dark place or under indoor florescent light to outdoor sun light.

28 Claims, 44 Drawing Sheets

U.S. PATENT DOCUMENTS

| | | | |
|---|---|---|---|
| 5,406,305 | A | 4/1995 | Shimoyama et al. |
| 5,489,918 | A | 2/1996 | Mosier |
| 5,523,772 | A | 6/1996 | Lee |
| 5,818,419 | A | 10/1998 | Tajima et al. |
| 5,867,140 | A | 2/1999 | Rader |
| 5,933,130 | A | 8/1999 | Wagner |
| 6,037,917 | A | 3/2000 | Kawakami |
| 6,040,812 | A | 3/2000 | Lewis |
| 6,088,012 | A | 7/2000 | Shigeta et al. |
| 6,229,505 | B1 | 5/2001 | Fujii |
| 6,339,422 | B1 | 1/2002 | Kuwajima et al. |
| 6,396,508 | B1 | 5/2002 | Noecker |
| 6,414,661 | B1 | 7/2002 | Shen et al. |
| 6,417,824 | B1 | 7/2002 | Tokunaga et al. |
| 6,504,522 | B2 | 1/2003 | Shiraki et al. |
| 6,552,736 | B2 | 4/2003 | Honda et al. |
| 6,646,625 | B1 | 11/2003 | Shigeta et al. |
| 6,678,834 | B1 | 1/2004 | Aihara et al. |
| 6,693,614 | B2 | 2/2004 | Kamiya |
| 6,738,036 | B2 | 5/2004 | Janssen et al. |
| 6,784,898 | B2 | 8/2004 | Lee et al. |
| 6,806,859 | B1 | 10/2004 | Kanoh et al. |
| 2001/0005193 | A1* | 6/2001 | Yokoyama .................. 345/92 |
| 2001/0005196 | A1 | 6/2001 | Ishii |
| 2001/0011989 | A1 | 8/2001 | Hayashi |
| 2001/0022565 | A1 | 9/2001 | Kimura |
| 2001/0033252 | A1 | 10/2001 | Yamazaki et al. |
| 2002/0000969 | A1 | 1/2002 | Ozawa |
| 2002/0011978 | A1 | 1/2002 | Yamazaki et al. |
| 2002/0015043 | A1 | 2/2002 | Matsuda |
| 2002/0024529 | A1 | 2/2002 | Miller et al. |
| 2002/0047568 | A1 | 4/2002 | Koyama |
| 2002/0047852 | A1 | 4/2002 | Inukai et al. |
| 2002/0075249 | A1* | 6/2002 | Kubota et al. ............... 345/204 |
| 2002/0154151 | A1 | 10/2002 | Koyama |
| 2002/0158857 | A1 | 10/2002 | Iisaka |
| 2002/0163591 | A1 | 11/2002 | Tsutsui |
| 2002/0171607 | A1* | 11/2002 | Senda et al. .................. 345/55 |
| 2003/0025663 | A1 | 2/2003 | Waterman et al. |
| 2003/0058235 | A1 | 3/2003 | Moon |
| 2003/0063077 | A1 | 4/2003 | Koyama |
| 2003/0174153 | A1 | 9/2003 | Koyama |
| 2004/0095364 | A1 | 5/2004 | Koyama et al. |
| 2004/0189630 | A1 | 9/2004 | Huh et al. |
| 2004/0257359 | A1 | 12/2004 | Muroi et al. |
| 2005/0007392 | A1 | 1/2005 | Kasai et al. |
| 2005/0012731 | A1 | 1/2005 | Yamazaki et al. |
| 2005/0017963 | A1 | 1/2005 | Yamazaki et al. |
| 2005/0017964 | A1 | 1/2005 | Yamazaki et al. |
| 2005/0127846 | A1 | 6/2005 | Kim |
| 2006/0055629 | A1 | 3/2006 | Van Woudenberg |
| 2006/0082568 | A1 | 4/2006 | Yamazaki et al. |
| 2006/0114213 | A1 | 6/2006 | Yokoyama |
| 2006/0244702 | A1 | 11/2006 | Yamazaki et al. |
| 2006/0262066 | A1* | 11/2006 | Yamazaki et al. ............. 345/98 |
| 2008/0084403 | A1 | 4/2008 | Kimura et al. |

FOREIGN PATENT DOCUMENTS

| | | |
|---|---|---|
| EP | 1 298 637 A2 | 4/2003 |
| GB | 2177829 | 1/1987 |
| JP | 08-069690 | 3/1996 |
| JP | 2001-324958 | 11/2001 |
| JP | 2001-343933 | 12/2001 |
| JP | 2003-186455 | 7/2003 |
| TW | 78107405 | 1/1991 |

* cited by examiner

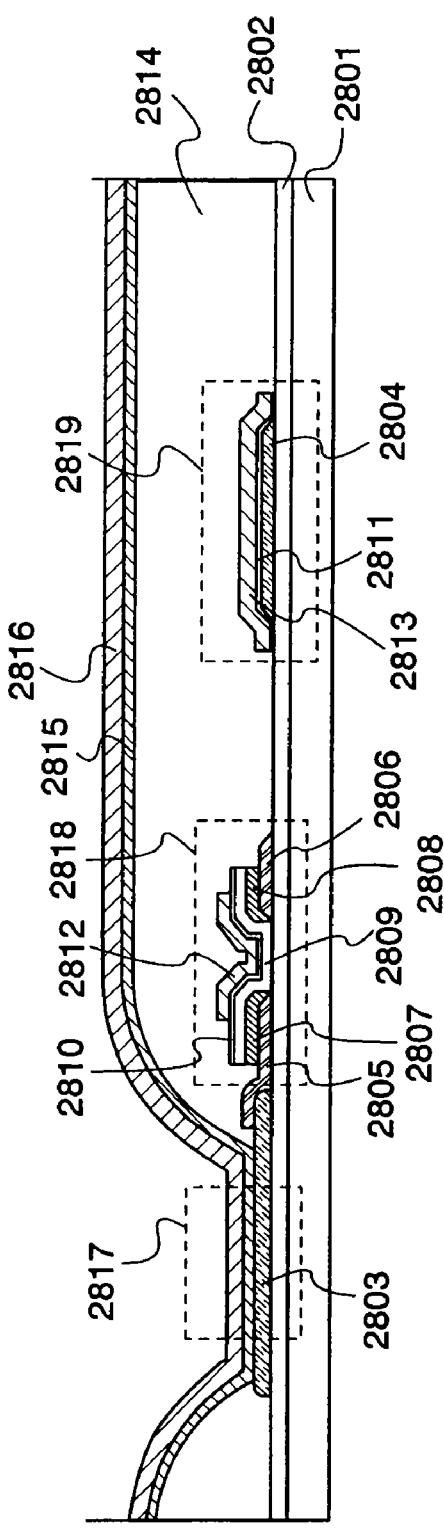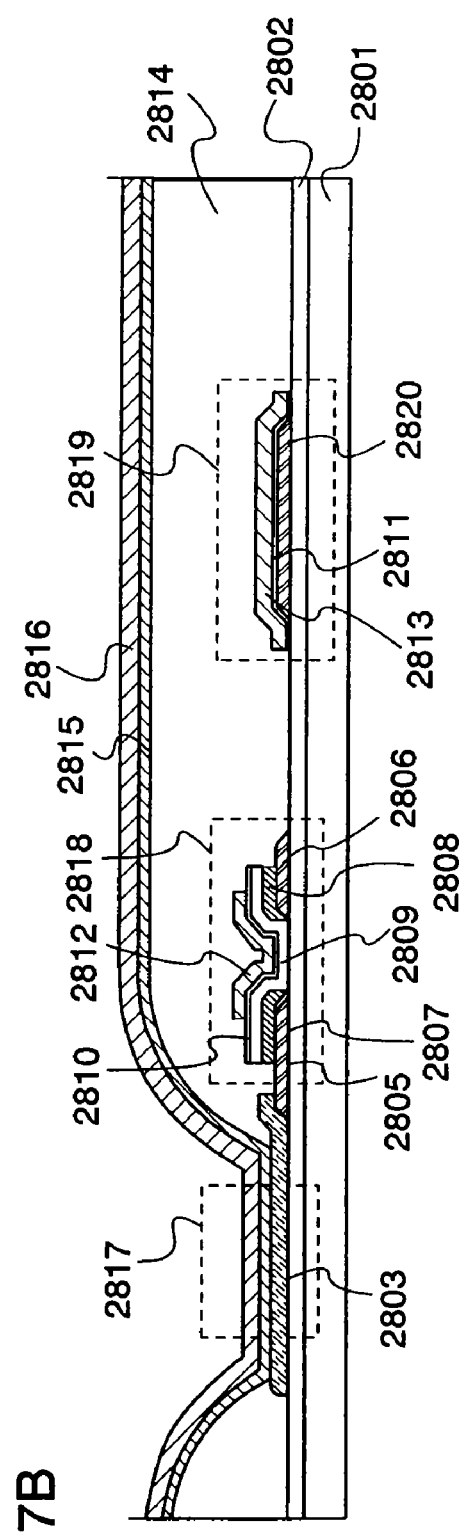
FIG. 37A
FIG. 37B

DISPLAY DEVICE AND ELECTRONIC DEVICE

BACKGROUND OF THE INVENTION

1. Field of the Invention

The present invention relates to a display device equipped with a screen that displays a character, a still image, a moving image, or the like and relates to a technique to improve visibility of a display screen in various environments where the display device is used.

2. Description of the Related Art

In recent years, a so-called self-luminous type display device having a pixel that is formed of a light-emitting element such as a light-emitting diode (LED) has been attracting attention. As a light-emitting element used for such a self-luminous type display device, an organic light-emitting diode (OLED) (also called an organic EL element, an electro luminescence: EL element, and the like) has been drawing attention and used for an EL display (for example, an organic EL display or the like). Since a light-emitting element such as an OLED is a self-luminous type, it has advantages such as higher visibility of pixels than that of a liquid crystal display, and fast response without requiring a backlight. The luminance of a light-emitting element is controlled by a current value flowing through it.

As a driving method for controlling a light-emitting gray scale of such a display device, there are a digital gray scale method and an analog gray scale method. According to the digital gray scale method, a light-emitting element is turned on/off in a digital manner to express a gray scale. Meanwhile, the analog gray scale method includes a method for controlling the light-emitting intensity of a light-emitting element in an analog manner and a method for controlling the light-emitting time of a light-emitting element in an analog manner.

In the case of the digital gray scale method, there are only two states: a light-emitting state and a non-light-emitting state. Therefore, only two gray scales can be expressed if nothing is done. Accordingly, another method is used in combination to achieve multiple gray scales. A time gray scale method is often used as a method for multiple gray scales (see Reference 1: Japanese Patent Application Laid-Open No. 2001-324958 and Reference 2: Japanese Patent Application Laid-Open No. 2001-343933).

As a display for controlling a display state of a pixel in a digital manner and expressing a gray scale in combination with a time gray scale, there are some displays as well as an organic EL display using the digital gray scale method. As an example, there is a plasma display or the like.

The time gray scale method is a method for expressing a gray scale by controlling the length of a light-emitting period or the frequency of light emission. In other words, one frame period is divided into a plurality of sub-frame periods, each of which is weighted with respect to the frequency of light emission and a light-emitting period, and then the total weight (the sum of the frequency of light emission and the sum of the light-emitting period) is differentiated for each gray scale, thereby expressing a gray scale.

In the meantime, an apparent image quality is emphasized even in such a display panel and many display panels provided with a function to adjust brightness or contrast automatically or manually prevails widely. For example, a liquid crystal display device provided with adjustability to improve visibility of a gray scale by changing transmittance of a liquid crystal without increasing luminance of a backlight of a liquid crystal panel is known (see Reference 3: Japanese Patent Application Laid-Open No. 2003-186455).

However, although a liquid crystal display panel has preferable visibility in an indoor environment of 300 to 700 luxes, there is a problem that the visibility is deteriorated significantly in an outdoor environment of 1,000 luxes or more. There is a liquid crystal panel having a structure where external light is reflected by a pixel electrode, which is referred to as a reflective liquid crystal panel; however, the image quality is rather deteriorated under indoor florescent light; thus, the problem is not solved fundamentally. In other words, it is not solved to ensure visibility in wide range of under dark or indoor florescent light to outdoor sun light.

SUMMARY OF THE INVENTION

Thus, it is an object of the present invention to provide a display device in which images can be seen under a dark place to intense external light.

According to one feature of a display device in the present invention, where a plurality of pixels is arranged in matrix, the display device has a source driver and a gate driver, and the source driver has a circuit that supplies any one signal of a digital value and an analog value to the pixel depending on external light intensity.

According to another feature of a display device in the present invention, where a plurality of pixels is arranged in matrix, the display device has at least two display modes, an analog signal is supplied to the pixel in the first display mode, a digital signal is supplied to the pixel in the second display mode, and the display modes are switched depending on external light intensity.

According to another feature of a display device in the present invention, where a plurality of pixels is arranged in matrix, the display device has at least first and second display modes, the pixel has a light-emitting element, an analog signal is supplied to the pixel in the first display mode, a digital signal is supplied to the pixel in the second display mode, the display modes are switched depending on external light intensity, and voltage supplied to the light-emitting element is different in the first and second display modes.

According to another feature of a display device in the present invention, where a plurality of pixels is arranged in matrix, the display device has at least first and second display modes, the pixel has a light-emitting element and a transistor, a first electrode of the light-emitting element and one of source and drain electrodes of the transistor are connected, an analog signal is supplied to the pixel in the first display mode, a digital signal is supplied to the pixel in the second display mode, the display modes are switched depending on external light intensity, and voltage between a second electrode of the light-emitting element and the other of the source and drain electrodes of the transistor is different in the first and second display modes.

Note that, according to the present invention, a transistor of various modes can be applied. Thus, a kind of transistor that can be applied is not limited. Therefore, a thin film transistor (TFT) using a non-single crystalline semiconductor film typified by amorphous silicon or polycrystalline silicon, a MOS transistor which is formed using a semiconductor substrate or an SOI substrate, a junction transistor, a bipolar transistor, a transistor using a compound semiconductor such as ZnO or a-InGaZnO, a transistor using an organic semiconductor or a carbon nanotube, or other transistors can be applied. Note that hydrogen or halogen may also be contained in the non-single crystalline semiconductor film. In addition, various substrates can be used as a kind of substrate where a transistor is disposed and the substrate is not limited to a specific one. Thus, a transistor can be disposed over a single-crystalline substrate, an SOI substrate, a glass substrate, a quartz substrate, a plastic substrate, a paper substrate, a cellophane substrate, a stone material substrate, or the like, for example. Moreover, a transistor may also be formed over one substrate and thereafter the transistor is moved to another substrate to be disposed over another substrate.

Note that various modes can be applied as a structure of a transistor, which is not limited to a specific structure. For example, a multi-gate structure where the number of gates is two or more may also be employed. By employing the multi-gate structure, off current can be reduced, withstand pressure of a transistor can be improved to have preferable reliability, and a flat characteristic can be obtained with few current between a drain and a source changed even when voltage between the drain and source is changed when a transistor is operated in a saturation region. In addition, a structure where a gate electrode is disposed between upper and lower channels may also be employed. By employing the structure where a gate electrode is disposed between upper and lower channels, a channel region increases; therefore, a current value can be increased and a preferable S value can be obtained because a depletion layer is formed easily. Moreover, any one of a structure where a gate electrode is disposed over a channel, a structure where a gate electrode disposed below a channel, a forward stagger structure, and a reverse stagger structure may be employed. Alternatively, a channel region may be divided in a plurality of regions, or a channel region may be connected in parallel or in series. Further, a source or drain electrode may be overlapped with a channel (or part thereof). By employing a structure where a source or drain electrode may be overlapped with a channel (or part thereof), an electric charge is stored in part of a channel, which can prevent the operation from being unstable. Furthermore, there may also be an LDD region. By providing the LDD region, off current can be reduced, withstand pressure of a transistor can be improved to have preferable reliability, and a flat characteristic can be obtained without current between a drain and a source changed so much even when voltage between the drain and the source is changed when a transistor is operated in a saturation region.

Note that, according to the present invention, "being connected" includes a case electrically connected and a case directly connected. Therefore, in a structure disclosed by the present invention, in addition to a predetermined connection relation, other elements that enables electrical connection therebetween (for example, a switch, a transistor, a capacitor element, an inductor, a resistive element, a diode, or the like) may also be disposed. Alternatively, there may be direct connection and disposition without interposing other element therebetween. Note that a case only including a case where there is connection, without interposing other element that enables electrical connection therebetween, and direct connection does not include a case where there is electrical connection. Such a case is to be described as "being directly connected." Note that a case described as "being electrically connected" includes a case of being electrically connected and a case of being directly connected.

Note that, according to the present invention, one pixel shows one element that can control brightness. Thus, as one example, one pixel refers to one color element, and brightness is expressed by only one color element. Therefore, in a case of a color display device including color elements of R (red), G (green), and B (blue) at that time, a minimum unit of an image includes three pixels of R, G, and B. Note that the color element is not limited to three colors and three or more colors may be used. For example, there are R, G, B, and W (W is white), R, G, and B added with yellow, cyan, and magenta, and the like. In addition, as another example, in a case where brightness of one color element is controlled by using a plurality of regions, one of the regions is considered as one pixel. Thus, as one example, in a case of performing an area gray scale, there is a plurality of regions where brightness is controlled per one color element and a gray scale is expressed in the whole region, and one region where brightness is controlled is considered as one pixel. Thus, in this case, one color element includes a plurality of pixels. In addition, in this case, the size of a region that contributes to display may be different depending on a pixel. Moreover, in a region where a plurality of brightness is controlled per one color element, that is, a plurality of pixels that constitutes one color element, a viewing angle may be expanded so that a signal supplied to each is slightly made different.

Note that, according to the present invention, a pixel includes a case where pixels are arranged in matrix. Herein, "pixels are arranged in matrix" includes a case of a so-called lattice arrangement in which a perpendicular stripe and a horizontal stripe are combined with each other, a case where dots of three color elements have a so-called delta arrangement when full color display is performed using three color elements (for example, R, G, and B), and further a case of Bayer arrangement. In addition, the size of a light-emitting region thereof may be differed in each dot of a color element.

Note that a transistor refers to an element having three terminals each including at least a gate, a drain, and a source. The gate refers to the whole of a gate electrode and a gate wiring (also referred to as a gate line, a gate signal line, or the like), or part thereof. The gate electrode refers to a semiconductor to form a channel region, an LDD (Lightly Doped Drain) region, or the like, and a portion of a conductive film which is overlapped through a gate insulating film. The gate wiring refers to a wiring to connect between gate electrodes of each pixel or to connect to a wiring different from the gate electrode.

However, there is a portion that serves as a gate electrode and a gate wiring. Such a region may be referred to as a gate electrode or a gate wiring. In other words, there is a region where a gate electrode and a gate wiring cannot be distinguished apparently. For example, when there is a channel region to overlap with a gate wiring that is arranged by being extended, the region serves as a gate wiring as well as a gate electrode. Thus, such a region may be referred to as a gate electrode or a gate wiring.

In addition, a region formed from the same material as the gate electrode and connected to the gate electrode may also be referred to as a gate electrode. In the same manner, a region formed from the same material as the gate wiring and connected to the gate wiring may also be referred to as a gate wiring. In such a region, in a strict sense, there is a case where the region is not overlapped with a channel region or a function to connect to another gate electrode is lacked. However, with relation to a manufacturing margin or the like, there is a region formed from the same material as the gate electrode or the gate wiring and connected to the gate electrode or the gate wiring. Thus, such a region may also be referred to as a gate electrode or a gate wiring.

Moreover, for example, a gate electrode of one transistor and a gate electrode of another transistor in a multi-gate transistor are connected to a conductive film formed from the same material as the gate electrode in many cases. Since such a region is a region to connect the gate electrode and the gate electrode to each other, the region may also be referred to as a gate wiring; however, since the multi-gate transistor can be regarded as one transistor, the multi-gate transistor may also be referred to as a gate electrode. In other words, those formed from the same material as the gate electrode or the gate wiring and arranged by being connected thereto may also be referred to as a gate electrode or a gate wiring. Further, for example, a portion of a conductive film which is connected to the gate electrode or the gate wiring may also be referred to as a gate electrode or a gate wiring.

Note that a gate terminal refers to part of a region of a gate electrode or a region electrically connected to the gate electrode.

Note that a source refers to the whole of a source region, a source electrode, and a source wiring (also referred to as a source line, a source signal line, or the like), or part thereof. The source region refers to a semiconductor region where a P-type impurity (boron or gallium) or an N-type impurity (phosphorus or arsenic) is contained much. Therefore, the source region does not include a region where a P-type impurity or an N-type impurity is slightly contained, that is, a so-called an LDD (Lightly Doped Drain) region. The source electrode is formed from a material different from the source region, which refers to a portion of a conductive layer which is arranged by being electrically connected to the source region. However, the source electrode may include the source region to be referred to as a source electrode. The source wiring refers to a wiring to connect between source electrodes of each pixel or to connect a wiring different from the source electrode.

However, there is a portion that serves as a source electrode and a source wiring. Such a region may be referred to as a source electrode or a source wiring. In other words, there is a region where a source electrode and a source wiring cannot be distinguished apparently. For example, when there is a source region to overlap with a source wiring that is arranged by being extended, the region serves as a source wiring as well as a source electrode. Thus, such a region may be referred to as a source electrode or a source wiring.

In addition, a region formed from the same material as the source electrode and connected to the source electrode or a portion to connect a source electrode and a source electrode to each other may also be referred to as a source electrode. In addition, a portion overlapped with a source region may also be referred to as a source electrode. In the same manner, a region formed from the same material as the source wiring and connected to the source wiring may also be referred to as a source wiring. In such a region, in a strict sense, there is a case where a function to connect to another gate electrode is lacked. However, with relation to a manufacturing margin or the like, there is a region formed from the same material as the source electrode or the source wiring and connected to the source electrode or a source wiring. Thus, such a region may also be referred to as a source electrode or a source wiring.

Moreover, for example, a portion of a conductive film where the source electrode and the source wiring are connected may also referred to as a source wiring.

Note that a source terminal refers to part of a source region, a source electrode, or a region electrically connected to the source electrode.

Note that a drain is the same as the source.

Note that, according to the present invention, the description of "being formed over a certain object" does not necessarily refer to "being in direct contact with the certain object." This includes a case where there is no direct contact, that is, a case where another object is sandwiched therebetween. Therefore, for example, a case where a layer B is formed over a layer A includes a case where the layer B is formed on the layer A to be in direct contact therewith and a case where another layer (for example, a layer C, a layer D, or the like) is formed on the layer A to be in direct contact therewith and the layer B is formed thereon to be in direct contact therewith. In addition, the same can be said for the description of "above a certain object," which does not necessarily refer to "being in direct contact with the certain object," and a case where another object is sandwiched therebetween is included. Therefore, for example, a case where a layer B is formed above a layer A includes a case where the layer B is formed on the layer A to be in direct contact therewith and a case where another layer (for example, a layer C, a layer D, or the like) is formed on the layer A to be in direct contact therewith and the layer B is formed thereon to be in direct contact therewith. Note that the same can be said for the description of "under a certain object" or "below a certain object," which includes a case where there is direct contact and there is no direct contact.

According to the present invention, it is possible to provide a display device superior in visibility by controlling the gray scale number of a display image depending on external light intensity. In other words, it is possible to obtain a display device in which visibility is ensured in a wide range of a dark place or under indoor florescent light to outdoor sun light.

These and other objects, features and advantages of the present invention will become more apparent upon reading of the following detailed description along with the accompanied drawings.

BRIEF DESCRIPTION OF THE DRAWINGS

In the accompanying drawings:

FIGS. 37A and 37B are views each explaining a structure of a display device according to the present invention;

DETAILED DESCRIPTION OF THE INVENTION

Embodiment Modes of the present invention will be explained below with reference to the accompanying drawings. However, it is to be easily understood that various changes and modifications will be apparent to those skilled in the art. Therefore, unless such changes and modifications depart from the scope of the present invention, they should be construed as being included therein.

Embodiment Mode 1

Figure 1:
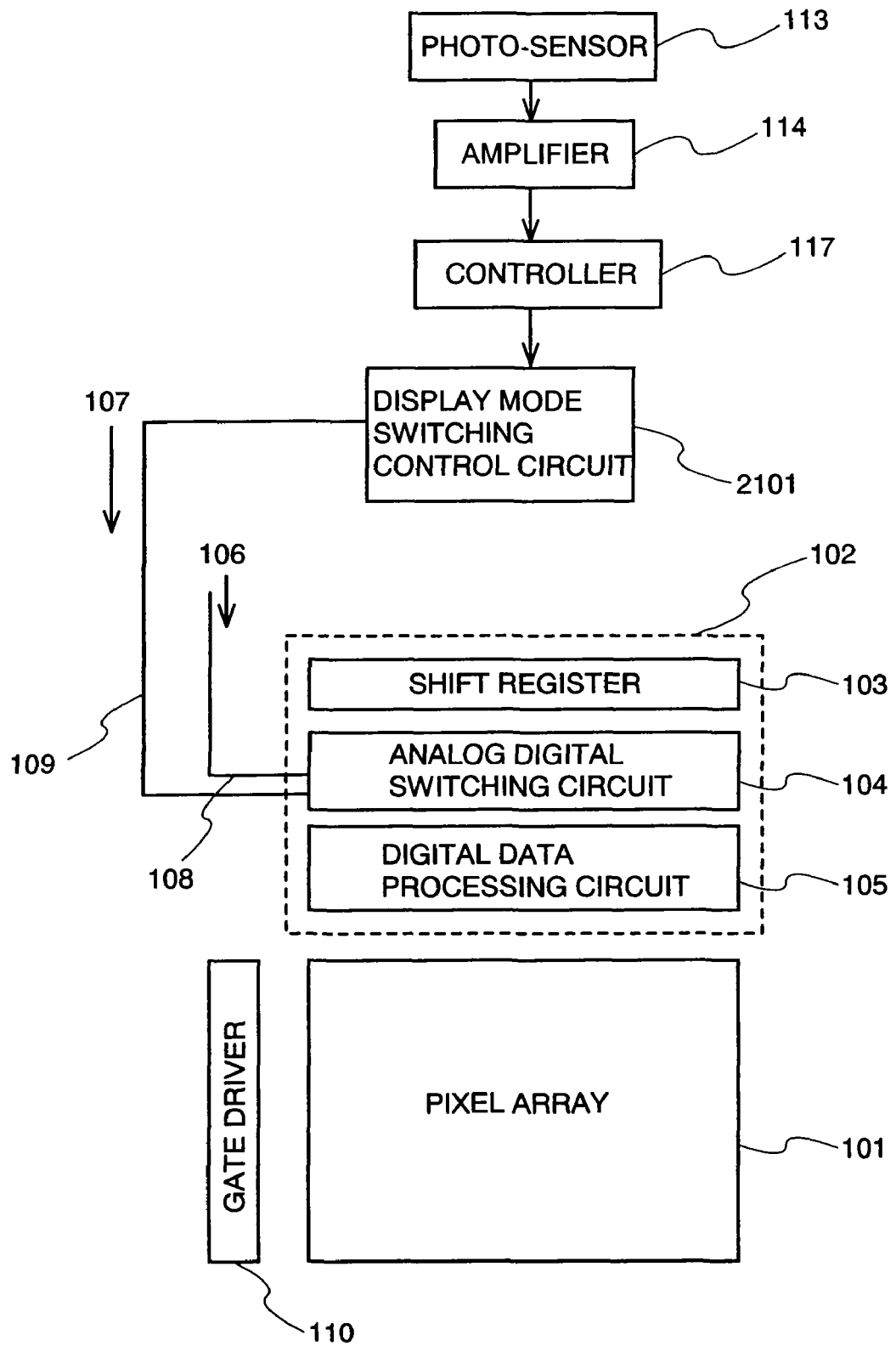
FIG. 1 is a diagram explaining a configuration of a display device according to the present invention.

FIG. 1 shows an overall configuration diagram. A source driver 102 and a gate driver 110 are disposed to drive a pixel array 101. Note that a plurality of the source drivers 102 and gate drivers 110 may each be disposed.

A photo-sensor 113 detects external light (external light that a display device receives). The output is supplied to an amplifier 114. The amplifier 114 amplifies an electrical signal outputted by the photo-sensor 113, and the amplified electrical signal is supplied to a controller 117. Note that the device can be constituted without the amplifier 114 when the electrical signal outputted by the photo-sensor 113 is sufficiently large.

The controller 117 controls a display mode switching control circuit 2101. A display mode, the gray scale number, or the like is determined in the display mode switching control circuit 2101. Then, a display mode control signal 107 is controlled by being outputted to the source driver 102.

The controller 117 controls the display mode switching control circuit 2101 based on the signal from the photo-sensor 113. Then, the gray scale number of a video signal or the display mode control signal 107 that is supplied to the source driver 102 is controlled by the signal from the photo-sensor 113, that is, depending on surrounding luminance. In controlling the gray scale number, the number may be changed gradually depending on the surrounding luminance or which display mode a display is performed in is may be switched by having some display modes.

Accordingly, a display mode, that is, the gray scale number at the time of displaying is changed, based on the output of the photo-sensor 113. Specifically, when a display device receives strong external light and the output of the photo-sensor 113 becomes over a certain value, the total gray scale number of an image displayed on a display screen is reduced. When the display device receives strong external light, a distinction between a gray scale and another gray scale becomes unclear, and an image displayed on the display screen is blurred. However, by reducing the total gray scale number according to external light which the display device receives, as described above, a distinction between a gray scale and another gray scale becomes clear and visibility of the display screen can be improved.

In addition, in a case where the total gray scale of an image displayed on the display screen is set to be 2 gray scales by the output of the photo-sensor 113, although a black display image is usually displayed on a white background image, it may be inverted so that a white display image is displayed on a black background image. In such a way, visibility of the display screen can be further improved. Moreover, by increasing luminance of the white display image, visibility of the display screen can be further improved. The combination of a background image and a display image is not limited to the white display on the black background, and arbitrary color combinations can be used as long as the combination can make a contrast (LD ratio is clear) easily.

The output of the photo-sensor 113 is sent to the controller 117 via the amplifier 114. The controller 117 detects whether the output of the photo-sensor 113 is over a certain value or not. When the output of the photo-sensor 113 does not reach the certain value, the total gray scale number of a video signal outputted to a display panel is not changed. On the other hand, when the output of the photo-sensor 113 is the certain value or more, the total gray scale number of a video signal outputted to the display panel is corrected to be smaller.

As shown in Table 1, indoor or outdoor brightness varies according to the lighting condition, the climate condition such as weather, and time. For example, the illuminance in a room with lighting is approximately 800 to 1,000 lux, the illuminance under a cloudy sky of daytime is approximately 32,000 lux, and the illuminance under a clear sky of daytime reaches 100,000 lux.

[Table 1]

A result of comparison among visibilities of a display panel using electroluminescence (EL panel), a transmissive liquid crystal panel (transmissive LCD panel), a semi-transmissive liquid crystal panel (semi-transmissive LCD panel), and a reflective liquid crystal panel (reflective LCD) under conditions with such various brightness is shown in Table 2.

[Table 2]

As a result, in an environment with brightness of up to approximately 1,500 lux (mainly indoor, such as a hall with lighting), preferable visibilities are obtained from the EL panel and various liquid crystal panels except the reflective liquid crystal panel, with any display pattern (a natural image, text (characters and symbols) and the like). On the other hand, in an environment of 10,000 lux (cloudy daytime), in the case of the EL panel and the transmissive liquid crystal panel, visibility of part where the contrast is low, such as a half-tone part, tends to be significantly decreased when a natural image is displayed. However, even in this case, visibility of the EL panel is preferable to that of the transmissive liquid crystal panel. In addition, as for the EL panel, the visibility recovers when the gray scale number is decreased (from 2 to 8 gray scales), and a visibility practically having no problem is obtained especially for text display. On the other hand, as for the semi-transmissive liquid crystal panel, even though the contrast is slightly low in environments of indoor to outdoor overall, preferable visibility is obtained in an environment of 10,000 lux. The reflective liquid crystal panel is superior in power consumption; however, the visibility tends to decrease in an environment with relatively low illuminance such as indoor. Since the backlight consumes power, the power consumption of the transmissive liquid crystal panel is higher than that of the reflective liquid crystal panel. On the other hand, in the case of the EL panel, the power consumption is lowered in a display mode with the reduced gray scale number.

As is apparent from Table 2, by using an EL panel and having a display mode the gray scale number of which is adjusted according to the external light strength, it is possible to provide a display device the visibility of which is ensured in environments of indoor to outdoor and the power consumption is lowered.

For example, as for the display device shown in FIG. 1, in a case where it is detected by the output of the photo-sensor 113 that the display device is receiving external light of from 10 to 100 lux, the total gray scale number is from 64 to 1024 gray scales and not changed. In addition, in a case where it is detected by the output of the photo-sensor 113 that the display device is receiving external light of from 100 to 1,000 lux, the total gray scale number is corrected to be from 16 to 64 gray scales by reducing the total gray scale number. Moreover, in a case where it is detected by the output of the photo-sensor 113 that the display device is receiving external light of from 1,000 to 10,000 lux, the total gray scale number is corrected to be from 4 to 16 gray scales by reducing the total gray scale number. Further, in a case where it is detected by the output of the photo-sensor 113 that the display device is receiving external light of from 10,000 to 100,000 lux, the total gray scale number is corrected to be from 2 to 4 gray scales by reducing the total gray scale number.

Note that a selection switch with which a user selects the display mode may be provided for the display device so that the above mode is selected by the user operating the selection switch. In addition, even in a case where the display mode is selected by the selection switch, the gray scale of the selected display mode may be increased or decreased automatically depending on the signal of the photo-sensor 113 (the external light strength).

Note that the signal line driver circuit or a portion thereof may be constituted using, for example, an external IC chip in some cases instead of being provided over the same substrate as the pixel array 101.

Note that the amplifier 114 or the photo-sensor 113 may be provided over the same substrate as the pixel array 101. In this case, the amplifier 114 or the photo-sensor 113 may be formed over the same substrate as the pixel array 101. Alternatively, the amplifier 114 or the photo-sensor 113 may be disposed over the same substrate as the pixel array 101 by using COG (Chip On Glass), a bump, or the like.

Note that, as described above, a transistor according to the present invention may be any type of transistor, and formed over any substrate. Therefore, the circuits shown in FIG. 1 may all be formed over a glass substrate, a plastic substrate, a single crystalline substrate, an SOI substrate, or any substrate. Alternatively, part of the circuits in FIG. 1 or the like may be formed over one substrate, and the other part of the circuits in FIG. 1 or the like may be formed over another substrate. In other words, the whole circuits in FIG. 1 are not necessarily formed over the same substrate. For example, in FIG. 1 or the like, the pixel array 101 and the gate driver 110 may be formed over a glass substrate using TFTs, and the source driver 102 (or part thereof) may be formed over a single crystalline substrate, and then an IC chip thereof may be connected by COG (Chip On Glass) to be provided over a glass substrate. Alternatively, the IC chip may be connected to the glass substrate by TAB (Tape Auto Bonding) or using a printed wiring board.

In the same manner, a photo-sensor according to the present invention may be any type of photo-sensor, and formed over any substrate. As an example of the photo-sensor, a PIN diode, a PN diode, a Schottky diode, and the like can be given. In addition, the photo-sensor may be made of any material. The photo-sensor may also be formed of amorphous silicon or polysilicon, a single crystal, SOI, or the like. When the photo-sensor is formed of amorphous silicon or polysilicon, the photo-sensor can be formed over the same substrate as the pixel array simultaneously in the same processing step; thus, the cost can be reduced.

Therefore, the photo-sensor or the amplifier may all be formed over a glass substrate, a plastic substrate, a single crystalline substrate, an SOI substrate, or any substrate. Alternatively, part of the photo-sensor or the amplifier may be formed over one substrate, and the other part of the photo-sensor or the amplifier may be formed over another substrate. In other words, the whole photo-sensor or amplifier is not necessarily formed over the same substrate. For example, in FIG. 1 or the like, the photo-sensor 113, the pixel array 101, and the gate driver 110 may be formed over a glass substrate using TFTs, and the source driver 102 (or part thereof) may be formed over a single crystalline substrate, and then an IC chip thereof may be connected by COG (Chip On Glass) to be provided over a glass substrate. Alternatively, the IC chip may be connected to the glass substrate by TAB (Tape Auto Bonding) or using a printed wiring board.

The source driver 102 can be roughly divided into three portions.

First, a shift register 103 is a circuit that outputs a sequentially selecting signal (a so-called sampling pulse). Therefore, the circuit is not limited to the shift register as long as a circuit that performs a similar function is used. For example, a decoder circuit may also be used.

A sampling pulse outputted from the shift register is inputted into an analog digital switching circuit 104. A video signal 106 is inputted into the analog digital switching circuit 104 through a video signal line 108. In addition, there is a function, using a display mode control signal 107, to control whether the inputted video signal 106 is inputted into a digital data processing circuit 105 or inputted into the pixel array. The display mode control signal 107 is inputted into the analog digital switching circuit 104 through a display mode control signal line 109. For example, when the display mode control signal 107 is an H signal or a level of significance, the video signal 106 is inputted into the pixel array 101. On the other hand, when the display mode control signal 107 is an L signal or a level of non-significance, the video signal 106 is inputted into the digital data processing circuit 105.

The digital data processing circuit 105 has the same function as a normal digital driver. In other words, there is a function to hold the video signal 106 and to output the held video signal 106 to the pixel array.

Therefore, it is possible to switch between a case of inputting the video signal 106 into the pixel array 101 without any change and a case of inputting the video signal 106 into the pixel array 101 after being temporarily held by switching the display mode control signal 107.

Thus, it is possible to make the video signal 106 an analog value when the video signal 106 can be inputted into the pixel array 101 without any change. In this case, it is possible to control a pixel in an analog manner. Therefore, an analog gray scale method can be used.

On the other hand, when the video signal 106 is temporarily held, it is difficult to hold data with an analog value; therefore, the video signal 106 becomes a digital value. Thus, a pixel is controlled in a digital manner. Therefore, a digital gray scale method is to be used.

Thus, as a display mode, a case where the analog gray scale method is used is referred to as an analog mode, and a case where the digital gray scale method is used is referred to as a digital mode.

However, even in a case where the video signal 106 is temporarily held, it is also possible to hold signal with an analog value with the use of a capacitor element or the like.

As described above, it is possible to switch between the analog gray scale method and the digital gray scale method by switching the display mode control signal 107.

Figure 2:
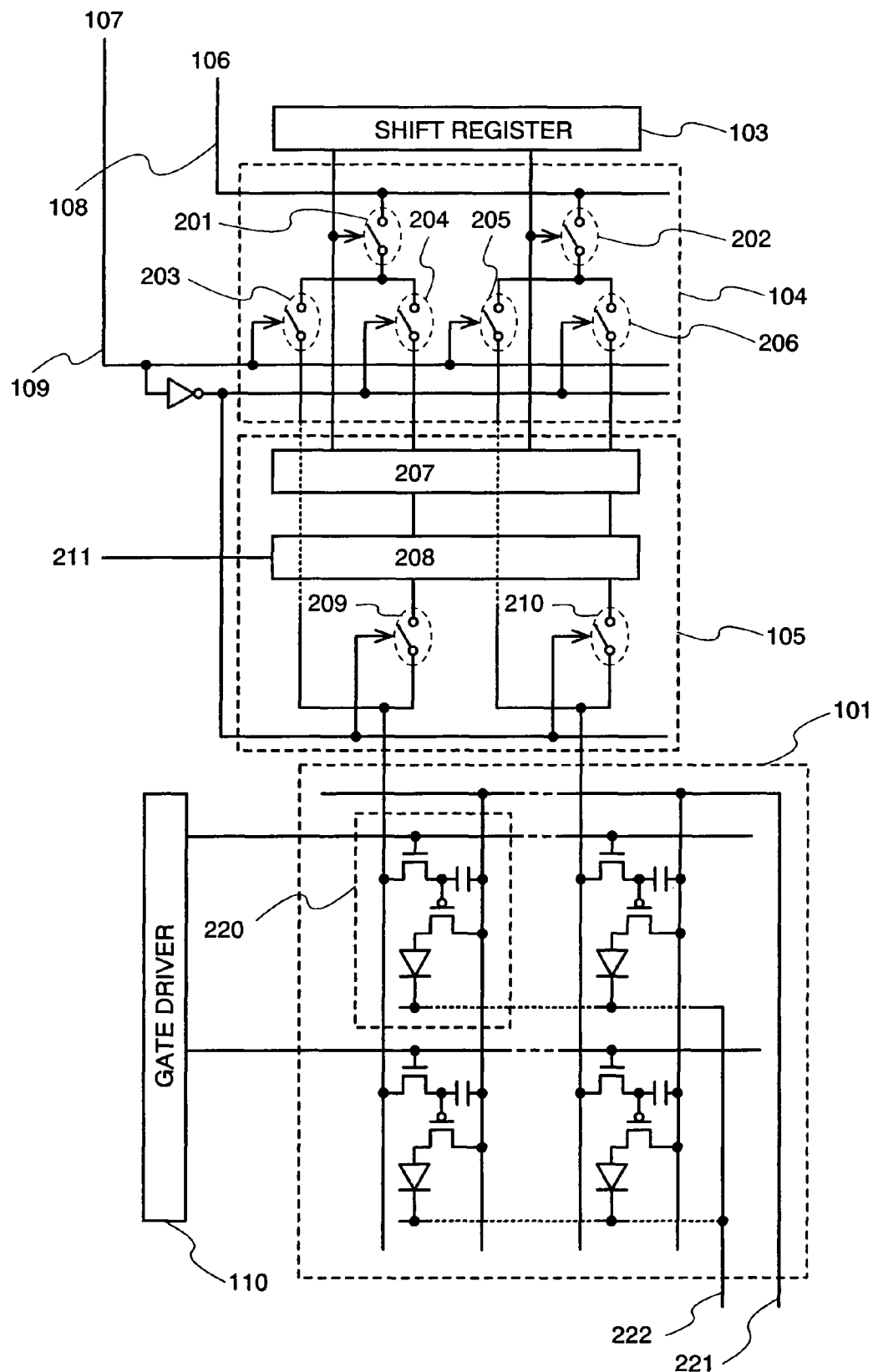
FIG. 2 is a diagram explaining a configuration of a display device according to the present invention.

Next, FIG. 2 shows a case where part of the configuration in FIG. 1 is shown concretely. Note that although FIG. 2 is a case of two rows for simplification, the present invention is not limited thereto. The number of rows can be increased arbitrarily.

In the analog digital switching circuit 104, sampling switches 201 and 202 are controlled by the sampling pulse that is sequentially outputted from the shift register 103. Then, mode selection switches 203 and 204 are controlled by the display mode control signal 107. The mode selection switches 203 and 204 are turned on and off exclusively. In other words, when one of the mode selection switches 203 and 204 is turned on, the other switch is turned off. Whether the video signal 106 is inputted into the digital data processing circuit 105 or inputted into the pixel array 101 is controlled by this mode selection switch. In the case of FIG. 2, when the mode selection switch 203 is turned on, the video signal 106 is transmitted to the pixel array 101 through the sampling switch 201 and the mode selection switch 203. In the same manner, when a mode selection switch 205 is turned on, the video signal 106 is transmitted to the pixel array 101 through the sampling switch 202 and the mode selection switch 205. On the other hand, when the mode selection switch 204 is turned on, the video signal 106 is transmitted to the digital data processing circuit 105 through the sampling switch 201 and the mode selection switch 204. In the same manner, when a mode selection switch 206 is turned on, the video signal 106 is transmitted to the digital data processing circuit 105 through the sampling switch 202 and the mode selection switch 206.

In the digital data processing circuit 105, the video signal is stored and outputted in a latch 1 circuit 207 or a latch 2 circuit 208. In the latch 1 circuit 207, the video signal 106 is inputted and stored depending on the sampling pulse that is sequentially outputted from the shift register 103. Then, after storing the video signal 106 for one row, a latch signal 211 is turned on. Consequently, the video signal 106 stored in the latch 1 circuit is transferred to the latch 2 circuit 208. By performing such an operation, line-sequential driving can be performed. The video signal is output to the pixel array 101 from the latch 2 circuit 208 through output control switches 209 and 210. The output control switches 209 and 210 are controlled depending on the display mode control signal 107. In other words, when it is desired to input the output of the latch 2 circuit 208 into the pixel array 101, for example, the output control switches 209 and 210 are turned on in the case of a digital mode. On the other hand, when it is desired not to input the output of the latch 2 circuit 208 into the pixel array 101, for example, the output control switches 209 and 210 are turned off in the case of an analog mode. Consequently, the video signal 106 is inputted into the pixel array 101 through the mode selection switches 203 and 205.

Figure 3:
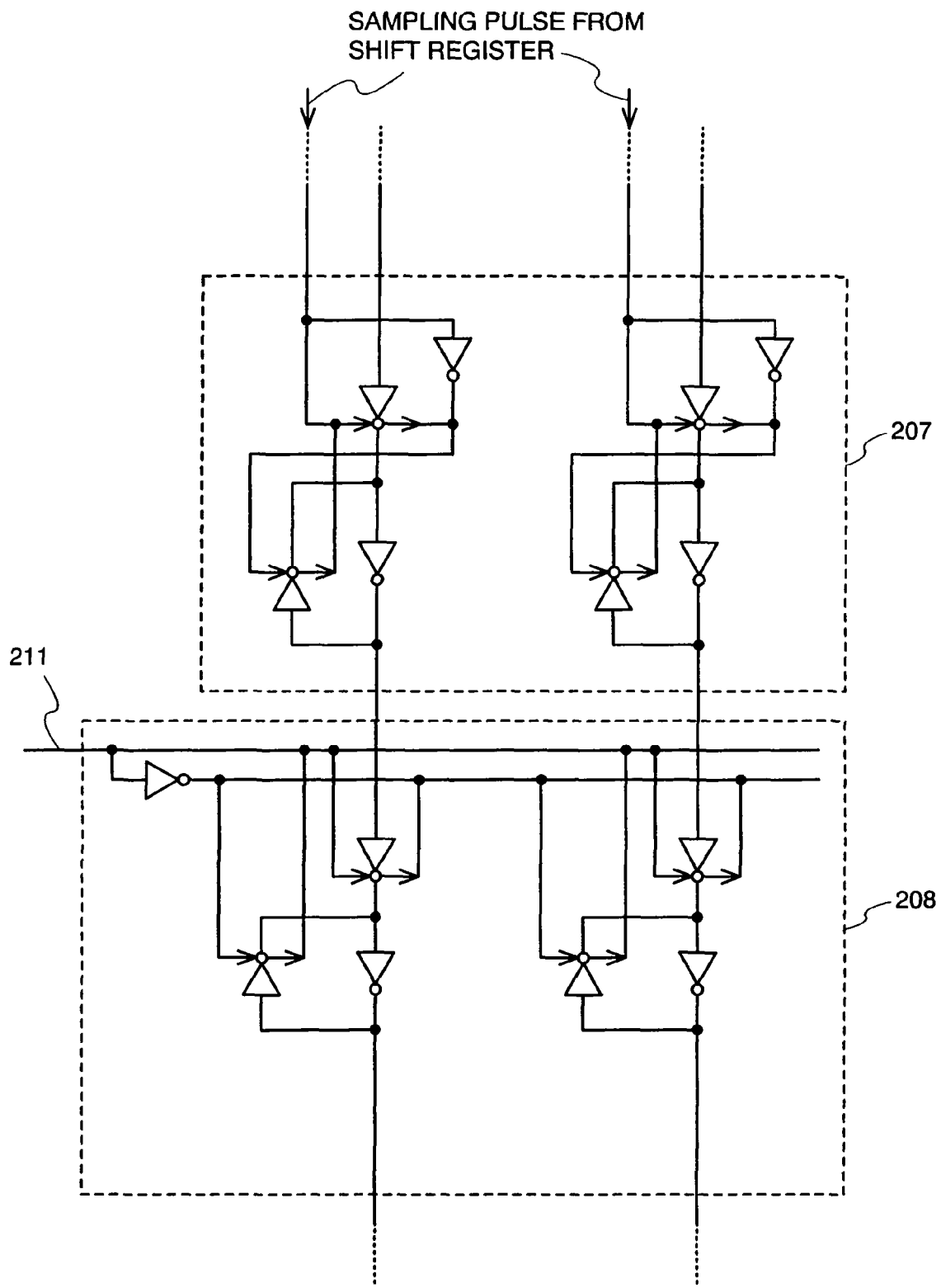
FIG. 3 is a diagram explaining a configuration of a display device according to the present invention.

Here, FIG. 3 shows an example of the latch 1 circuit 207 and the latch 2 circuit 208, each of which is constituted of a clocked inverter or an inverter. Note that the present invention is not limited thereto.

Note that, in the case of using the digital data processing circuit 105 as like in FIG. 3, the sampling switches 201 and 202 can be omitted. This is because, in the case of using the digital data processing circuit 105 as like in FIG. 3, it is possible to prevent data from entering into the digital data processing circuit 105 even without the sampling switches 201 and 202.

Figure 4:
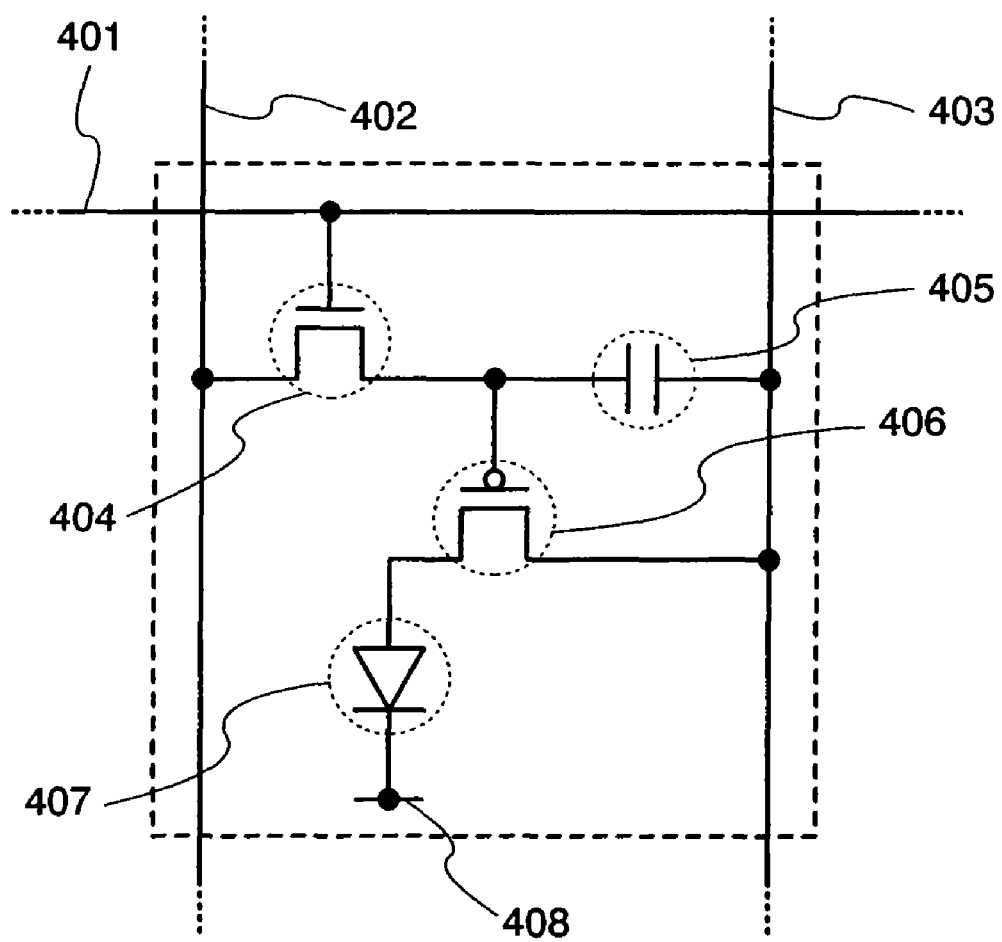
FIG. 4 is a diagram explaining a configuration of a display device according to the present invention.

In the pixel array 101, pixels 220 are arranged in matrix. FIG. 4 shows an example of one pixel 220. A selecting transistor 404 is controlled using a gate signal line 401. When the selecting transistor 404 is turned on, a video signal is inputted into a storage capacitor 405 from a source signal line 402. Thus, a driving transistor 406 is turned on and off depending on the video signal and current flows to an opposite electrode 408 from a power supply line 403 through a light-emitting element 407.

The power supply line 403 in FIG. 4 is connected to a power supply line 221 in FIG. 2. In addition, the opposite electrode 408 in FIG. 4 is connected to an opposite electrode 222 in FIG. 2. The opposite electrode 222 is connected to all pixels in many cases. However, the present invention is not limited thereto.

Note that a pixel configuration is not limited to that shown in FIG. 4. For example, a configuration which corrects variations in the driving transistor may be employed.

The pixel configurations which correct variations can be roughly divided into two types: one is that corrects variations in threshold voltage and the other is that inputs current as a video signal.

Figure 32:
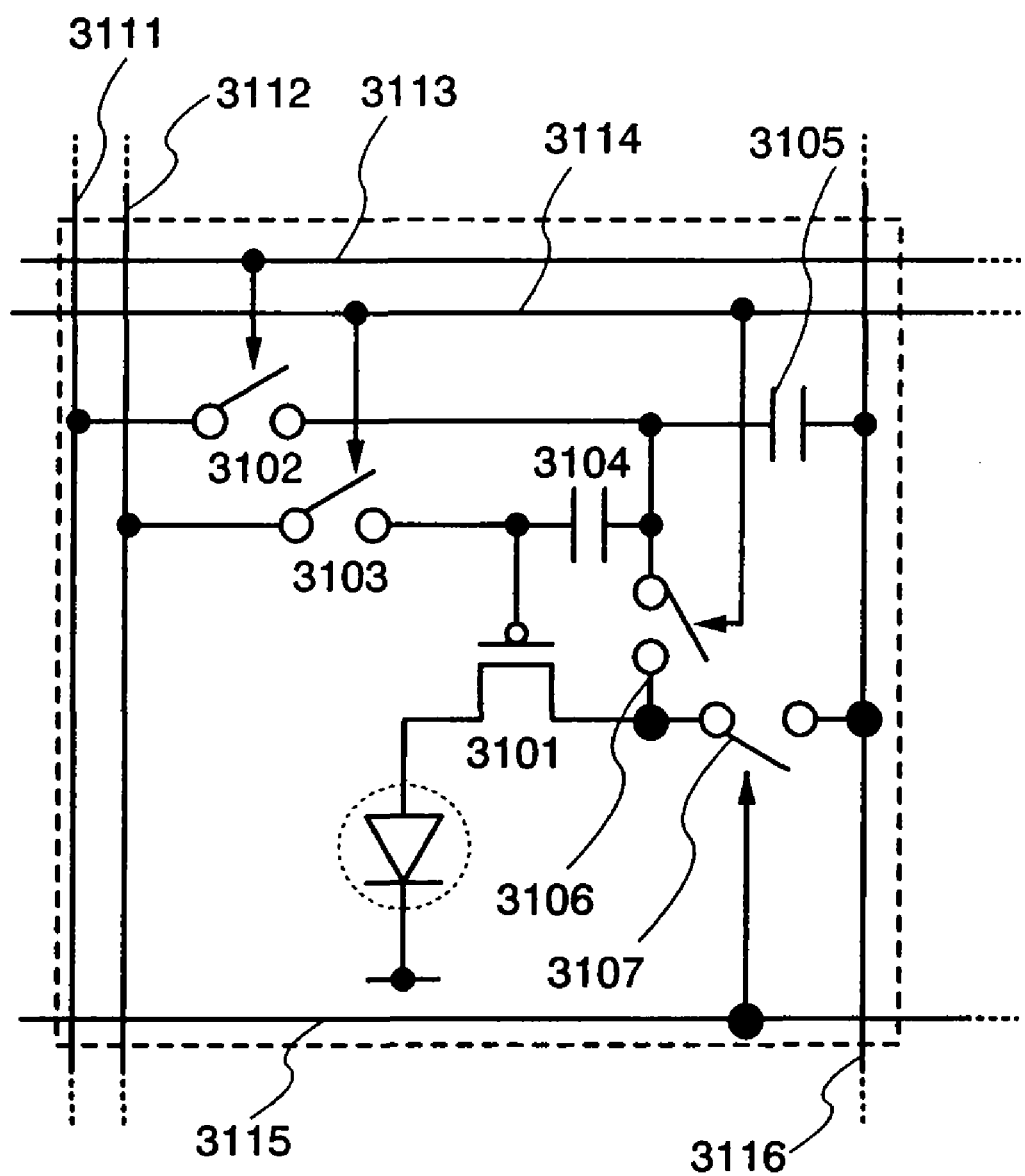
FIG. 32 is a diagram explaining a configuration of a display device according to the present invention.

FIG. 32 shows the pixel configuration which corrects variations in threshold voltage. A threshold voltage of a driving transistor 3101 is stored in a capacitor element 3104 by controlling a switch 3106. A switch 3103 serves to initialize the gate potential of the driving transistor 3101. Then, a video signal is inputted from a source signal line 3111 through a switch 3102. The video signal is stored in a capacitor element 3105. A switch 3107 controls a conducting state and/or a non-conducting state between a source terminal of the transistor 3101 and the power supply line 3116. The first scanning line 3113 controls an on/off state of the a switch 3102, the second scanning line 3114 controls an on/off state of a switch 3103, and the third scanning line 3115 controls an on/off state of a switch 3107.

Figure 33:
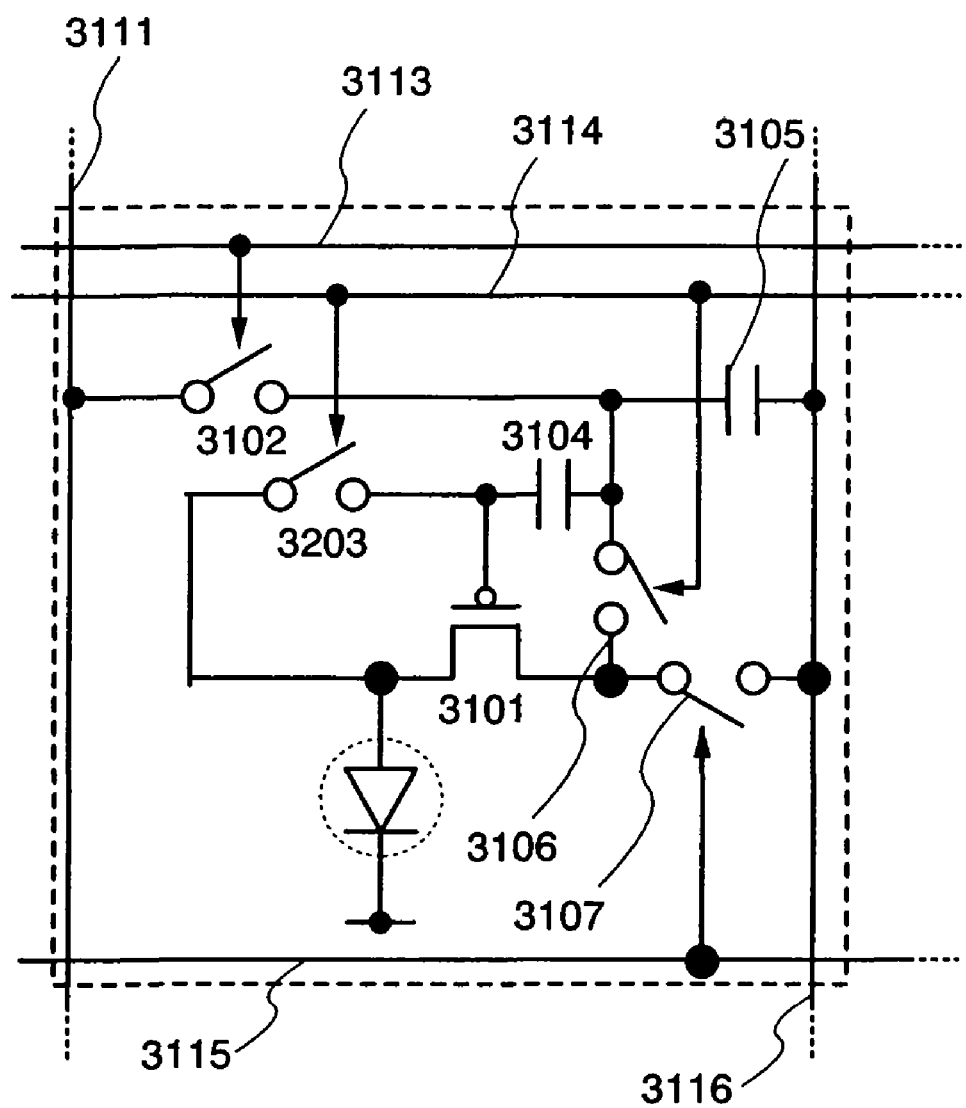
FIG. 33 is a diagram explaining a configuration of a display device according to the present invention.

In FIG. 32, a wiring 3112 for initializing the gate potential of the driving transistor 3101 is necessary. FIG. 33 shows a configuration where the wiring 3112 is removed from FIG. 32. A gate of the driving transistor 3101 is connected to a drain of the driving transistor 3101 through a switch 3203.

Note that there are various pixel configurations which correct variations in threshold voltage, which are not limited to the configurations shown in FIGS. 32 and 33. By using the pixel configuration which corrects variations in threshold voltage as described above, variations in current flowing to the light-emitting element can be reduced. In particular, luminance can be equalized in an analog mode. Therefore, the pixel configuration which corrects variations in threshold voltage is more suitable.

Figure 34:
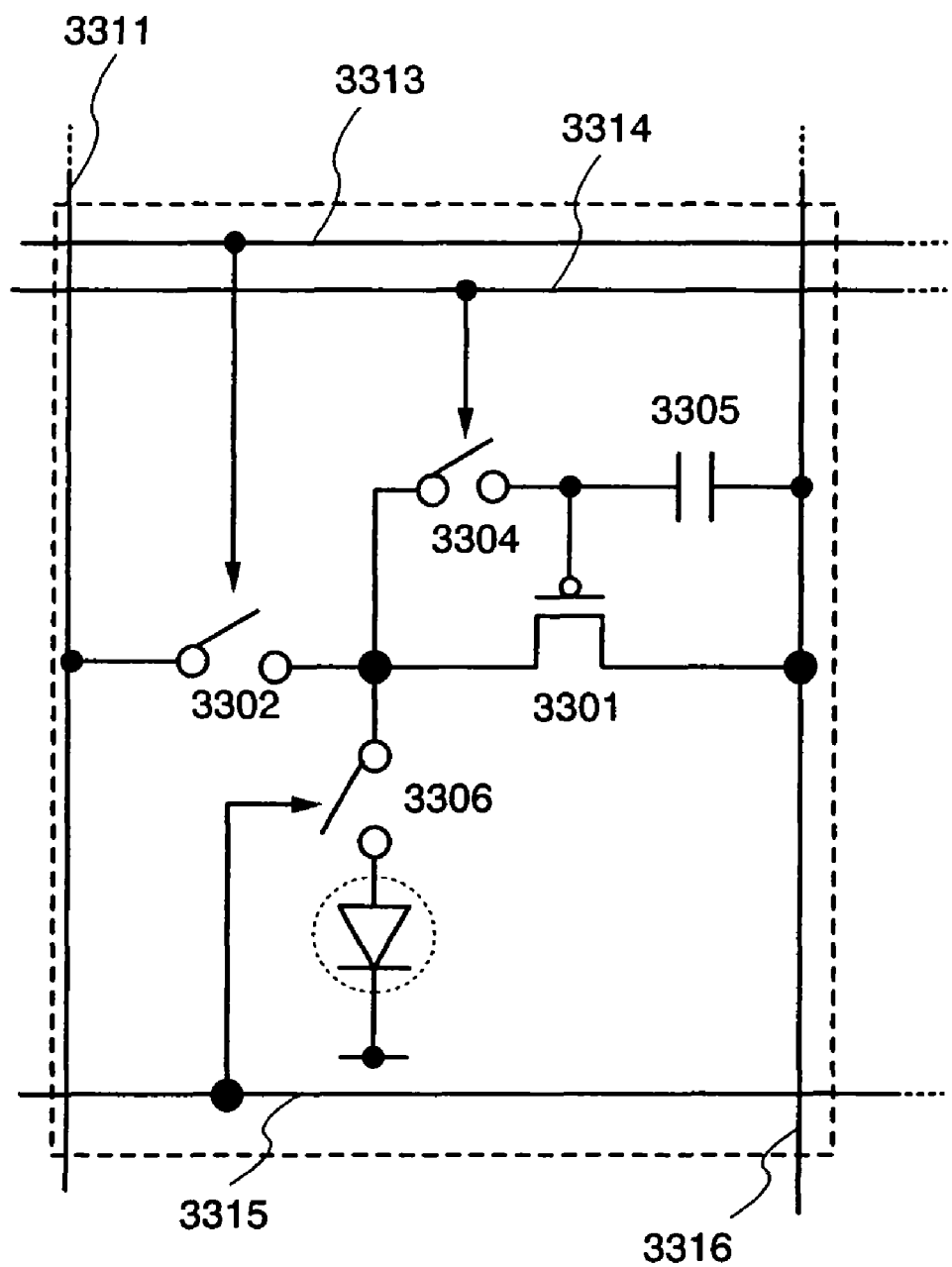
FIG. 34 is a diagram explaining a configuration of a display device according to the present invention.
Figure 35:
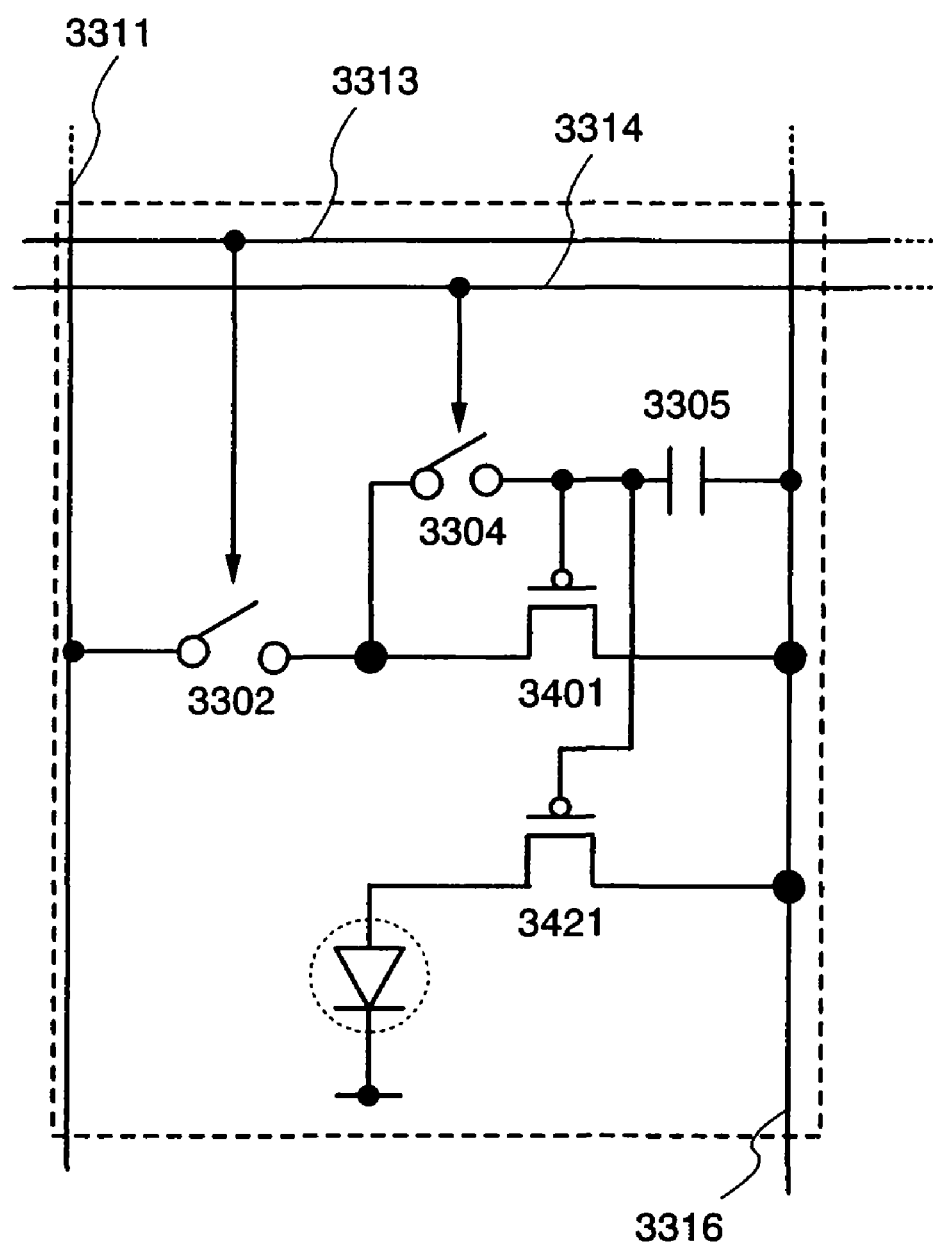
FIG. 35 is a diagram explaining a configuration of a display device according to the present invention.

Next, FIG. 34 shows the pixel configuration which inputs current as a video signal. Current in accordance with a video signal is supplied to a source signal line 3311. Then, the current flows to a driving transistor 3301 when a switch 3302 and a switch 3304 are turned on; accordingly, a gate-source voltage is generated depending thereon. The gate-source voltage is stored in a capacitor element 3305; thereafter, current is supplied to a light-emitting element from the power supply line 3316 when the switch 3302 and the switch 3304 are turned off, and a switch 3306 is turned on. The first scanning line 3313 controls an on/off state of the switch 3302, the second scanning line 3314 controls an on/off state of the switch 3304, and the third scanning line 3315 controls an on/off state of a switch 3306. Note that a transistor to which signal current is supplied is identical with a transistor for supplying current to a light-emitting element in FIG. 34; however, they may be different from each other. FIG. 35 shows this case. A transistor 3401 to which signal current is supplied and a transistor 3421 for supplying current to a light-emitting element are different.

Note that there are various types of pixel configuration which correct variations by inputting current, which is not limited to the configurations shown in FIGS. 34 and 35. By using the pixel configuration which corrects variations by inputting current as described above, variations in current flowing to the light-emitting element can be reduced. In particular, luminance can be equalized in an analog mode. Therefore, the pixel configuration which corrects variations by inputting current is more suitable.

Note that a light-emitting element arranged in a pixel is not limited to a specific one. As an example of the display element arranged in a pixel, a display medium in which contrast varies by an electromagnetic action can be applied, such as an EL element (such as an organic EL element, an inorganic EL element, or an EL element containing an organic material and an inorganic material), an electron-emitting element, a liquid crystal element, electronic ink, an optical diffraction element, a discharging element, a digital micromirror device (DMD), a piezoelectric element, or a carbon nanotube. Note that an EL display is used as an EL panel type display device using the EL element, a field emission display (FED), an SED (Surface-conduction Electron-emitter Display) type flat display, or the like is used as a display device using the electron-emitting element, a liquid crystal display is used as a liquid crystal panel type display device using the liquid crystal element, an electronic paper is used as a digital paper type display device using the electronic ink, a grating light valve (GLV) type display is used as a display device using the optical diffraction element, a plasma display is used as a PDP (Plasma Display Panel) type display using the discharging element, a digital light processing (DLP) type display device is used as a DMD panel type display device using the digital micromirror device, a piezoelectric ceramic display is used as a display device using the piezoelectric element, or a nano emissive display (NED) is used as a display device using the carbon nanotube.

Note that the storage capacitor 405 serves to hold the gate potential of the driving transistor 406. Therefore, the storage capacitor 405 is connected between a gate of the driving transistor 406 and the power supply line 403; however, the present invention is not limited thereto. The storage capacitor 405 may be disposed so as to be able to store the gate potential of the driving transistor 406. In a case where the gate potential of the driving transistor 406 can be held using the gate capacitance of the driving transistor 406 or the like, the storage capacitor 405 may be omitted.

Note that, as for the switches shown in FIG. 1 or the like, for example, the sampling switch 201, the mode selection switch 203, the output control switch 209, or the like, there is an electrical switch, a mechanical switch, or the like. The switches are not particularly limited as long as current flow can be controlled and various switches can be used. For example, the switches may be a transistor, a diode (a PN diode, a PIN diode, a Schottky diode, a transistor connected as a diode, or the like) or a logic circuit that is a combination thereof. Thus, in a case of using a transistor as the switch, the transistor operates as a mere switch; therefore, the polarity (conductivity type) of the transistor is not particularly limited. However, in a case where lower off-current is desired, it is desirable to use a transistor having a polarity with lower off-current. As the transistor with low off-current, a transistor provided with an LDD region, a transistor having a multi-gate structure, or the like can be used. In addition, it is desirable to use an N-channel transistor when a transistor to be operated as a switch operates in a state where potential of a source terminal thereof is close to a lower potential side power supply (such as Vss, GND, or 0 V), whereas it is desirable to use a P-channel transistor when a transistor operates in a state where potential of a source terminal thereof is close to a higher potential side power supply (such as Vdd). This is because the absolute value of a gate-source voltage can be increased, and the transistor easily operates as a switch. Note that the switch may be of a CMOS type using both the N-channel transistor and the P-channel transistor. When the CMOS-type switch is employed, voltage outputted through the switch (that is, voltage inputted into the switch) may be high or low with respect to the outputted voltage and the switch can be operated appropriately even when the situation is changed.

Figure 5A:
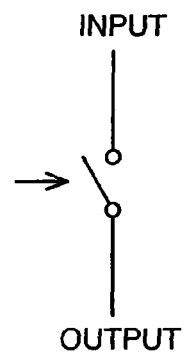
FIGS. 5A to 5D are diagrams each explaining a configuration of a display device according to the present invention.
Figure 5B:
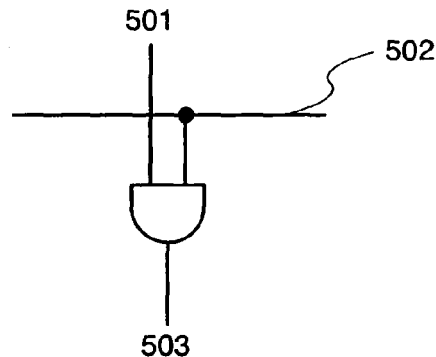

FIGS. 5A to 5D each shows an example of the switch. FIG. 5A schematically shows a switch. FIG. 5B shows a switch using an AND circuit. Whether or not a signal of an input 501 is transmitted to an output 503 is controlled using a control line 502. In the case of FIG. 5B, control can be performed in such a way that the output 503 is an L signal regardless of the input signal. However, the output 503 is never in a floating state. Thus, the switch in FIG. 5B is preferably used such as when the output 503 is connected to an input of a digital circuit. In the case of the digital circuit, an output is not put in a floating state even when an input is put in a floating state. When the input is put in a floating state, the output becomes unstable, which is not desirable. Therefore, it is preferable to use the switch in FIG. 5B such as when the output is connected to the input of a digital circuit.

Note that the switch in FIG. 5B is formed using the AND circuit; however, the present invention is not limited thereto. A similar function can also be performed when an OR circuit, a NAND circuit, or a NOR circuit is used.

Figure 5C:
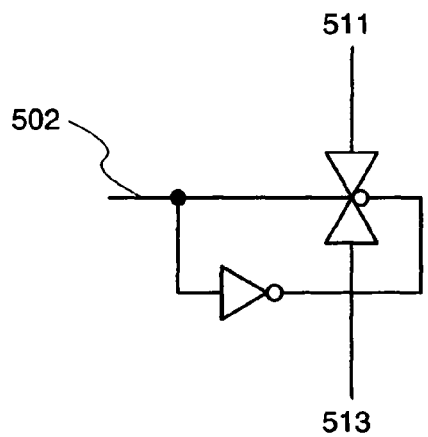
Figure 5D:
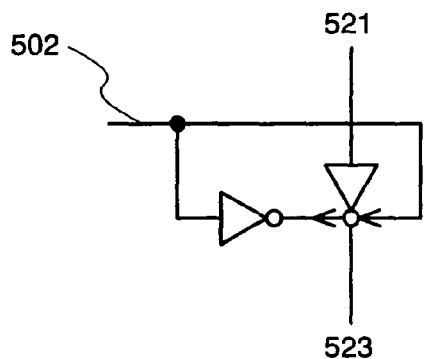

On the other hand, a switch in FIG. 5C or 5D may be used when it is desired to put the input in a floating state. The switch in FIG. 5C is a circuit referred to as a transmission gate, an analog switch, or the like. The switch in FIG. 5C transmits the potential of an input 511 to an output 513 almost without change. Thus, the switch is preferable for analog signal transmission. The switch in FIG. 5D is a circuit referred to as a clocked inverter or the like. The switch in FIG. 5D inverts and transmits a signal of an input 521 to an output 523. Thus, the switch is preferable for digital signal transmission.

According to the above, the switch in FIG. 5C is preferably used as the sampling switch 201, the mode selection switch 203 that transmit an analog signal, or the like. Since the mode selection switch 204 that transmit a digital signal is connected to the input of the latch 1 circuit 207, which is a digital circuit, the switch in FIG. 5B is preferably used. Since the output of the output control switch 209 or the like needs to be put in a floating state, the switch in FIG. 5C or 5D is preferable for the output control switch 209. However, it is a digital signal that is inputted into the output control switch 209; therefore, the switch in FIG. 5D is far preferable.

Accordingly, the selection of a display mode or the number of gray scales to be displayed can be controlled depending on external light intensity. In this manner, it is possible to provide a display device superior in visibility by controlling the gray scale number of a display image depending on peripheral illuminance. In other words, it is possible to obtain a display device in which visibility is ensured in a wide range of a dark place or under indoor florescent light to outdoor sun light.

Embodiment Mode 2

In this embodiment mode, a method for driving a pixel in an analog mode will be described.

Figure 6A:
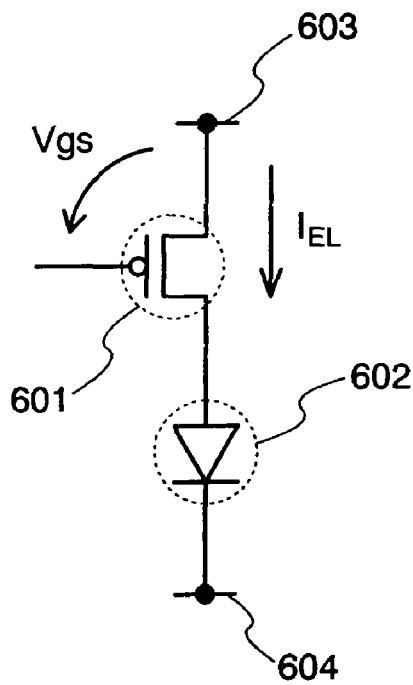
FIGS. 6A and 6B are diagrams each explaining a configuration of a display device according to the present invention.
Figure 6B:
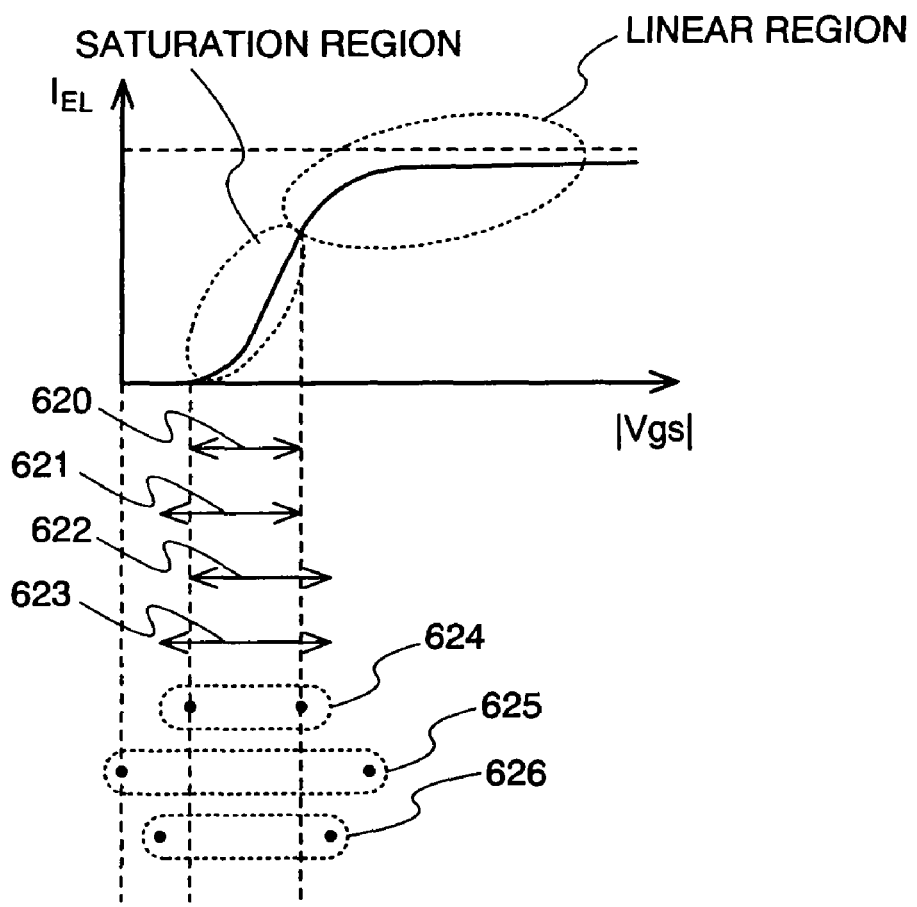

FIGS. 6A and 6B show the relationship between a voltage and a current applied to a driving transistor and a light-emitting element. FIG. 6A shows a circuit of a driving transistor 601 and a light-emitting element 602. The driving transistor 601 and the light-emitting element 602 are connected serially between a wiring 603 and a wiring 604. Since the wiring 603 has a higher potential than that of the wiring 604, a current flows to the light-emitting element 602 from the driving transistor 601.

The driving transistor 406 in FIG. 4 corresponds to the driving transistor 601 in FIG. 6A, and the light-emitting element 407 in FIG. 4 corresponds to the light-emitting element 602 in FIG. 6A.

FIG. 6B shows the relationship between a gate-source voltage (or the absolute value thereof) of the driving transistor 60 and a current flowing to the driving transistor 60 and the light-emitting element 602. As the gate-source voltage (or the absolute value thereof) is increased, a current value is also accordingly increased. This is because the driving transistor 601 operates in a saturation region. In a saturation region, a current value increases in proportion to the square of a gate-source voltage of a transistor. As the gate-source voltage (or the absolute value thereof) is further increased, a voltage applied to the light-emitting element 602 is increased. Accordingly, a drain-source voltage is decreased, and the driving transistor 601 operates in a linear region. As the drain-source voltage is decreased, the rate of increase in the current value is also decreased. Then, a current equal to or more than a certain current value does not flow.

In an analog mode, a gray scale is expressed using an analog gray scale method. Thus, by changing the gate-source voltage (or the absolute value thereof) of the driving transistor 601 in an analog manner, the driving transistor 601 is desirably operated in such a state that the current flowing to the driving transistor 601 and the light-emitting element 602 also changes in an analog manner.

For example, as in a voltage range 620, the gate-source voltage (or the absolute value thereof) of the driving transistor 601 may be controlled in such a state that the transistor operates in a saturation region from a state that almost no current flows. The state in which almost no current flows corresponds to the case where the gate-source voltage of the driving transistor 601 is approximately equal to the threshold voltage of the driving transistor 601.

Alternatively, as in a voltage region 621, the gate-source voltage (or the absolute value thereof) is increased and controlled from a state in which the gate-source voltage (or the absolute value thereof) of the driving transistor 601 is certainly lower than the threshold voltage of the driving transistor 601, and the gate-source voltage (or the absolute value thereof) of the driving transistor 601 may be controlled in such a state that the driving transistor 601 operates in a saturation region. By making the gate-source voltage of the driving transistor 601 in a black state certainly lower than the threshold voltage of the driving transistor 601, a black state can be assured. For example, if the current characteristic of the driving transistor 601 varies, the threshold voltage also varies. Thus, even when one pixel is in a black state, another pixel may slightly emit light. As a result, a decrease in contrast is caused. Thus, in order to prevent that, it is preferable to operate the driving transistor 601 in such a voltage range as 621.

Note that in the voltage range 620 and the voltage range 621, the driving transistor 601 is operated in a saturation region even if the gate-source voltage (or the absolute value thereof) is increased. However, the present invention is not limited thereto. As in a voltage range 622 and a voltage range 623, the driving transistor 601 may be operated not only in a saturation region but also in a linear region. By changing the gate-source voltage (or the absolute value thereof) of the driving transistor 601 in an analog manner, the driving transistor 601 may be operated also in a linear region as long as it is within such a range that a current flowing to the driving transistor 601 and the light-emitting element 602 also changes in an analog manner.

Next, a case of performing optimization depending on the color of the light-emitting element 602 will be described. The luminance and necessary current value of the light-emitting element 602 vary depending on color. Thus, a color balance needs to be adjusted. In order for that to be done, the gate-source voltage (or the absolute value thereof) of the driving transistor 601 is desirably changed depending on color. Alternatively, the current supply capacity of the driving transistor 601 (for example, a transistor width or the like) is desirably changed depending on color. Alternatively, the light-emitting area of the light-emitting element 602 is desirably changed depending on color. Further, alternatively, some of these are desirably combined. This enables to adjust the color balance.

Note that the potential of the wiring 603 can be changed depending on color. However, there is the disadvantage that the voltage at which the driving transistor 601 is turned off is also changed depending on color. Therefore, the potential of the wiring 603 may be equivalent in all colors.

Note that the case where the driving transistor 601 is a P-channel transistor is described; however, the present invention is not limited thereto. It is easy for those skilled in the art to reverse the direction of current flow by using an N-channel transistor. In addition, it is also easy for those skilled in the art to reverse the direction of current flow either in a case of a P-channel transistor or in a case of an N-channel transistor. In this case, the amount of gate-source voltage is affected by the voltage-current characteristic of the light-emitting element 602.

Note that this embodiment mode describes the pixel of Embodiment Mode 1 in detail. Therefore, the content described in this embodiment mode can be arbitrarily combined with the content described in Embodiment Mode 1.

Embodiment Mode 3

In this embodiment mode, a method for driving a pixel in a digital mode will be described.

The relationship between the gate-source voltage (or the absolute value thereof) of the driving transistor 601 and a current flowing to the driving transistor 601 and the light-emitting element 602, shown in FIG. 6B, is referred to. In a digital mode, control is performed in binary like on and off, or H and L. In other words, whether or not a current flows to the light-emitting element 602 is controlled. First, a case where current does not flow is considered. In this case, the gate-source voltage (or the absolute value thereof) of the driving transistor 601 may be 0 V or more as indicated by a voltage 624, a voltage 625, and a voltage 626 and equal to or lower than the threshold voltage of the driving transistor 601.

Next, a case where current flows is considered. In this case, the driving transistor 601 may be operated in a saturation region, a linear region, or a region where voltage is further increased and a current value is not increased, or the like with the gate-source voltage (or the absolute value thereof) of a voltage 627, a voltage 628, and a voltage 629.

For example, operation in a saturation region has the advantage that the value of a current flowing through the light-emitting element 602 does not vary even when the voltage-current characteristic thereof is deteriorated. Therefore, the current value is hardly affected by burn-in. However, when the current characteristic of the driving transistor 601 varies, the current flowing therethrough also varies. Thus, uneven display may be caused.

On the other hand, if the driving transistor 601 is operated in a linear region, the value of a current flowing through the driving transistor 601 is hardly affected even when the current characteristic of the driving transistor 601 varies. Therefore, uneven display is hardly caused. In addition, power consumption can be reduced because the gate-source voltage (or the absolute value thereof) of the driving transistor 601 does not become too high and the voltage between the wiring 603 and the wiring 604 does not need to be high.

Further, when the gate-source voltage (or the absolute value thereof) of the driving transistor 601 is high, the value of a current flowing through the driving transistor 601 is hardly affected even if the current characteristic thereof varies. However, when the voltage-current characteristic of the light-emitting element 602 is deteriorated, the value of a current flowing therethrough may vary. Therefore, the current value is easily affected by burn-in.

As described above, when the driving transistor 601 is operated in a saturation region, the value of a current flowing therethrough does not vary even if the characteristics of the light-emitting element 602 vary. Therefore, in this case, it can be assumed that the driving transistor 601 operates as a current source. Thus, such driving is referred to as constant current driving.

When the driving transistor 601 is operated in a linear region, the current value does not vary even if the current characteristic of the driving transistor 601 varies. Therefore, in this case, it can be assumed that the driving transistor 601 operates as a switch. Accordingly, the voltage of the wiring 603 can be considered to be applied to the light-emitting element 602 without any change. Thus, such driving is referred to be constant voltage driving.

In a digital mode, either constant voltage driving or constant current driving may be employed. However, constant voltage driving is preferable because variations in transistor does not affect the constant voltage driving and can reduce power consumption.

Next, a case of performing optimization depending on the color of the light emitting element 632 will be described. The case of constant current drive is similar to an analog mode.

In the case of constant voltage drive, even if the gate-source voltage (or the absolute value thereof) of the driving transistor 601 and the current supply capacity of the driving transistor 601 (for example, a transistor width or the like) are changed depending on color, the value of a current flowing therethrough does not vary so much. This is because the driving transistor operates 601 as a switch.

Therefore, the light-emitting area of the light-emitting element 602 is desirably changed depending on color. Alternatively, the potential of the wiring 603 can be changed depending on color. Alternatively, these are desirably combined. This enables to adjust the color balance.

Note that this embodiment mode describes the pixel of Embodiment Mode 1 in detail. Therefore, the content described in this embodiment mode can be arbitrarily combined with the content described in Embodiment Modes 1 and 2.

Embodiment Mode 4

In a case of a digital mode, only a binary of a light-emitting state and a non-light-emitting state can be expressed if nothing is done. Accordingly, another method may be used in combination to achieve multiple gray scales. A driving method of a pixel in the case where multiple gray scales are achieved will be described.

As a driving method for achieving multiple gray scales, there are a time gray scale method and an area gray scale method. The time gray scale method is a method for expressing a gray scale by changing the length of light-emitting time during a certain period. The area gray scale method is a method for expressing a gray scale by changing the size of a light-emitting area.

Note that the time gray scale method and the area gray scale method may be combined with each other.

Herein, the time gray scale method will be described in detail. In a digital time gray scale method, one-frame period is divided into a plurality of sub-frame periods. Then, a gray scale is expressed by changing the length of a lighting period during each sub-frame period.

Figure 7:
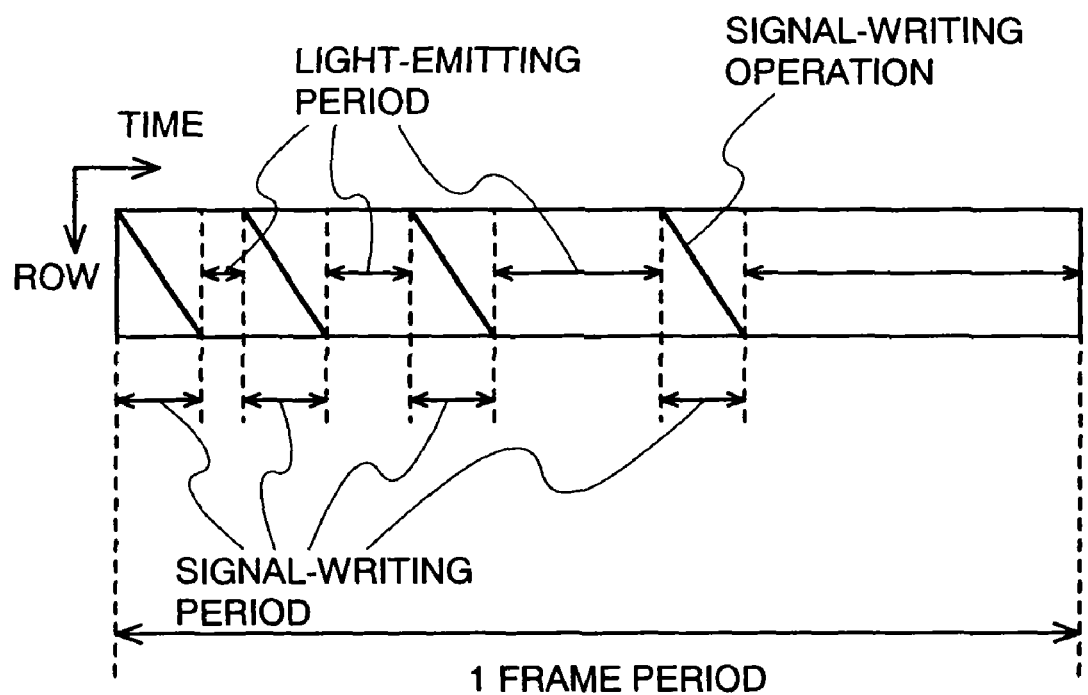
FIG. 7 is a diagram explaining a driving method of a display device according to the present invention.

FIG. 7 shows a timing chart in a case where a period where signals are written to a pixel and a period where light is emitted are separated. First, signals for one screen are inputted into all pixels in a signal-writing period. During this period, pixels emit no light. After the signal-writing period, a light-emitting period starts and pixels emit light. Next, a subsequent sub-frame starts and signals for one screen are inputted into all pixels in a signal-writing period. During this period, pixels emit no light. After the signal-writing period, a light emitting period starts and pixels emit light.

By repeating similar operations, a gray scale can be expressed. At this time, it is possible to express various gray scales by having the power of 2 for the length of the lighting period in each sub-frame period as like 1:2:4:8: . . . .

A pixel configuration in this case may have a configuration of FIG. 4.

Note that, in a signal-writing period, potentials of a power supply line 403 and an opposite electrode 408 are controlled so that no voltage is applied to a light-emitting element 407. For example, the potential of the opposite electrode 408 is increased so that no voltage is applied to the light-emitting element 407, or the opposite electrode 408 may be made in a floating state without supplying an electric charge. Consequently, the light-emitting element 407 can be prevented from emitting light in a signal-writing period.

Figure 8:
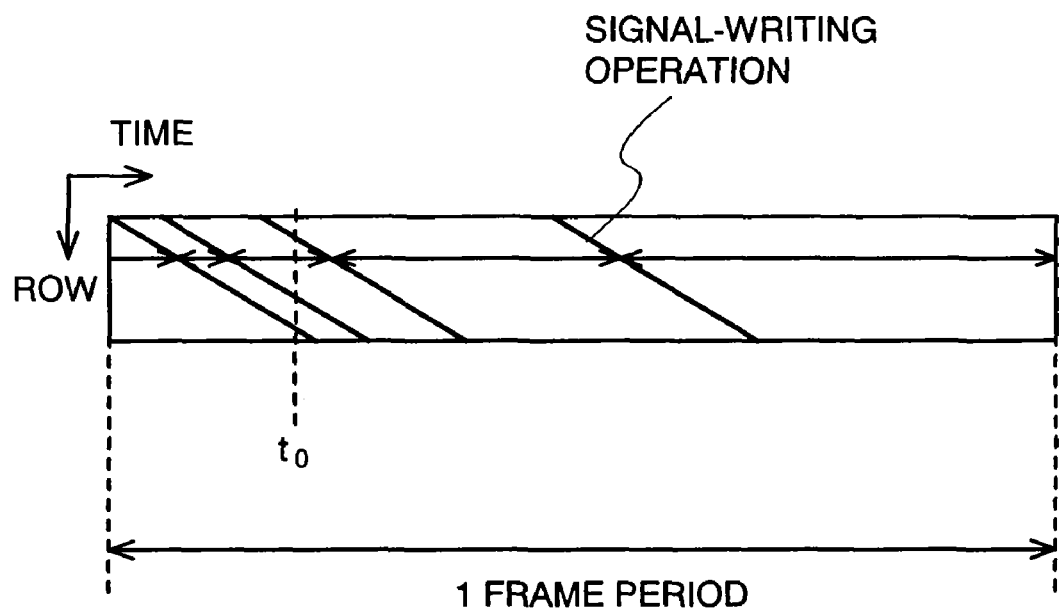
FIG. 8 is a diagram explaining a driving method of a display device according to the present invention.

Next, FIG. 8 shows a timing chart in a case where a period where a signal is written to a pixel and a period where light is emitted are not separated. Immediately after a signal is written to each row, a light-emitting period starts.

In a certain row, after writing of signals and a predetermined light-emitting period are completed, a signal writing operation starts in a subsequent sub-frame. By repeating such operations, each length of the light-emitting periods can be controlled.

In this manner, many sub-frames can be arranged in one frame even if signals are written slowly. In addition, since the ratio of a light-emitting period during one-frame period (a so-called duty ratio) can be high, it is possible to reduce power consumption, suppress deterioration of the light-emitting element, or suppress a pseudo contour.

Figure 9:
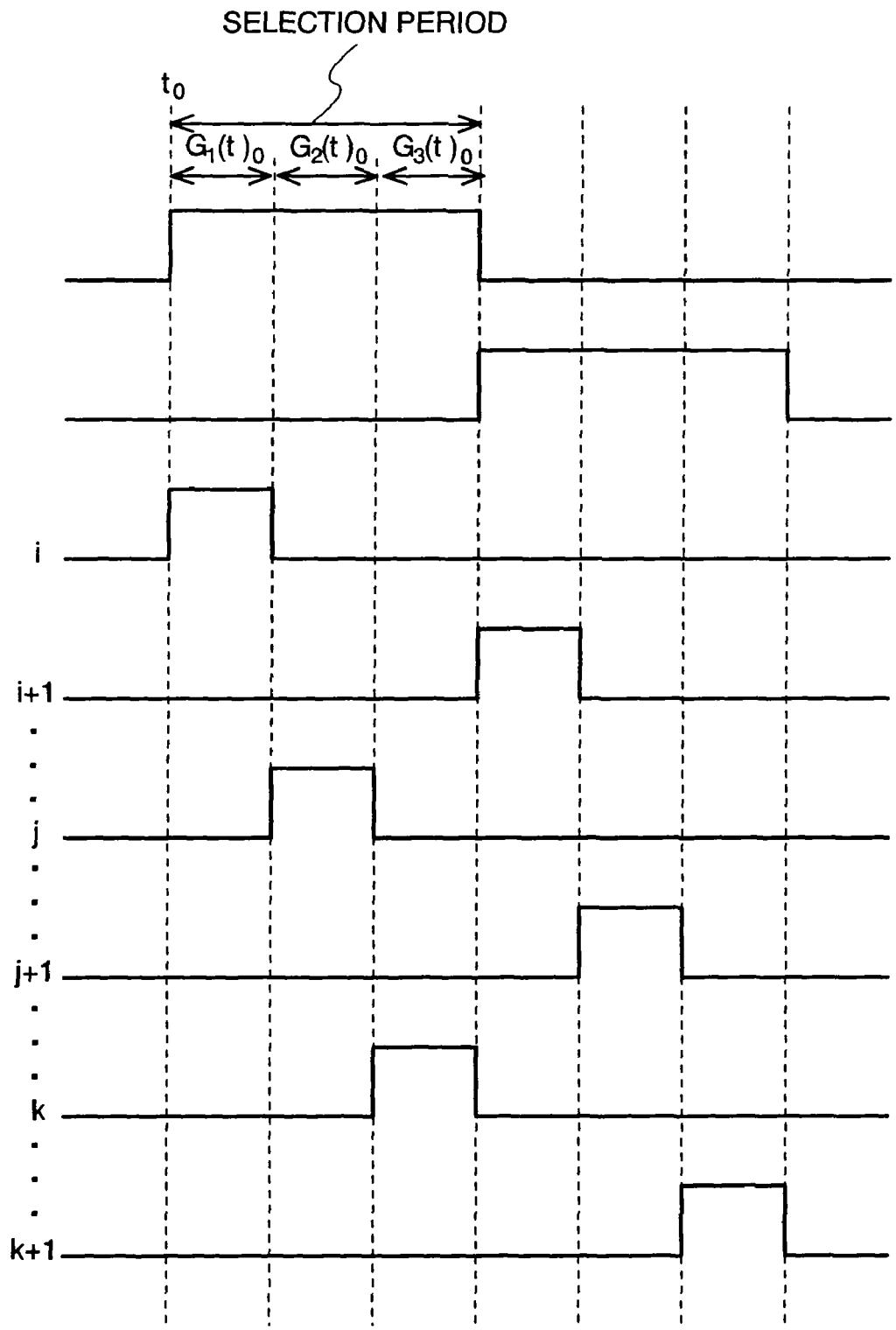
FIG. 9 is a diagram explaining a driving method of a display device according to the present invention.

A pixel configuration in this case may have a configuration of FIG. 4. In this case, where a time is to in FIG. 8, it is necessary to input signals into pixels of plural rows at the same time. Usually, it is impossible to input signals into pixels of three rows at the same time. Thus, as shown in FIG. 9, one gate selection period is divided into a plurality of periods (three in FIG. 9). Each gate signal line 401 is selected in each of the divided selection periods and a corresponding signal is inputted into a source signal line 402. For example, in one gate selection period, an i-th row is selected in G1(t0), a j-th row is selected in G2(t0), and a k-th row is selected in G3(t0). Accordingly, an operation can be performed as if the three rows were selected at the same time in the one gate selection period.

Note that, although FIGS. 8 and 9 each show the case where signals are inputted into pixels of three rows at the same time, the present invention is not limited thereto. A signal may also be inputted into more rows or few rows.

Note that details of such a driving method are disclosed in, for example, Japanese Patent Application Laid-Open No. 2001-324958 and the like, which can be applied in combination with the present invention.

Figure 10:
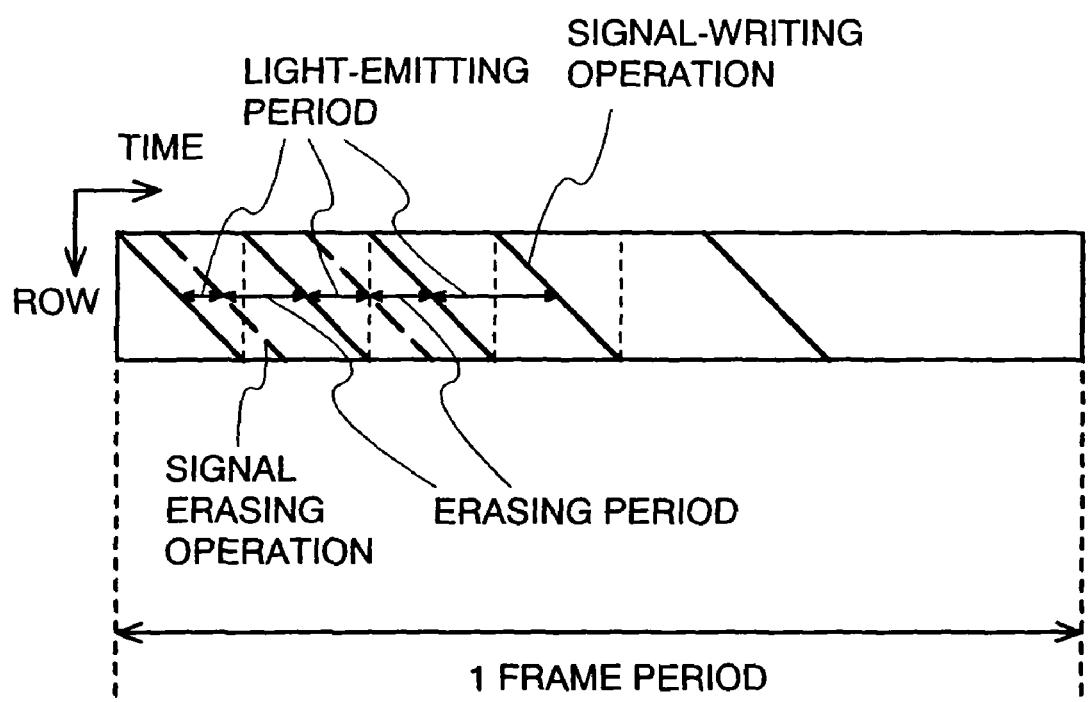
FIG. 10 is a diagram explaining a driving method of a display device according to the present invention.

Then, FIG. 10 shows a timing chart in a case where signals in pixels are erased. In each row, a signal writing operation is performed and the signals in the pixels are erased before a subsequent signal writing operation. According to this, the length of a light-emitting period can be easily controlled.

In a certain row, after writing of signals and a predetermined light emitting period are completed, a signal writing operation starts in a subsequent sub-frame. In a case where a light-emitting period is short, a signal erasing operation is performed to provide a non-light-emitting state. By repeating such operations, the lengths of the light-emitting periods can be controlled.

According to this, many sub-frames can be arranged in one frame even if signals are written slowly. Further, in the case of performing the signal erasing operation, data for erasing is not required to be obtained as well as a video signal; therefore, the driving frequency of a source driver can also be reduced.

Figure 11:
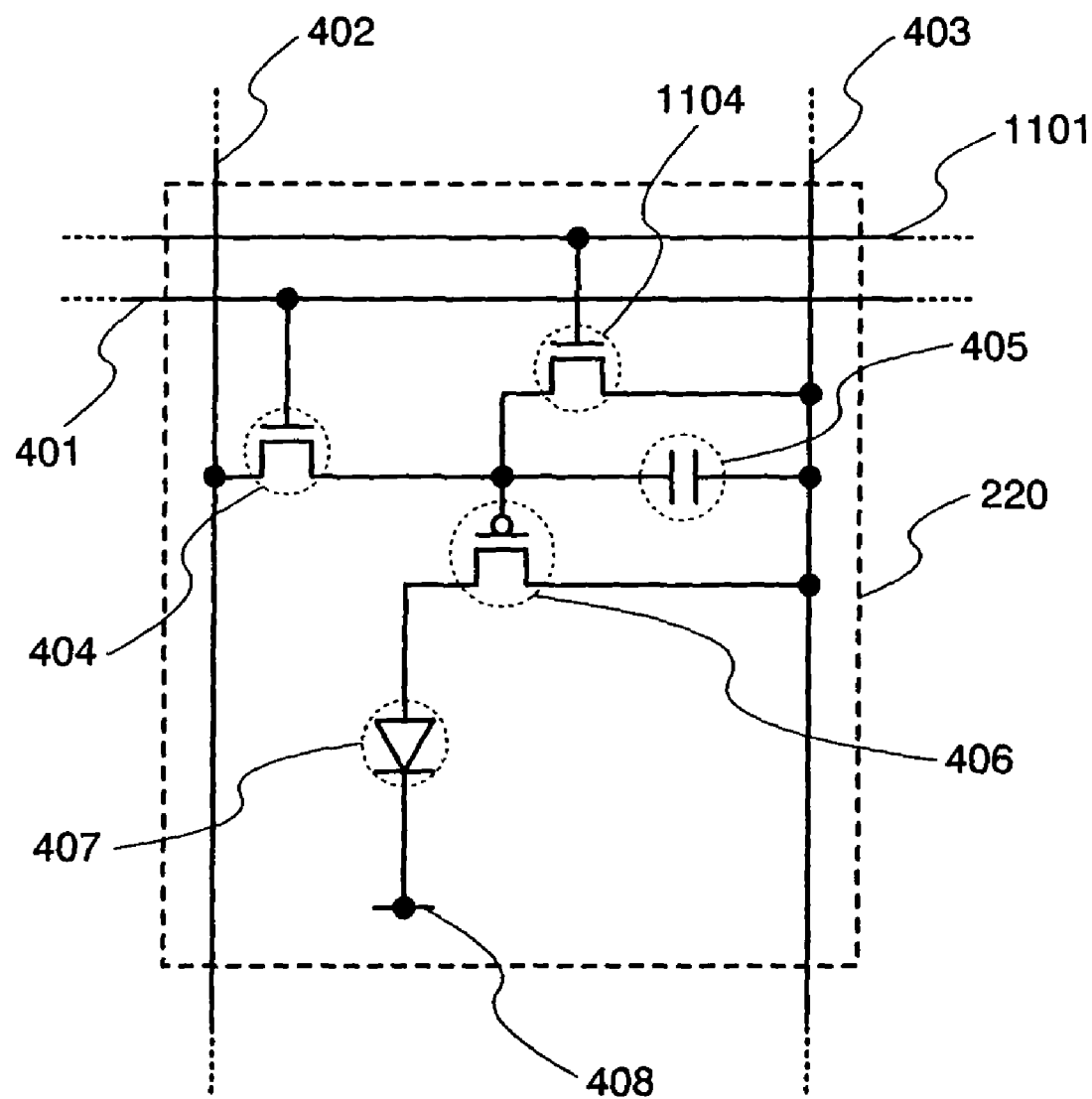
FIG. 11 is a diagram explaining a configuration of a display device according to the present invention.

FIG. 11 shows a pixel configuration in this case. An erasing transistor 1104 is connected between a gate of a driving transistor 406 and the power supply line 403.

A selecting transistor 404 is controlled using the gate signal line 401. When the selecting transistor 404 is turned on, a video signal is inputted into a storage capacitor 405 from the source signal line 402. Thus, a driving transistor 406 is turned on and off depending on the video signal and current flows to the opposite electrode 408 through the power supply line 403 to the light-emitting element 407.

When it is desired to erase a signal, a second gate line 1101 is selected to turn the erasing transistor 1104 on, so that the driving transistor 406 is turned off. Then, no current flows from the power supply line 403 to the opposite electrode 408 through the light-emitting element 407. Consequently, a non-light-emitting period can be provided and the length of a light-emitting period can be freely controlled.

Although the erasing transistor 1104 is used in FIG. 11, another method can also be used. This is because a non-light-emitting period may forcibly be provided so that no current is supplied to the light-emitting element 407. Thus, a non-light-emitting period may be provided by arranging a switch somewhere in a path where a current flows from the power supply line 403 to the opposite electrode 408 through the light-emitting element 2104 and controlling on/off of the switch. Alternatively, a gate-source voltage of the driving transistor 406 may be controlled to forcibly turn the driving transistor off.

Figure 12:
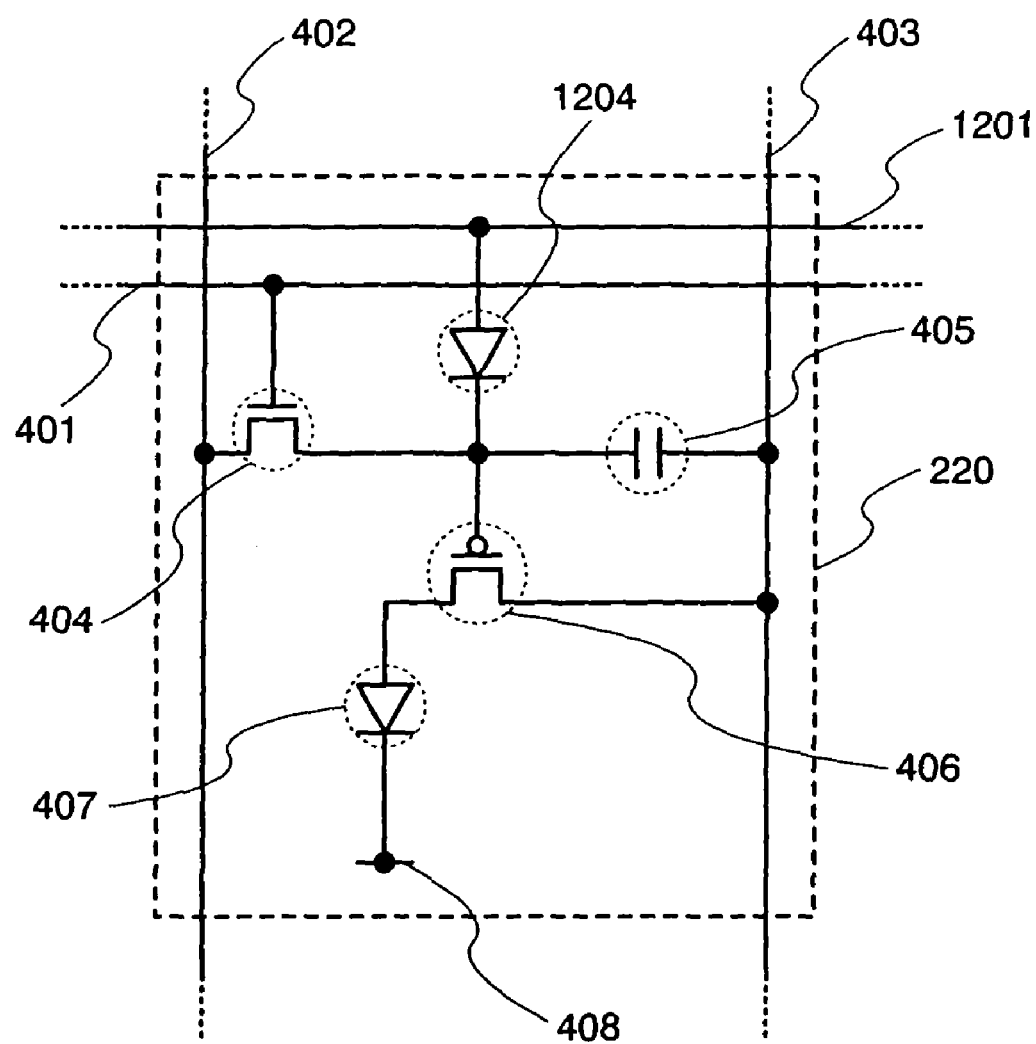
FIG. 12 is a diagram explaining a configuration of a display device according to the present invention.
Figure 13:
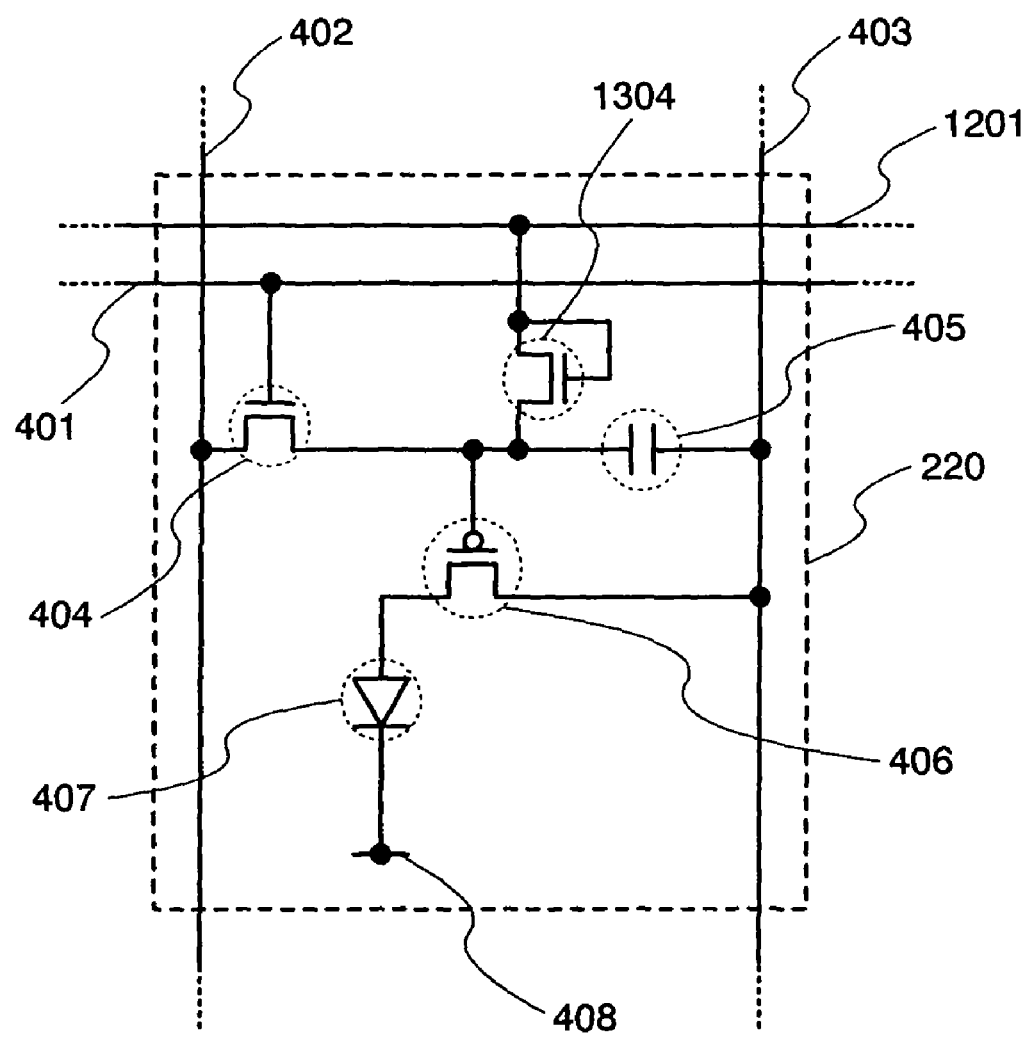
FIG. 13 is a diagram explaining a configuration of a display device according to the present invention.

FIG. 12 shows an example of a pixel configuration in the case where the driving transistor is forcibly turned off. An erasing diode 1204 is connected between the gate of the driving transistor 406 and a second gate line 1201.

When it is desired to erase a signal, the second gate line 1201 is selected (supplied with a high potential here) to turn the erasing diode 1204 on, so that current flows from the second gate line 1201 to the gate of the driving transistor 406. Consequently, the driving transistor 2203 is turned off. Then, no current flows from the power supply line 403 to the opposite electrode 408 through the light-emitting element 407. Consequently, a non-light-emitting period can be provided and the length of a light-emitting period can be freely controlled.

When it is desired to hold a signal, the second gate line 1201 is not selected (supplied with a low potential here). Then, the erasing diode 1204 is turned off and the gate potential of the driving transistor 406 is thus held.

Note that the erasing diode 1204 may be any element as far as it has a rectifying property. The erasing diode 1204 may be a PN diode, a PIN diode, a Schottky diode, or a zener diode.

Figure 23:
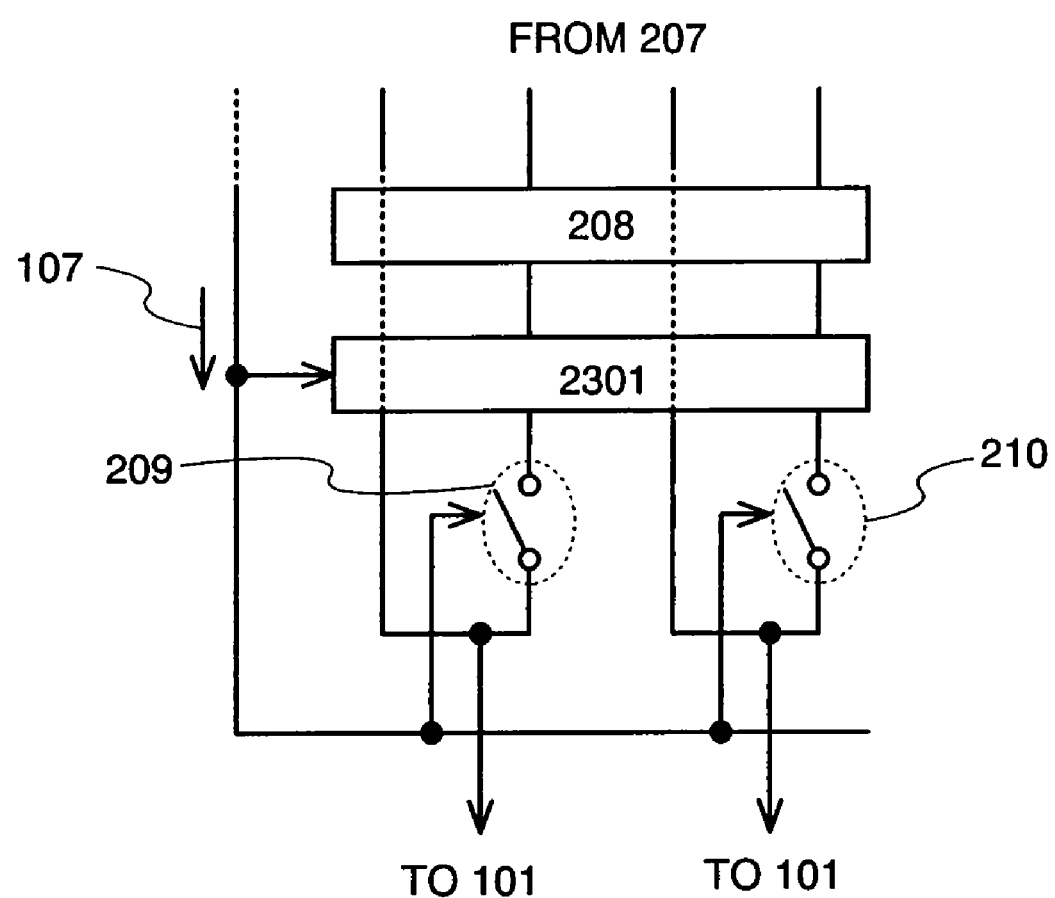
FIG. 23 is a diagram explaining a configuration of a display device according to the present invention.

In addition, a diode-connected transistor (a gate and a drain thereof are connected) may be used as well. FIG. 23 shows a circuit diagram in this case. As the erasing diode 1204, a diode-connected transistor 1304 is used. Although an N-channel transistor is used here, the present invention is not limited thereto and a P-channel transistor may also be used.

Note that a driving method as shown in FIG. 10 can be achieved using the circuit in FIG. 4 as still another circuit. FIG. 9 shows a timing chart of this case. As shown in FIG. 9, one gate selection period is divided into three; however, here, one gate selection period is divided into two. Each gate line is selected in each of the divided selection periods and a corresponding signal (a video signal and an erasing signal) is inputted into the source signal line 402. For example, in one gate selection period, the i-th row is selected in the first half of the period and the j-th row is selected in the latter half of the period. Then, when the i-th row is selected, a video signal for it is inputted. On the other hand, when the j-th row is selected, a signal for turning the driving transistor off is inputted. Accordingly, an operation can be performed as if the two rows are selected at the same time in the one gate selection period.

Note that details of such a driving method are disclosed in, for example, Japanese Patent Application Laid-Open No. 2001-324958 and the like, which can be applied in combination with the present invention.

Note that the timing charts, pixel configurations, and driving methods that are shown in this embodiment mode are examples, and the present invention is not limited thereto. It is possible to apply various timing charts, pixel configurations, and driving methods.

Note that this embodiment mode describes the pixel of Embodiment Modes 1 to 3 in detail. Therefore, the content described in this embodiment mode can be arbitrarily combined with the content described in Embodiment Modes 1 to 3.

Embodiment Mode 5

In the case of a digital mode, only a binary of light emission and non-light emission can be expressed if nothing is done. However, power consumption can be reduced considerably by performing display only with the binary.

In addition, since a gray scale can be distanced more clearly, it is possible to improve visibility of a display screen of a display panel.

Such a display mode is to be referred to as a binary mode.

Herein, performing display with the binary mode will be described in detail. As for the pixel configuration, various configurations described in Embodiment Mode 4 may be used.

Figure 14A:
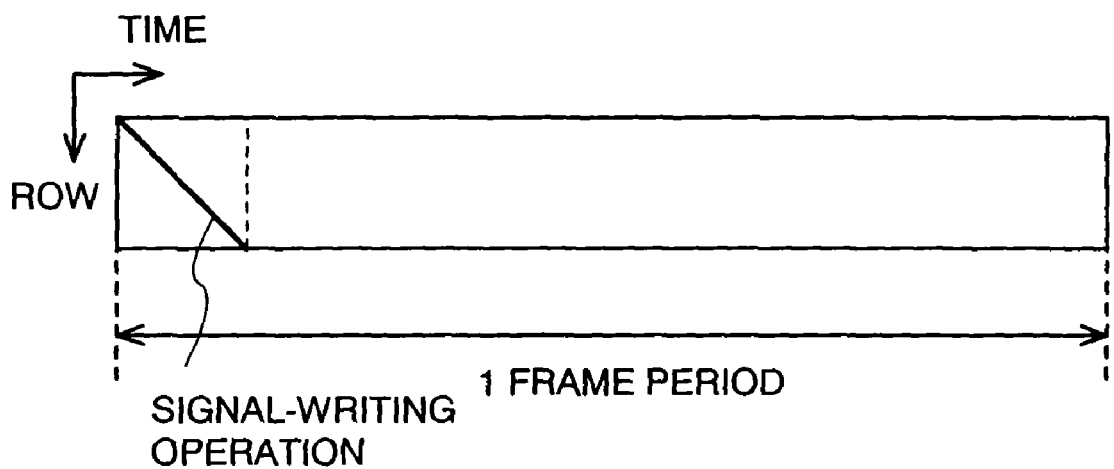
FIGS. 14A and 14B are diagrams each explaining a driving method of a display device according to the present invention.

First, FIG. 14A shows a timing chart in a case where signals are written while scanning rows with almost the same rate as each driving method described in Embodiment Mode 4. In this case, since a source driver or a gate driver is to be operated with almost the same frequency, signals that are inputted into these drivers (for example, a clock signal or the like) may have the same frequency. Therefore, a frequency generating circuit is not necessarily plural, which may be one. Thus, the circuit can be reduced in size and the const reduction can be realized.

Figure 14B:
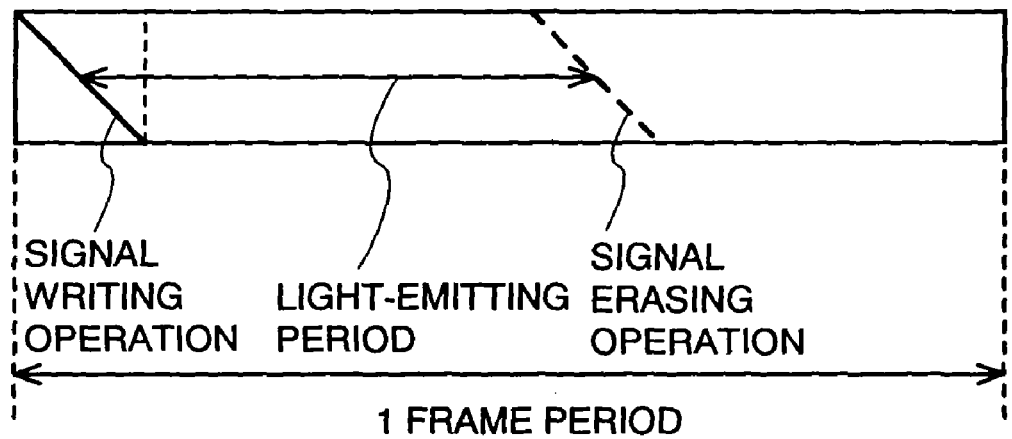

However, in this case, the duty ratio of the binary mode may be increased compared with an analog mode or a digital mode other than the binary mode. Thus, in order to reduce the duty ratio, an erasing operation may also be performed. FIG. 14B shows a timing chart in this case.

Figure 15A:
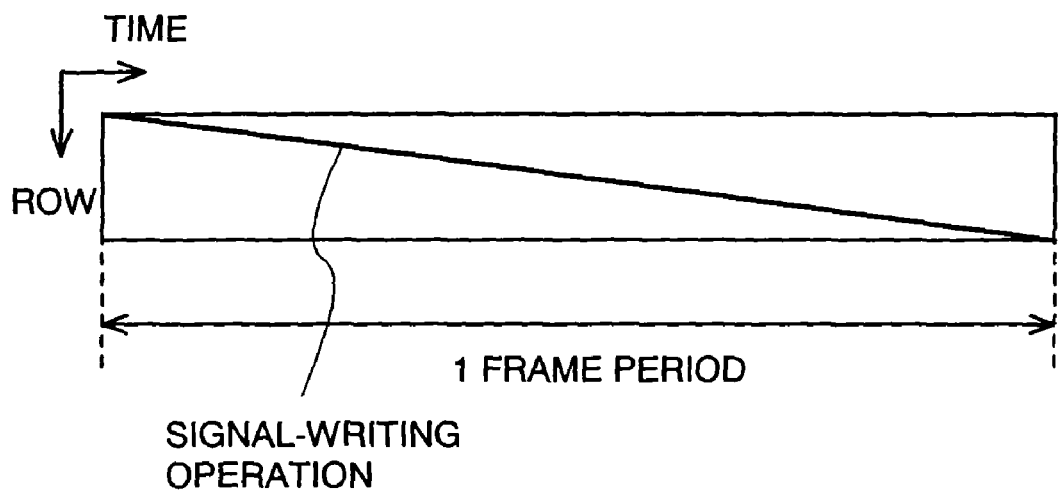
FIGS. 15A and 15B are diagrams each explaining a driving method of a display device according to the present invention.

Next, FIG. 15A shows a timing chart in a case where signals are written while scanning rows with rate lower than the case of each driving method described in Embodiment Mode 4. Herein, all rows are scanned taking one-frame period. In this case, a source driver or a gate driver is to be operated with the low frequency. Thus, a signal that is supplied to the source driver or the gate driver or voltage of a power supply may be low. Therefore, power consumption can be reduced.

Figure 15B:
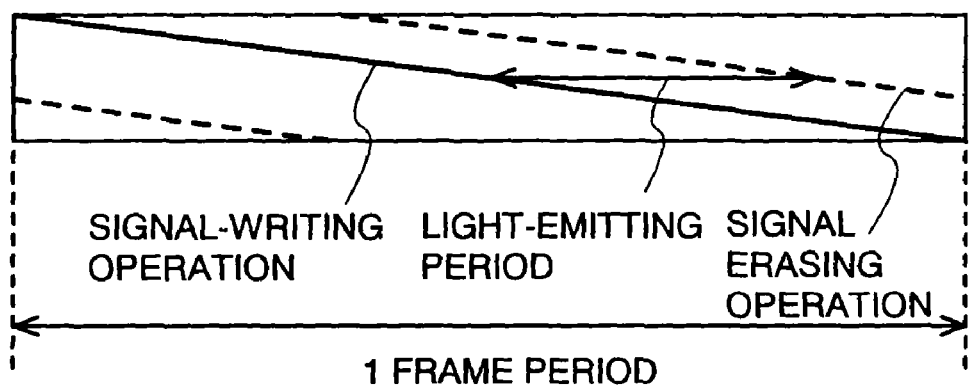

However, also in this case, the duty ratio of the binary mode may be increased compared with an analog mode or a digital mode other than the binary mode. Thus, in order to reduce the duty ratio, an erasing operation may also be performed. FIG. 15B shows a timing chart in this case.

Note that, also in the analog mode, an operation may be performed according to the timing chart of FIGS. 14A and 14B or FIGS. 15A and 15B.

Note that, in a case of performing color display with the binary mode, display is performed with binary in each of R, G, and B; thus, it is possible to display eight colors in total.

Figure 16A:
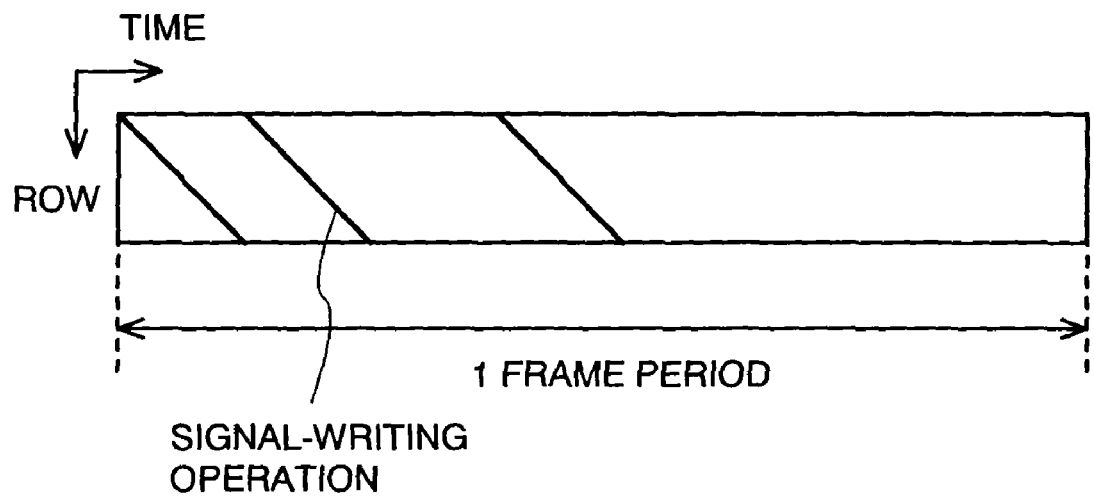
FIGS. 16A and 16B are diagrams each explaining a driving method of a display device according to the present invention.
Figure 16B:
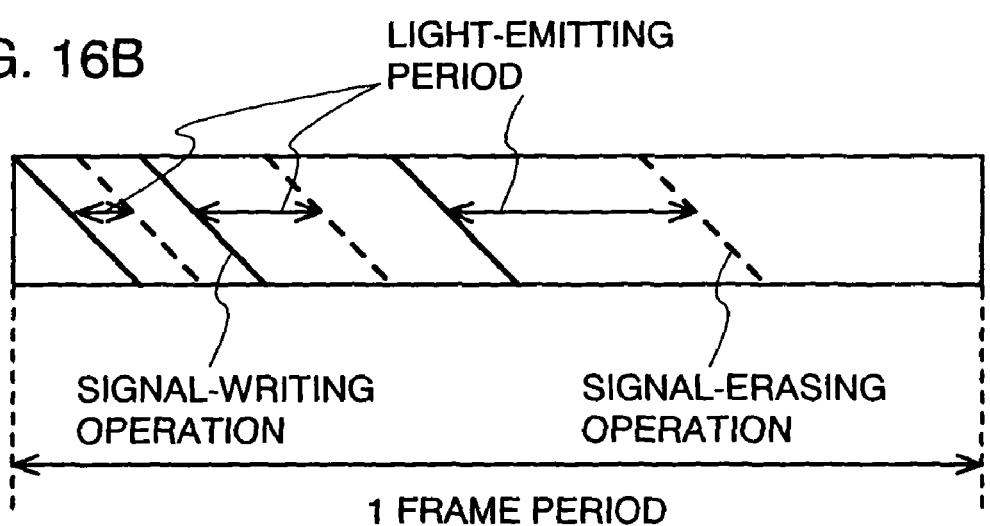

Note that, although the case of displaying only with the binary is described here, the present invention is not limited thereto. Not only the binary, that is, display only with one bit, but also display with two bits or more may be performed. For example, FIGS. 16A and 16B show a case of performing three-bit display. As shown in FIGS. 14A and 14B or FIGS. 15A and 15B, an erasing operation may be performed, or rate for scanning rows may be slowed down.

Note that this embodiment mode describes the pixel of Embodiment Modes 1 to 4 in detail. Therefore, the content described in this embodiment mode can be arbitrarily combined with the content described in Embodiment Modes 1 to 4.

Embodiment Mode 6

Thus far, various display modes are described. First, there are an analog mode and a digital mode, and the digital mode has a normal mode and a binary mode.

Note that, the digital mode having fewer display gray scales than the normal mode and having more display gray scales than the binary mode is to be referred to as a multi-valued mode. In other words, the normal mode refers to a display mode in a case where the gray scale number are the most in the digital mode, and the normal mode is hereinafter referred to as a full gray scale mode. The multi-valued mode can reduce power consumption than the full gray scale mode and an image can be displayed more clearly than the binary mode.

Thus, the analog mode, the digital mode in the full gray scale mode, the digital mode in the multi-valued mode, or the digital mode in the binary mode may be switched depending on illuminance of an image to be displayed, outside, or a periphery.

For example, when it is desired to display a clear image like a photograph or the like or when peripheral illuminance is not so high, an analog mode or a full gray scale mode is used for display. Accordingly, it is possible to express a gray scale precisely and finely. In this case, a display mode may be switched depending on a signal that is inputted as a video signal 106. For example, when the video signal 106 is an analog signal, an analog mode may be used, and when the video signal 106 is a digital signal, a full gray scale mode may be used. As for the full gray scale mode, it is desirable to perform display of six bits or more, more desirably, display of eight bit or more. As for the analog mode, it is desirable to perform display of eight bits or more.

In addition, in a case of displaying a character mainly, for example, in a case of reading an e-mail, reading an electronic book, or when illuminance is as high as outdoor, it is desirable to perform display by using a digital mode in a binary mode. Accordingly, power consumption can be reduced. In addition, since a gray scale can be distinguished more clearly, it is possible to improve visibility of a display screen of a display panel.

Moreover, for example, when it is desired to express a gray scale of an illustration, an animation, a cartoon, or the like without necessity to express finely as a photograph or the like, or in a case of illuminance as like clouded outdoor, it is desirable to perform display by using a multi-valued mode. Accordingly, power consumption can be reduced and a clear image can be displayed.

Note that this embodiment mode describes the pixel of Embodiment Modes 1 to 5 in detail. Therefore, the content described in this embodiment mode can be arbitrarily combined with the content described in Embodiment Modes 1 to 5.

Embodiment Mode 7

Next, as for each display mode, that is, an analog mode, a full gray scale mode, a digital mode in a multi-valued mode, a digital mode in a binary mode, or the like, potential of a power supply line 403 and an opposite electrode 408 in each display mode will be described.

Figure 17:
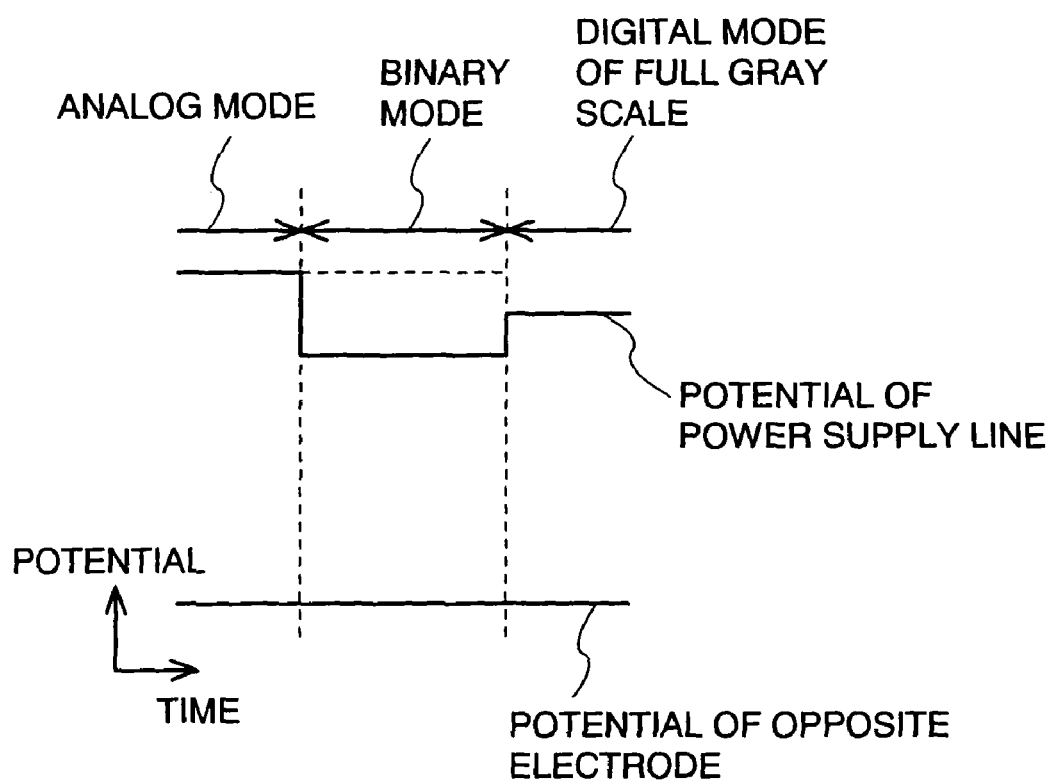
FIG. 17 is a diagram explaining a driving method of a display device according to the present invention.

First, a case where potential of the power supply line 403 is changed will be described. FIG. 17 shows a case where a display mode is changed in the order of an analog mode, a digital mode of a binary mode, and a digital mode of a full gray scale mode. In the analog mode, a driving transistor is mainly operated in a saturation region; therefore, it is necessary to increase the voltage between the power supply line 403 and the opposite electrode 408. In other words, it is necessary to increase the potential of the power supply line 403. In the binary mode, a driving transistor is mainly operated in a linear region; therefore, the voltage between the power supply line 403 and the opposite electrode 408 is reduced. In other words, the potential of the power supply line 403 may be low. In addition, since the binary mode has a high duty ratio in some cases, with the consideration thereof, the voltage between the power supply line 403 and the opposite electrode 408 is reduced. In the digital mode in the full gray scale mode, since the duty ratio gets higher than that of the binary mode in some cases, in this case, the voltage between the power supply line 403 and the opposite electrode 408 gets higher than that of the binary mode. In other words, the potential of the power supply line 403 is increased. However, a driving transistor is mainly operated in a linear region; therefore, the voltage may be lower than that of the analog mode. In other words, the potential of the power supply line 403 may be low.

Note that, since a characteristic of a light-emitting element differs in each color, in the binary mode or the full gray scale mode, the potential of the power supply line 403 may differ in each color.

Figure 18:
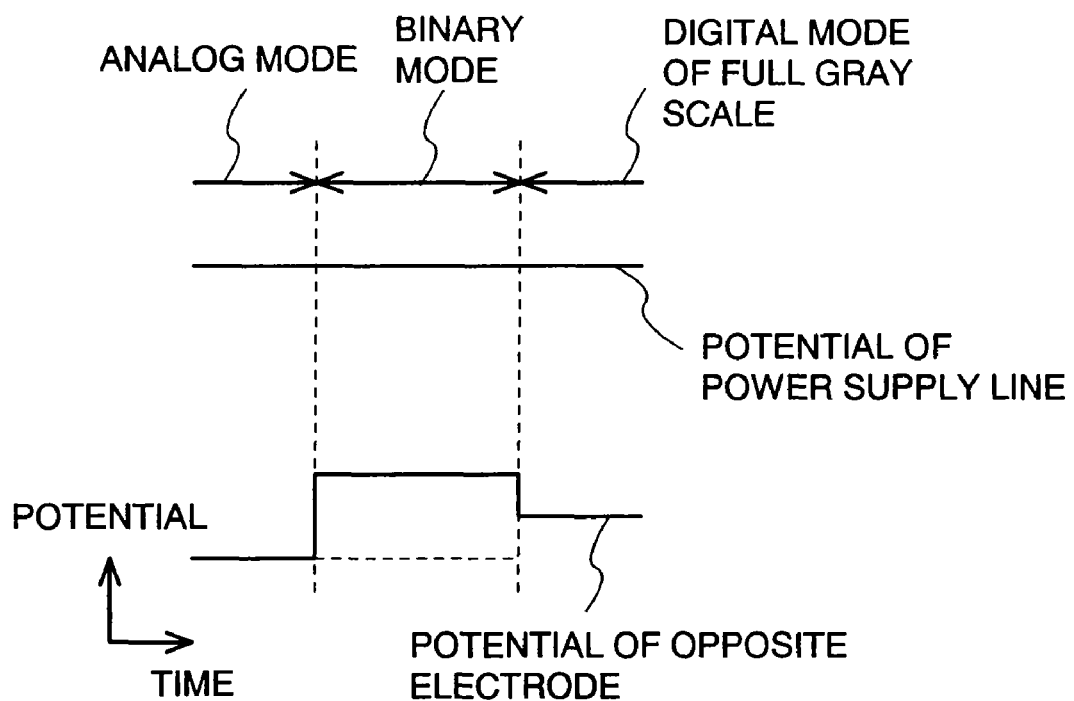
FIG. 18 is a diagram explaining a driving method of a display device according to the present invention.

Although the potential of the power supply line 403 is changed depending on a display mode in FIG. 17, the present invention is not limited thereto. The potential of the opposite electrode 408 may be changed. FIG. 18 shows this case.

In the analog mode, a driving transistor is mainly operated in a saturation region; therefore, it is necessary to increase the voltage between the power supply line 403 and the opposite electrode 408. In other words, it is necessary to reduce the potential of the opposite electrode 408. In the binary mode, a driving transistor is mainly operated in a linear region; therefore, the voltage between the power supply line 403 and the opposite electrode 408 is reduced. In other words, the potential of the opposite electrode 408 may be high. In addition, since the binary mode has a high duty ratio in some cases, with the consideration thereof, the voltage between the power supply line 403 and the opposite electrode 408 is reduced. In the digital mode in the full gray scale mode, since the duty ratio gets higher than that of the binary mode in some cases, in this case, the voltage between the power supply line 403 and the opposite electrode 408 gets higher than that of the binary mode. In other words, the potential of the opposite electrode 408 is reduced. However, a driving transistor is mainly operated in a linear region; therefore, the voltage may be lower than that of the analog mode. In other words, the potential of the opposite electrode 408 may be high.

Note that, since a characteristic of a light-emitting element differs in each color, in the binary mode or the full gray scale mode, the potential of the opposite electrode 403 may differ in each color.

FIGS. 17 and 18 may be combined. In other words, both potentials of the power supply line 403 and the opposite electrode 408 may be changed depending on a display mode. However, the potential of the power supply line 403 and the opposite electrode 408 are not necessarily changed even when display modes are changed.

Figure 19:
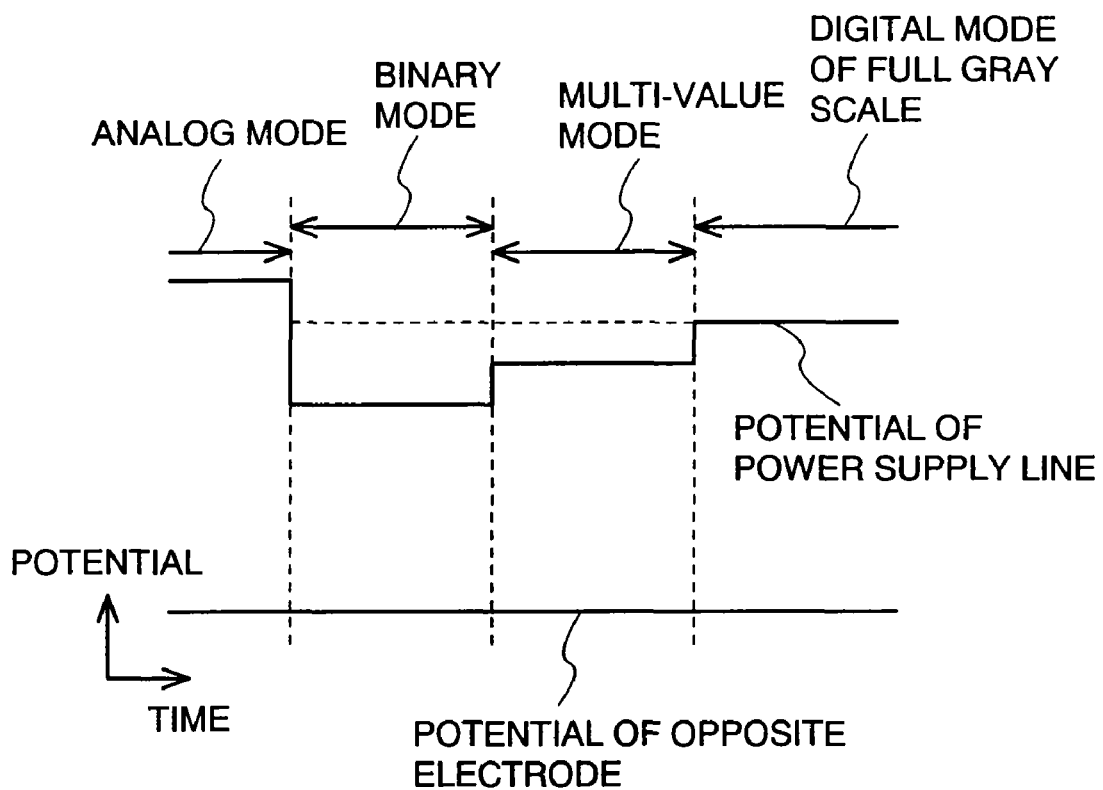
FIG. 19 is a diagram explaining a driving method of a display device according to the present invention.
Figure 20:
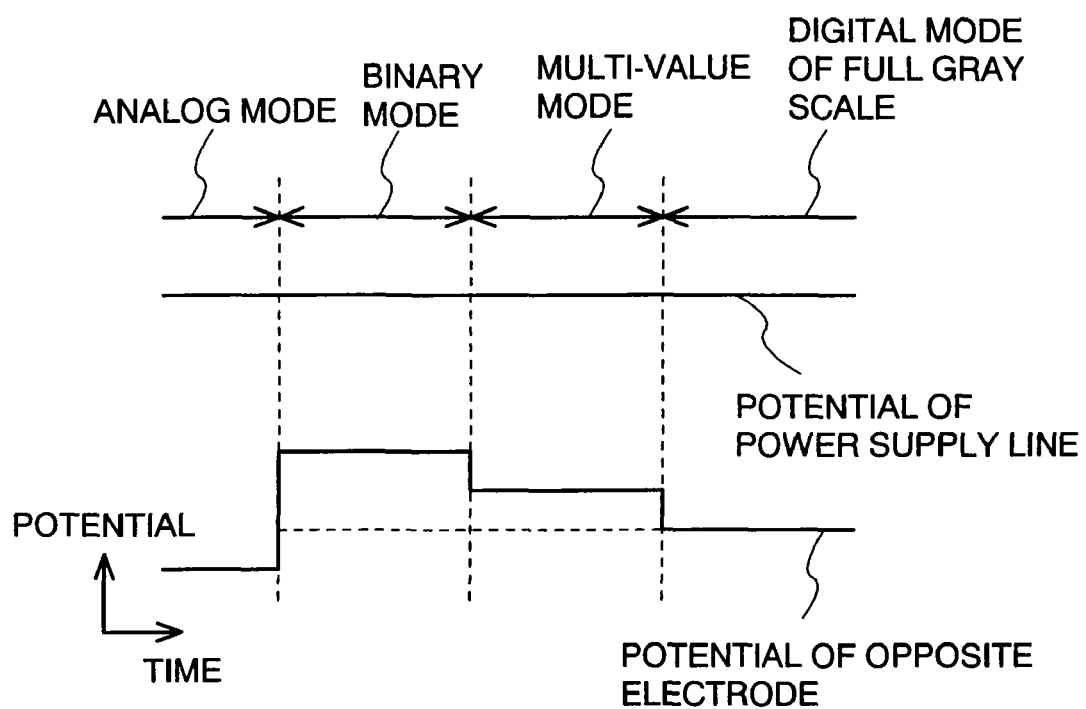
FIG. 20 is a diagram explaining a driving method of a display device according to the present invention.

Note that, although FIGS. 17 and 18 show a case of changing display modes in the order of an analog mode, a digital mode in a binary mode, and a digital mode in a full gray scale mode, the present invention is not limited thereto. The display mode may be changed in any order. In addition, FIGS. 19 and 20 each shows a case of using a multi-valued mode. It is desirable that the potential of the power supply line 403 in the multi-valued mode be lower than that of the full gray scale mode and higher than that of the binary mode. Moreover, it is desirable that the potential of the opposite electrode 408 in the multi-valued mode be higher than that of the full gray scale mode and lower than that of the binary mode.

By using these modes, it is possible to display a clear image while reducing power consumption depending on an image to be displayed.

Figure 21:
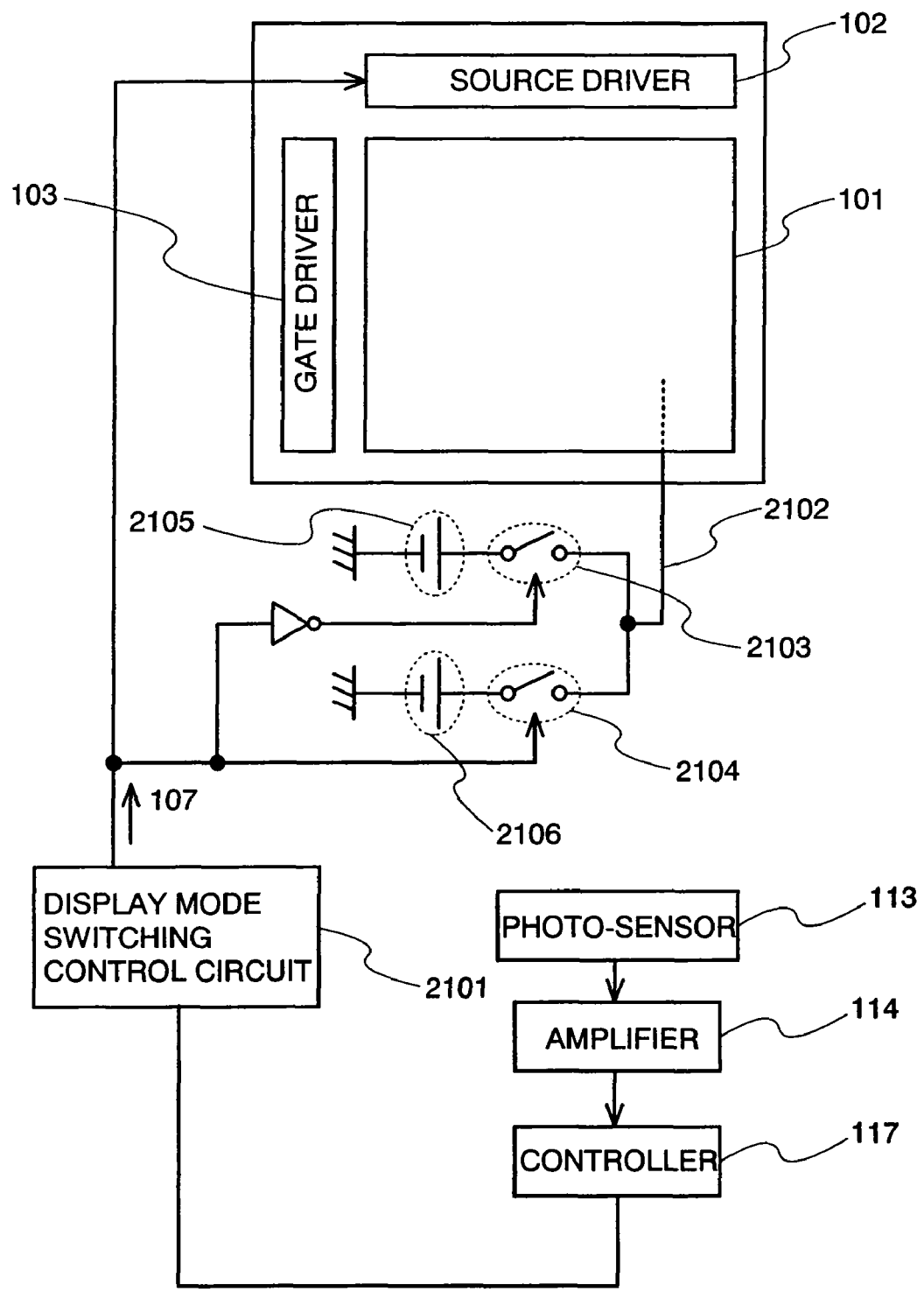
FIG. 21 is a diagram explaining a configuration of a display device according to the present invention.
Figure 22:
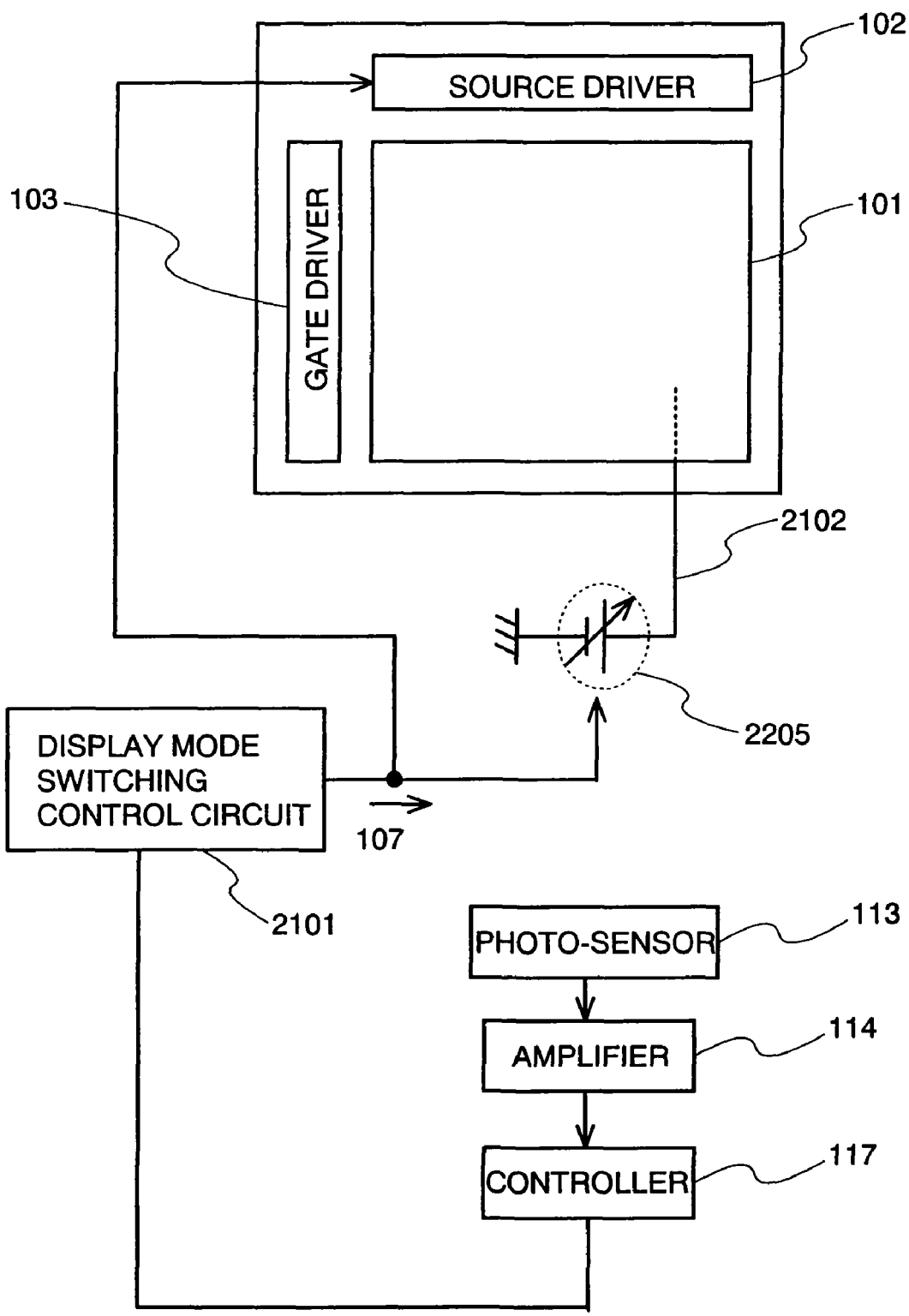
FIG. 22 is a diagram explaining a configuration of a display device according to the present invention.

Then, a circuit configuration in a case where the potential of the power supply line 403 and the opposite electrode 408 is changed will be described. FIG. 21 shows a configuration diagram when a plurality of power supplies is used. A display mode is determined in a display mode switching control circuit 2101. Then, a display mode control signal 107 is outputted to control. A wiring 2102 is connected to power supply lines 403 and 221, the opposite electrode 408, an opposite electrode 222, or the like. Then, it is controlled that which of voltage from power supplies 2105 and 2106 is outputted by using a switch 2103 or 2104. In FIG. 21, although the case of the two power supplies 2105 and 2106 and the two switches 2103 and 2104 is shown, the present invention is not limited thereto. Therefore, for example, a variable voltage 2205 may be used and disposed as like in FIG. 22.

Note that this embodiment mode describes the pixel of Embodiment Modes 1 to 6 in detail. Therefore, the content described in this embodiment mode can be arbitrarily combined with the content described in Embodiment Modes 1 to 6.

Embodiment Mode 8

Next, as for each display mode, that is, an analog mode and a digital mode, potential of a video signal will be described.

As for a driving transistor 406 in FIG. 4 or a driving transistor in FIG. 6A, the potential of a signal that is inputted into a gate electrode will be described.

First, in the analog mode, a driving transistor is mainly operated in a saturation region; therefore, a gate-source voltage of the driving transistor (an absolute value thereof) is low. On the other hand, in the digital mode, a driving transistor is mainly operated in a linear region; therefore, a gate-source voltage of the driving transistor (an absolute value thereof) is high.

Thus, a video signal to be inputted into a pixel may be differed in an analog mode and a digital mode. Thus, a circuit for controlling a level may be arranged. FIG. 23 shows a circuit diagram in this case. A level control circuit 2301 may be arranged after a latch 2 circuit. In this circuit, a video signal to be inputted into a pixel may be differed depending on a display mode.

Figure 24:
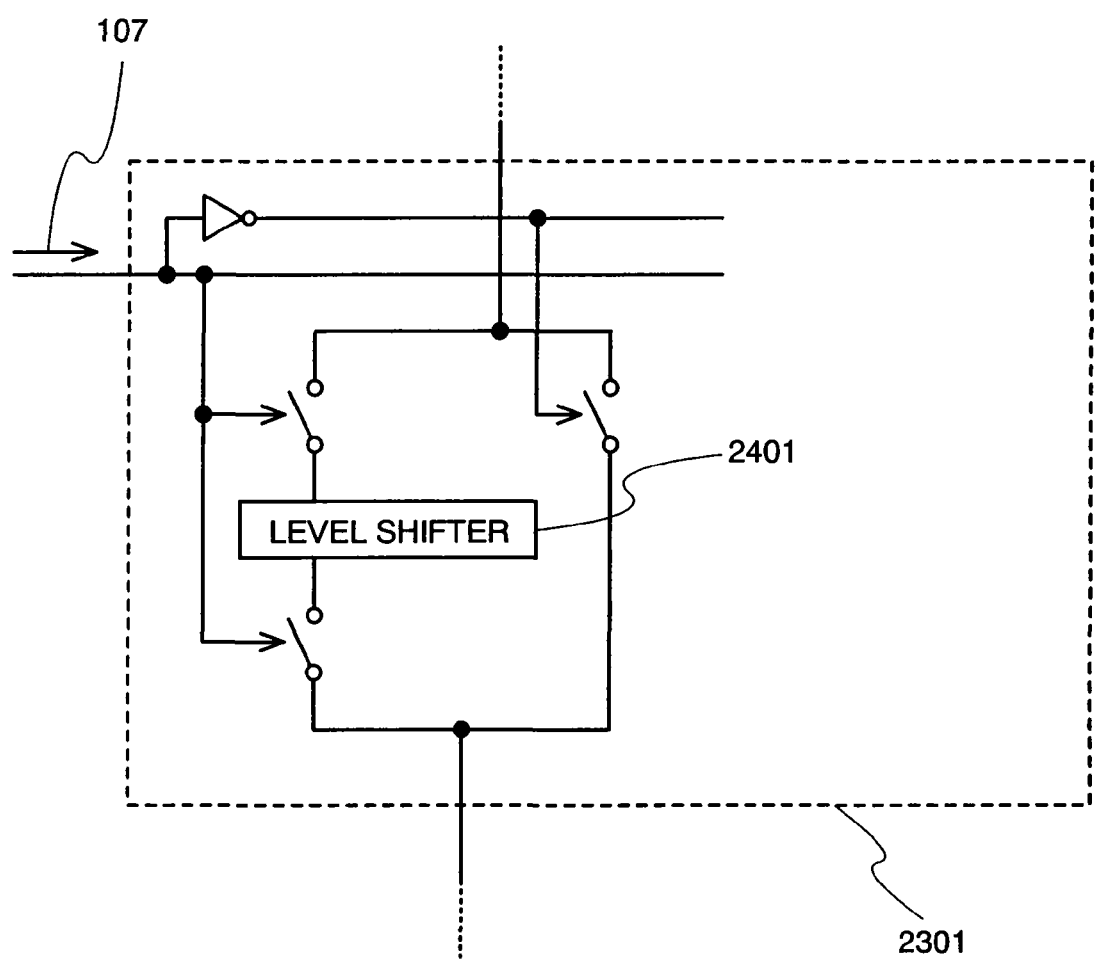
FIG. 24 is a diagram explaining a configuration of a display device according to the present invention.

FIG. 24 shows a configuration of the level control circuit 2301. It is controlled whether the level is converted or not by switching to pass or not to pass a level shifter 2401.

Note that this embodiment mode describes the pixel of Embodiment Modes 1 to 7 in detail. Therefore, the content described in this embodiment mode can be arbitrarily combined with the content described in Embodiment Modes 1 to 7.

Embodiment Mode 9

Figure 25:
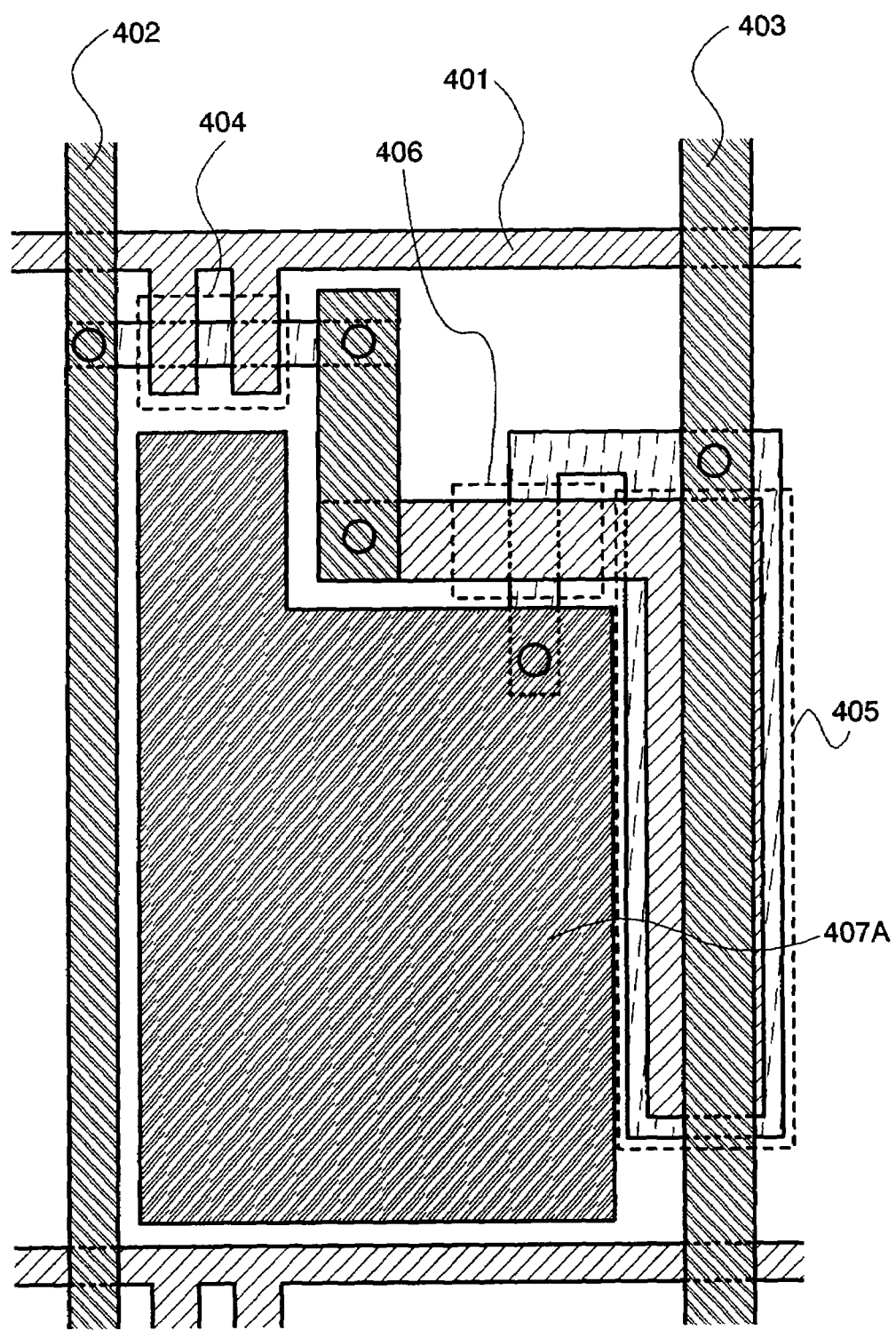
FIG. 25 is a diagram explaining a configuration of a display device according to the present invention.

Next, description is made on the layout of a pixel in the display device of the present invention. As an example, FIG. 25 is a layout diagram of the circuit diagram shown in FIG. 4. Note that the circuit diagram and the layout diagram are not limited to FIGS. 4 and 25.

An electrode 407A of a selection transistor 404, a driving transistor 406, and a light-emitting element 407 are arranged. A source and a drain of the selection transistor 404 are connected to a source signal line 402 and a gate of the driving transistor 406, respectively. A gate of the selection transistor 404 is connected to the gate signal line 401. A source and a drain of the driving transistor 406 are connected to a power supply line 403 and an electrode of the light-emitting element 407, respectively. A storage capacitor 405 is connected between the gate of the driving transistor 406 and the power supply line 403.

The source signal line 402 and the power supply line 403 are formed with a second wiring, and the gate signal line 401 is formed with a first wiring.

In a case of a top-gate structure, a substrate, a semiconductor layer, a gate insulating film, the first wiring, an interlayer insulating film, and the second wiring are sequentially formed. In a case of a bottom-gate structure, a substrate, the first wiring, a gate insulating film, a semiconductor layer, an interlayer insulating film, and the second wiring are sequentially formed.

Figure 36:
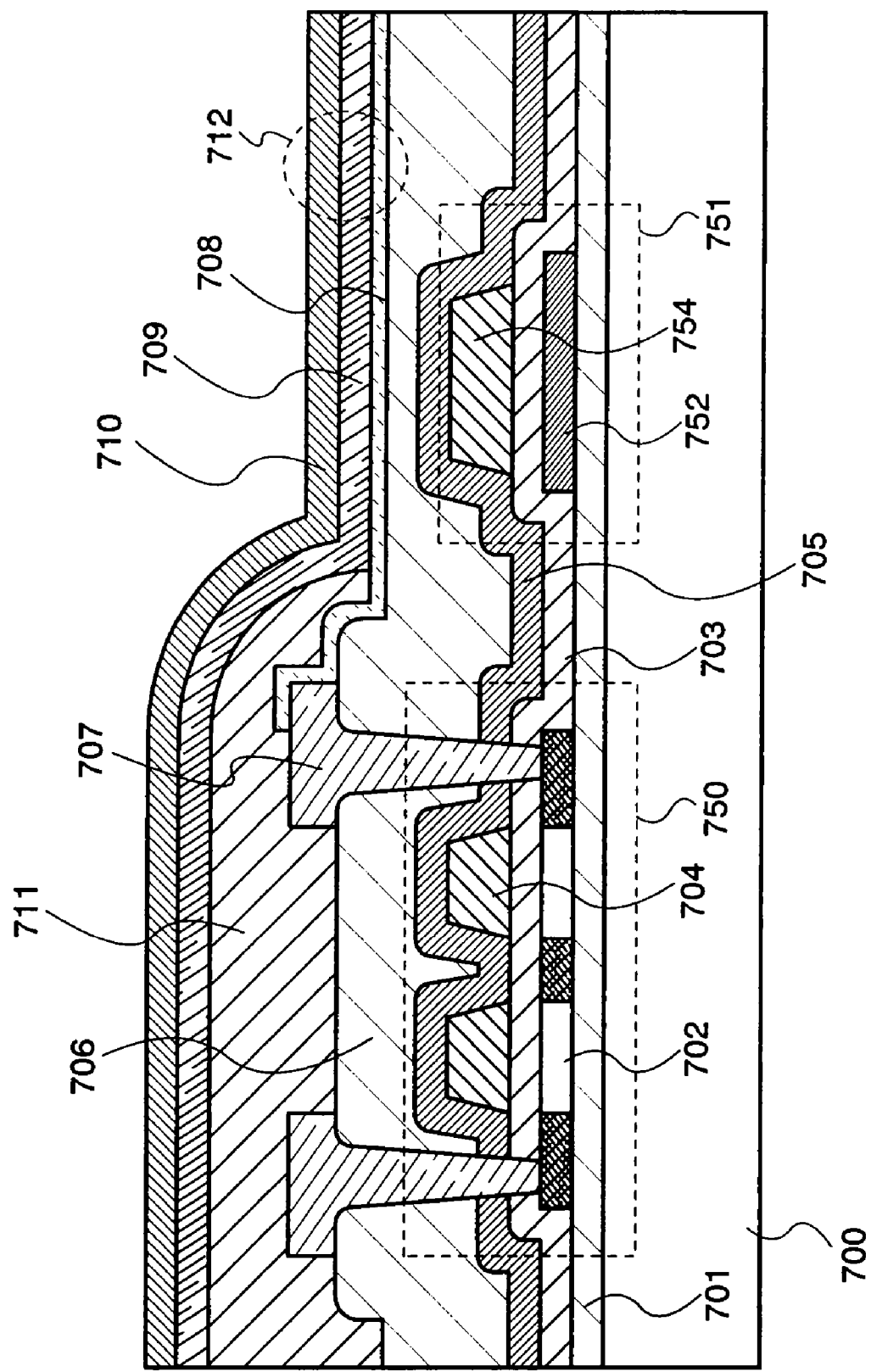
FIG. 36 is a view explaining a structure of a display device according to the present invention.

Next, FIG. 36 shows a cross-sectional view of a pixel constituted by a thin film transistor (TFT) and a light-emitting element connected thereto.

In FIG. 36, a semiconductor layer 702 constituting a base layer 701 and a TFT 750 and a semiconductor layer 712 constituting one of electrodes of a capacitance portion 751 are formed over a substrate 700. Over these layers, a first insulating layer 703 is formed, which functions as a gate insulating layer for the TFT 750, and as a dielectric layer forming capacitance for the capacitance portion 751.

Over the first insulating layer 703, a gate electrode 704 and a conductive layer 754 forming the other electrode of the capacitance portion 751 are formed. A wiring 707 connected to the TFT 750 is connected to a first electrode 708 of a light-emitting element 712. The first electrode 708 is formed over a third insulating layer 706. A second insulating layer 705 may be formed between the first insulating layer 703 and the third insulating layer 706. The light-emitting element 712 is constituted by the first electrode 708, an EL layer 709, and a second electrode 710. In addition, a fourth insulating layer 711 is formed so as to cover a peripheral edge of the first electrode 708 and a connection portion of the first electrode 708 and a wiring 707.

Then, the details of the structure shown above will be explained. As the substrate 700, a glass substrate such as a barium borosilicate glass and an alumino borosilicate glass, a quartz substrate, a ceramic substrate, or the like can be used. In addition, a metal substrate including stainless-steel or a semiconductor substrate with an insulating film formed over the surface may be used. A substrate formed of a synthetic resin having flexibility such as a plastic may be used. The surface of the substrate 700 may be planarized by polishing such as chemical mechanical polishing (CMP).

As the base layer 701, an insulating film such as silicon oxide, silicon nitride, or silicon nitride oxide can be used. It is possible to prevent an alkali metal such as Na and an alkaline earth metal contained in the substrate 700 from diffusing into the semiconductor layer 702 and having negative effects on the characteristics of the TFT 750 by the base layer 701. Although FIG. 36 has a single layer structure, the base layer 701 may be formed in two layers or in a multilayer of two or more layers. Note that, in a case where a substrate having no problem of impurity diffusion, such as a quartz substrate, is used, the base layer 701 is not necessarily provided.

In addition, a surface of the glass substrate may be processed directly by dense plasma the electron temperature of which is 2 eV or less, the ion energy is 5 eV or less, and the electron density is approximately from $1 \times 10^{11}$ to $5 \times 10^{13}/cm^3$ that is excited by a microwave. For generating plasma, a plasma treatment apparatus of microwave excitation using a radial slot antenna can be used. At this time, when nitrogen ($N_2$), or a nitride gas such as ammonia ($NH_3$) or nitrous oxide ($N_2O$) is introduced, the surface of the glass substrate can be nitrided. Since a nitride layer formed over the surface of the glass substrate contains silicon nitride as its main component, the nitride layer can be used a blocking layer of an impurity diffused from the glass substrate side. A silicon oxide film or a silicon oxynitride film may be formed over the nitride layer by a plasma CVD method so as to be the base layer 701.

Besides, by performing the same plasma treatment to a surface of the base layer 701 of silicon oxide, silicon oxynitride, or the like, the surface and 1 to 10 nm deep from the surface can be treated for nitriding. By this extremely thin layer of silicon nitride, a blocking layer, which does not have an effect of stress on a semiconductor layer formed thereover, can be made.

As the semiconductor layer 702 and the semiconductor layer 752, it is preferable to use patterned crystalline semiconductor films. Note that patterning refers to processing the shape of a film, that is, forming a film pattern by a photolithography technique (for example, forming a contact hole in photosensitive acrylic or processing the shape of photosensitive acrylic so as to be a spacer is included), or forming a mask pattern by a photolithography technique to perform etching processing by using the mask pattern. A crystalline semiconductor film can be obtained by crystallizing an amorphous semiconductor film. As a method for crystallization, a laser crystallization method, a thermal crystallization method using an RTA or an annealing furnace, a thermal crystallization method using a metal element promoting crystallization, or the like can be used. The semiconductor layer 702 has a channel forming region and a pair of impurity regions to which an impurity element imparting one conductivity type is added. Note that an impurity region to which the impurity element is added at low concentration may be provided between the channel forming region and the pair of impurity regions. The semiconductor layer 752 can have a structure in which an impurity element imparting one conductivity type or an opposite conductivity type is entirely added.

Silicon oxide, silicon nitride, silicon nitride oxide, or the like can be used as the first insulating layer 703, which can be formed in a single layer or in a stacked layer of a plurality of films. In this case, in the same manner as the above case, oxidation or nitriding may be performed to a surface of the insulating film to have a dense surface by a high-density plasma treatment an electron temperature of which is 2 eV or less, an ion energy is 5 eV or less, and an electron density is approximately $1 \times 10^{11}$ to $5 \times 10^{13}/cm^3$, that is excited by a microwave. This treatment may be performed before forming the first insulating layer 703. In other words, plasma treatment is performed to a surface of the semiconductor layer 702. At this time, by setting a substrate temperature at 300 to 450° C. and performing the treatment in an oxidative atmosphere ($O_2$, $N_2O$, or the like) or in a nitriding atmosphere ($N_2$, $NH_3$, or the like), a preferable interface with the gate insulating layer to be deposited thereover can be formed.

As the gate electrode 704 and the conductive layer 754, a single layer or stacked layer structure formed of an alloy or a compound including one or more elements of Ta, W, Ti, Mo, Al, Cu, Cr and Nd can be used.

The TFT 750 includes the semiconductor layer 702, the gate electrode 704, and the first insulating layer 703 between the semiconductor layer 702 and the gate electrode 704. In FIG. 36, as the TFT 750 configuring a pixel, a TFT which is connected to the first electrode 708 of the light-emitting element 712 is shown. This TFT 750 has a structure of a multi-gate type in which a plurality of gate electrodes 704 are placed over the semiconductor layer 702. In other words, the TFT 750 has a structure in which a plurality of TFTs are connected in series. According to such a structure, the unconsidered increase of off current can be suppressed. Note that, although FIG. 36 shows the TFT 750 as a top-gate TFT, the TFT 750 may be a bottom-gate TFT having a gate electrode under a semiconductor layer, or a dual-gate TFT having gate electrodes above and under a semiconductor layer.

A capacitor portion 751 includes the first insulating film 703 as a dielectric, and the semiconductor layer 712 and the conductive layer 754 opposing to each other by sandwiching the first insulating film 703, as a pair of electrodes. Note that FIG. 36 shows an example where one of the pair of electrodes is the semiconductor layer 752 which is formed simultaneously with the semiconductor layer 702 of the TFT 750 and the other conductive layer 754 is a layer formed simultaneously with the gate electrode 704; however, the present invention is not limited thereto.

It is desirable that the second insulating layer 705 be an insulating film with a barrier property blocking an ionic impurity, such as a silicon nitride film. The second insulating layer 705 is formed of silicon nitride or silicon oxynitride. The second insulating layer 705 includes a function as a protective film preventing contamination of the semiconductor layer 702. After depositing the second insulating layer 705, high-density plasma treatment exited by a microwave as described above may be performed, introducing a hydrogen gas, so that the second insulating layer 705 is hydrogenated. Alternatively, the second insulating layer 705 may be nitrided and hydrogenated, by introducing an ammonia gas. Alternatively, oxynitride treatment and hydrogen treatment may be performed, by introducing oxygen, an $N_2O$ gas or the like, and a hydrogen gas. By performing nitriding, oxidation, or oxynitride treatment by this method, a surface of the second insulating layer 705 can become dense. Accordingly, a function as a protective film can be strengthened. As for hydrogen introduced to the second insulating layer 705, by performing heat treatment of 400 to 450° C., hydrogen is released from silicon nitride forming the second insulating layer 705, and hydrogenation of the semiconductor layer 702 can be performed.

As the third insulating layer 706, an inorganic insulating film or an organic insulating film can be used. As the inorganic insulating film, a silicon oxide film formed by a CVD method, an SOG (Spin On Glass) film (coated silicon oxide film), or the like can be used. As the organic insulating film, a film of polyimide, polyamide, BCB (benzocyclobutene), acrylic, positive type photosensitive organic resin or negative type photosensitive organic resin, or the like can be used. In addition, as the third insulating layer 706, a material of which the skeleton structure is constituted by the bond of silicon (Si) and oxygen (O) can be used. As a substituent of this material, an organic group including at least hydrogen (an alkyl group and aromatic hydrocarbon, for example) is used. A fluoro group may also be used as the substituent. Alternatively, an organic group including at least hydrogen and a fluoro group may also be used as the substituent.

As the wiring 707, a single layer or a stacked layer structure formed of an alloy containing one or plural kinds of elements of Al, Ni, C, W, Mo, Ti, Pt, Cu, Ta, Au and Mn can be used.

Either one or both of the first electrode 708 and the second electrode 710 can be made as transparent electrodes. As the transparent electrode, indium oxide containing tungsten oxide (IWO), indium oxide containing tungsten oxide and zinc oxide (IWZO), indium oxide containing titanium oxide (ITiO), indium tin oxide containing titanium oxide (ITTiO), indium tin oxide containing molybdenum, or the like can be used. Of course, indium tin oxide (ITO), indium zinc oxide (IZO), indium tin oxide with silicon oxide added (ITSO), or the like can also be used.

At least one of the first electrode 708 and the second electrode 710 may be formed of a material having no transparency. For example, an alkali metal such as Li and Cs, an alkali earth metal such as Mg, Ca and Sr, an alloy containing these (Mg:Ag, Al:Li, Mg:In or the like), an compound thereof ($CaF_2$, $Ca_3N_2$), or a rare-earth metal such as Yb and Er can be used.

The fourth insulating layer 711 can be formed using the same material as the third insulating layer 706.

The light-emitting element 712 is constituted by the EL layer 709, the first electrode 708 and the second electrode 710 sandwiching the EL layer 709. One of the first electrode 708 and the second electrode 710 corresponds to an anode, and the other corresponds to a cathode. When a voltage larger than a threshold voltage is applied with a forward bias between the anode and the cathode, current flows from the anode to the cathode and the light-emitting element 712 emits light.

The EL layer 709 is constituted by a single layer or a plurality of layers. In the case where it is constituted by a plurality of layers, the layers can be classified into a hole injecting layer, a hole transporting layer, a light-emitting layer, an electron transporting layer, an electron injecting layer, and the like, depending on the carrier transport property. Note that the boundary between each layer is not necessarily clear, and there is a case where the interface is unclear because materials constituting each layer are mixed partly. An organic material and an inorganic material can be used for each layer. Any material of a high molecular compound, a middle molecular compound, and a low molecular compound can be used as the organic material.

It is preferable that the EL layer 709 be constituted using a plurality of layers having different functions, such as a hole injecting and transporting layer, a light-emitting layer, and an electron injecting and transporting layer. It is preferable that the hole injecting and transporting layer be formed of composite materials containing an organic compound material having a hole transporting property and an inorganic compound material showing an electron-accepting property to the organic compound material. Due to such a structure, many hole carriers are generated in an organic compound which originally has almost no internal carrier, and an extremely good hole injecting property and transporting property is obtained. According to this effect, a drive voltage can be lowered than a conventional case. In addition, the hole injecting and transporting layer can be thickened without causing increase in the drive voltage, so that short-circuiting of the light-emitting element due to dust or the like can be restrained.

As the organic compound material having a hole transporting property, copper phthalocyanine (abbreviation: CuPc), 4,4',4''-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), and the like can be given as the examples; however, the present invention is not limited thereto.

As the inorganic compound material showing an electron-accepting property, titanium oxide, zirconium oxide, vanadium oxide, molybdenum oxide, tungsten oxide, rhenium oxide, ruthenium oxide, zinc oxide, and the like can be given as the example. Especially vanadium oxide, molybdenum oxide, tungsten oxide, and rhenium oxide are preferable because it is possible to perform vacuum deposition and thus easily dealt with.

The electron injecting and transporting layer is formed by using an organic compound material having an electron transporting property. Specifically, tris(8-quinolinolato)aluminum (abbreviation: $Alq_3$), tris(4-methyl-8-quinolinolato)aluminum (abbreviation: $Almq_3$), bis(2-methyl-8-quinolinolato)(4-phenylphenolato)aluminum (abbreviation: BAlq), bathocuproin (abbreviation: BCP), 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), and the like can be given; however, the present invention is not limited thereto.

As the EL layer, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, rubrene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidine-9-yl)ethenyl]-4H-pyran (abbreviation: DCM2), and the like can be given. In addition, a compound which can emit phosphorescence such as bis{2-[3',5'-bis(trifluoromethyl)phenyl]pyridinato-$N,C^{2'}$}iridium(picolinate) (abbreviation: $Ir(CF_3 ppy)_2(pic)$), tris(2-phenylpyridinate-N,$C^{2'}$)iridium (abbreviation: $Ir(ppy)_3$), bis(2-phenylpyridinate-N,$C^{2'}$)iridium(acetylacetonato) (abbreviation: $Ir(ppy)_2(acac)$), bis[2-(2'-thienyl)pyridinato-N,$C^{3'}$iridium (acetylacetonato) (abbreviation: $Ir(thp)_2(acac)$), or bis(2-phenylquinolinate-N,$C^{2'}$)iridium(acetylacetonato) (abbreviation: $Ir(pq)_2(acac)$) can also be used.

In addition, a singlet excited light-emitting material and a triplet excited light-emitting material including a metal complex or the like may be used for the EL layer. For example, among a pixel for red light emission, a pixel for green light emission, and a pixel for blue light emission, the pixel for red light emission of which the time of luminance reduction by half is relatively short is formed of the triplet excited light-emitting material, and the others are formed of the singlet excited light-emitting material. Since the luminous efficiency of the triplet excited light-emitting material is good, lower power consumption is needed to obtain the same luminance. In other words, when applied to the red pixel, a smaller amount of the current flown to the light-emitting element is needed, so that the reliability can be improved. For lower power consumption, the pixel for red light emission and the pixel for green light emission may be formed of the triplet excited light-emitting material and the pixel for blue light emission may be formed of the singlet excited light-emitting material. By forming the green light-emitting element for which human visibility is high also by the triplet excited light-emitting material, the power consumption can be further reduced.

The EL layer may have a structure in which light-emitting layers with different emission wavelengths are formed for each pixel so that color display is performed. Typically, light-emitting layers corresponding to colors of R (red), G (green) and B (blue) respectively are formed. In this case, by making a structure where a filter which transmits light of the emission wavelength is provided on the light emission side of the pixel, color purity can be improved and the pixel portion can be prevented from becoming a mirror surface (reflective). By providing the filter, a circularly polarizing plate which is conventionally necessary can be omitted, and it becomes possible to have no loss of light emitted from the light-emitting layer. Furthermore, change in the color tone which occurs when the pixel portion (the display screen) is seen from an oblique direction can be decreased.

By combining the pixel with the structure shown in FIG. 36 and an external light strength detector, light-emitting time of the light-emitting element is changed and the luminance of the display screen can be controlled. Furthermore, by controlling light emission of the light-emitting element by the external light strength detector, the lighting time does not increase uselessly, so that power consumption of the display panel can be decreased and the lifetime can be extended.

Note that, as a transistor, not only a transistor using polysilicon but also a transistor using amorphous silicon for a semiconductor layer may also be used.

Subsequently, a case where an amorphous silicon (a-Si:H) film is used as a semiconductor layer of a transistor will be explained. FIGS. 37A and 37B show transistors having a top gate structure while FIGS. 38A and 38B and FIGS. 39A and 39B show transistors having a bottom gate structure.

FIG. 37A is a cross sectional diagram of a transistor having a top gate structure using amorphous silicon as its semiconductor layer. As shown in FIG. 37A, a base film 2802 is formed over a substrate 2801. A pixel electrode 2803 is formed over the base film 2802. In addition, a first electrode 2804 is formed from the same material and formed in the same layer as the pixel electrode 2803.

As the substrate, a glass substrate, a quartz substrate, a ceramic substrate, or the like can be used. In addition, the base film 2802 can be formed using a single layer of aluminum nitride (AlN), silicon oxide ($SiO_2$), silicon oxynitride ($SiO_xN_y$), or the like, or a stacked layer thereof.

A wiring 2805 and a wiring 2806 are formed over the base film 2802, and an end portion of the pixel electrode 2803 is covered with the wiring 2805. An N-type semiconductor layer 2807 and an N-type semiconductor layer 2808 each having N-type conductivity are formed over the wiring 2805 and the wiring 2806. In addition, a semiconductor layer 2809 is formed between the wiring 2805 and the wiring 2806 over the base film 2802, which is partially extended to the N-type semiconductor layer 2807 and the N-type semiconductor layer 2808. Note that this semiconductor layer is formed using an amorphous semiconductor film such as amorphous silicon (a-Si:H) or a microcrystalline semiconductor (μ-Si:H). In addition, a gate insulating film 2810 is formed over the semiconductor layer 2809, and an insulating film 2811 is formed from the same material and formed in the same layer as the gate insulating film 2810 over the first electrode 2804. Note that a silicon oxide film, a silicon nitride film, or the like is used as the gate insulating film 2810.

A gate electrode 2812 is formed over the gate insulating film 2810. In addition, a second electrode 2813 is formed from the same material and formed in the same layer as the gate electrode over the first electrode 2804 with the insulating film 2811 interposed therebetween. A capacitor element 2819 is formed by sandwiching the insulating film 2811 between the first electrode 2804 and the second electrode 2813. An interlayer insulating film 2814 is formed to cover an end portion of the pixel electrode 2803, a driving transistor 2818, and the capacitor 2819.

A layer 2815 containing an organic compound and an opposite electrode 2816 are formed over the interlayer insulating film 2814 and the pixel electrode 2803 corresponding to an opening of the interlayer insulating film 2814. A light-emitting element 2817 is formed in a region where the layer 2815 containing an organic compound is sandwiched between the pixel electrode 2803 and the opposite electrode 2816.

The first electrode 2804 in FIG. 37A may be a first electrode 2820 as shown in FIG. 37B. The first electrode 2820 is formed from the same material and formed in the same layer as the wirings 2805 and 2806.

Figure 38A:
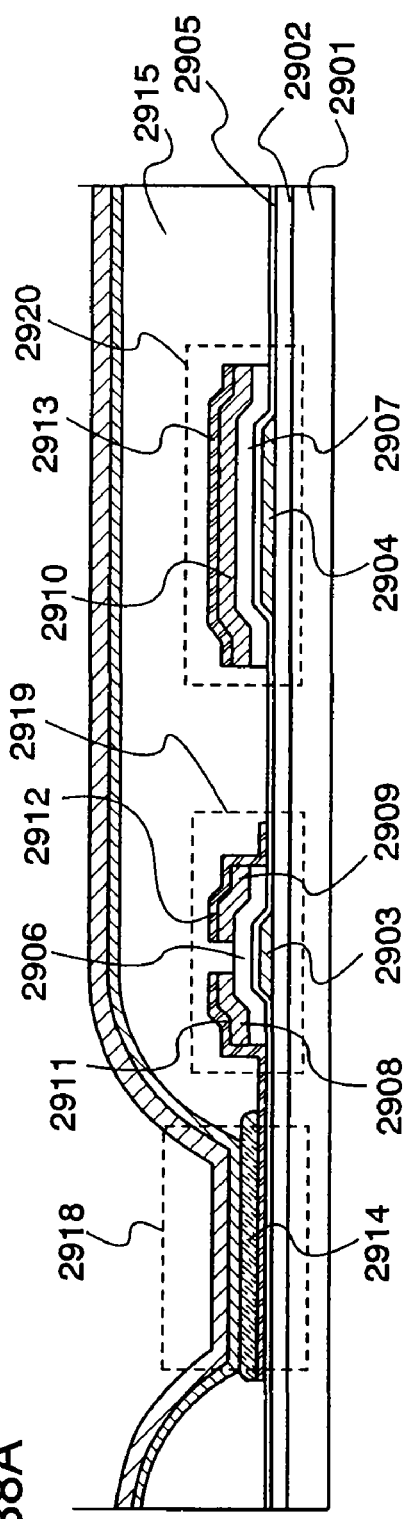
FIGS. 38A and 38B are views each explaining a structure of a display device according to the present invention.
Figure 38B:
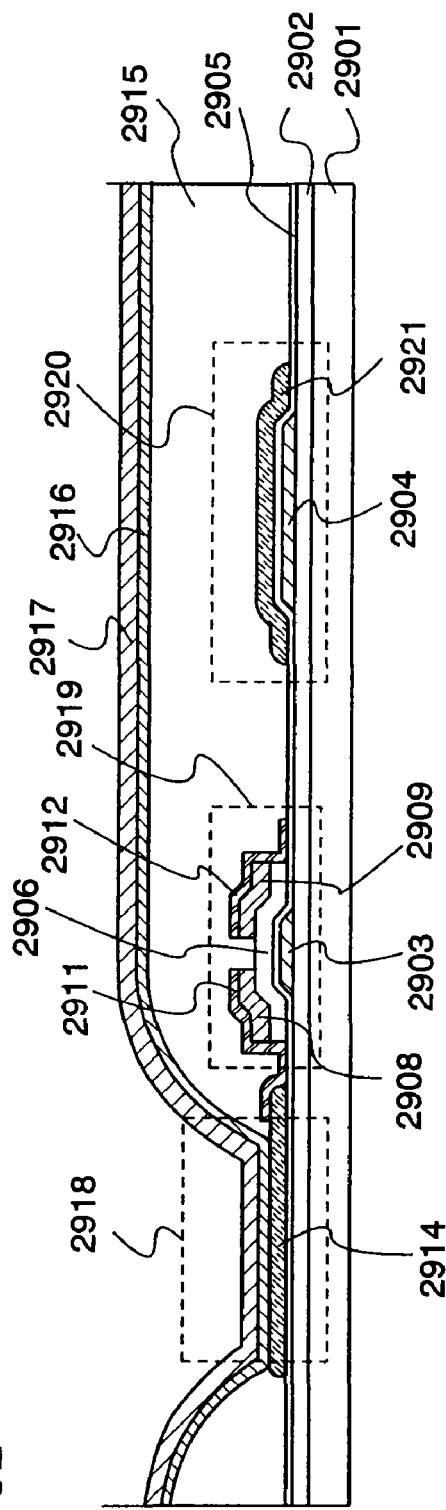

FIGS. 38A and 38B are each a partial cross sectional diagram of a panel of a display device provided with a transistor having a bottom gate structure using amorphous silicon as its semiconductor layer.

A base film 2902 is formed over a substrate 2901. A gate electrode 2903 is formed over the base film 2902. In addition, a first electrode 2904 is formed from the same material and formed in the same layer as the gate electrode. As a material for the gate electrode 2903, polycrystalline silicon added with phosphorus can be used. Besides polycrystalline silicon, silicide that is a compound of metal and silicon may be used as well.

Then, a gate insulating film 2905 is formed to cover the gate electrode 2903 and the first electrode 2904. The gate insulating film 2905 is formed using a silicon oxide film, a silicon nitride film, or the like.

A semiconductor layer 2906 is formed over the gate insulating film 2905. In addition, a semiconductor layer 2907 is formed from the same material and formed in the same layer as the semiconductor layer 2906.

As the substrate, a glass substrate, a quartz substrate, a ceramic substrate, or the like can be used. The base film 2902 can be formed using a single layer of aluminum nitride (AlN), silicon oxide ($SiO_2$), silicon oxynitride ($SiO_xN_y$), or the like, or a stacked layer thereof.

N-type semiconductor layers 2908 and 2909 each having N-type conductivity are formed over the semiconductor layer 2906 while an N-type semiconductor layer 2910 is formed over the semiconductor layer 2907.

Wiring 2911 and 2912 are formed over the N-type semiconductor layers 2908 and 2909, respectively, while a conductive layer 2913 is formed from the same material and formed in the same layer as the wirings 2911 and 2912, over an N-type semiconductor layer 2910.

The semiconductor layer 2907, the N-type semiconductor layer 2910, and the conductive layer 2913 constitute a second electrode. Note that a capacitor element 2920 is formed by sandwiching the gate insulating film 2905 between the second electrode and the first electrode 2904.

One end portion of the wiring 2911 is extended, and a pixel electrode 2914 is formed to be in contact with the upper portion of the extended wiring 2911.

An insulator 2915 is formed so as to cover end portions of the pixel electrode 2914, a driving transistor 2919, and the capacitor element 2920.

Then, a layer 2916 containing an organic compound and an opposite electrode 2917 are formed over the pixel electrode 2914 and the insulator 2915. A display element 2918 is formed in a region where the layer 2916 containing an organic compound is sandwiched between the pixel electrode 2914 and the opposite electrode 2917.

The semiconductor layer 2907 and the N-type semiconductor layer 2910 which form part of the second electrode of the capacitor element may not be provided. In other words, the second electrode may be constituted by the conductive layer 2913, so that the capacitor element may be formed by sandwiching the gate insulating film between the first electrode 2904 and the conductive layer 2913.

Note that, by forming the pixel electrode 2914 before forming the wiring 2911 in FIG. 38A, a capacitor element 2922 can be formed by sandwiching the gate insulating film 2905 between a second electrode 2921 which is formed of the pixel electrode 2914 and the first electrode 2904 as shown in FIG. 38B.

Note that FIGS. 38A and 38B show reverse staggered channel etch type transistors; however, a channel protective type transistor may be used. The case of a channel protective type transistor will be explained with reference to FIGS. 39A and 39B.

Figure 39A:
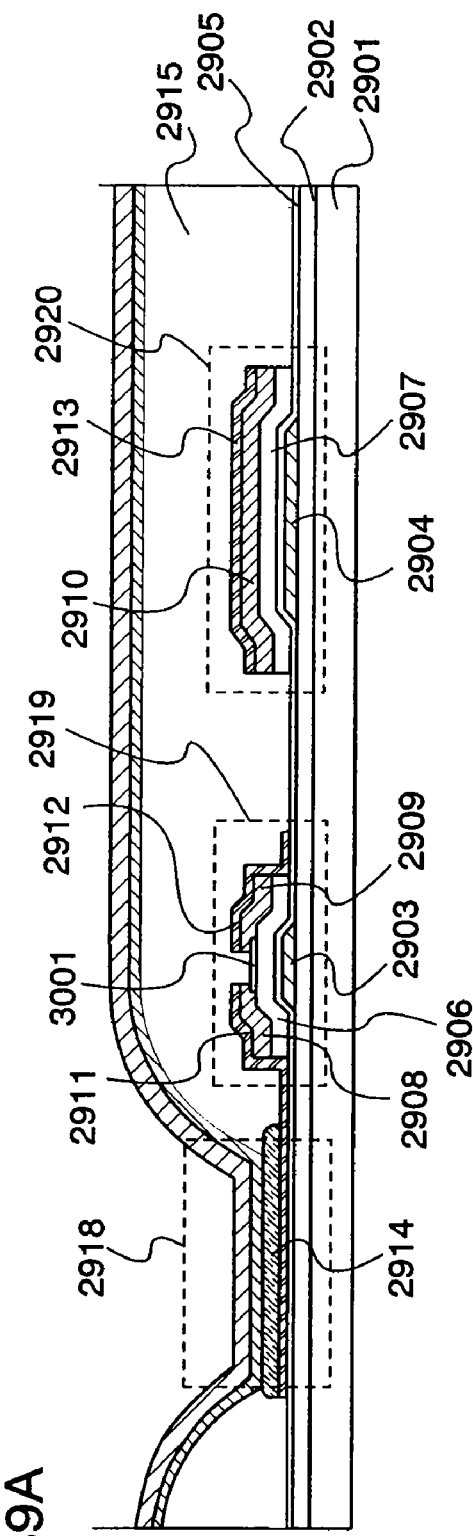
FIGS. 39A and 39B are views each explaining a structure of a display device according to the present invention.

A channel protective type transistor shown in FIG. 39A is different from the driving transistor of the channel etch type 2919 shown in FIG. 38A in that an insulator 3001 which is to be an etching mask is provided over the channel forming region in the semiconductor layer 2906. The other portions identical to FIG. 38A are denoted by the same reference numerals.

Figure 39B:
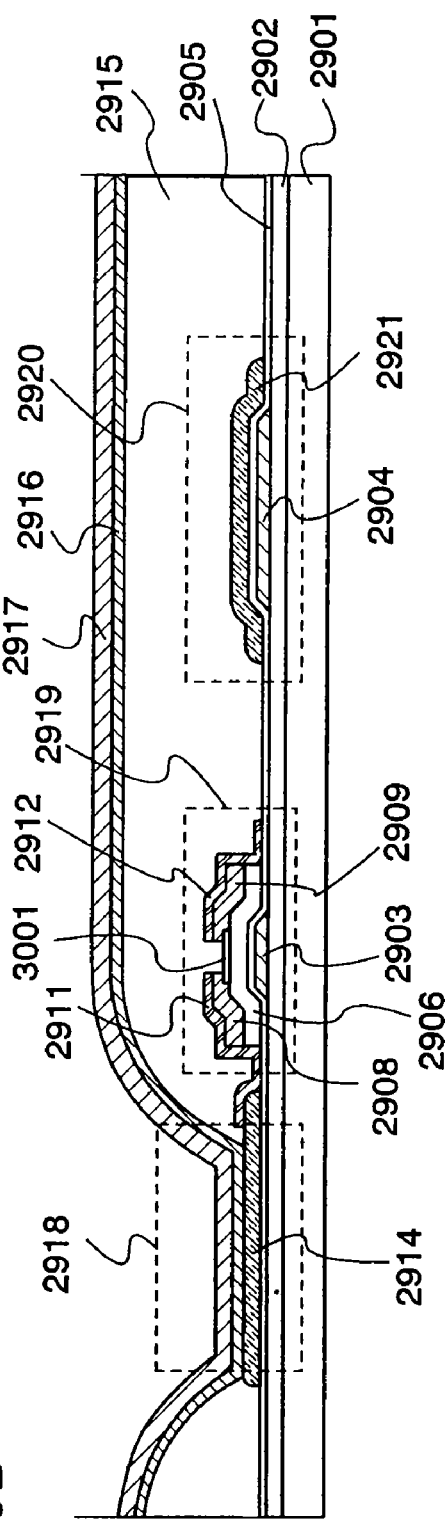

Similarly, a channel protective type transistor shown in FIG. 39B is different from the driving transistor of the channel etch type 2919 shown in FIG. 38B in that the insulator 3001 which is to be an etching mask is provided over the channel forming region in the semiconductor layer 2906. The other portions identical to FIG. 38B are denoted by the same reference numerals.

By using an amorphous semiconductor film as a semiconductor layer (a channel forming region, a source region, a drain region, and the like) of a transistor configuring the pixel of the present invention, manufacturing cost can be reduced. For example, by employing the pixel configuration shown in FIGS. 6A and 6B or FIG. 36 the amorphous semiconductor film can be used.

Note that a structure of a transistor and a structure of a capacitor element applicable in the pixel configuration of the present invention are not limited to the above structures, and various structures can be used.

Note that the content described in this embodiment mode can be arbitrarily combined with the content described in Embodiment Modes 1 to 8.

Embodiment Mode 10

The photo-sensor which detects external light strength may be incorporated into a display device. The photo-sensor may be mounted on the display device as part, or may be formed being united with a display panel. In the case where it is formed being united with the display panel, the display surface can be used as an acceptance surface of the photo-sensor, which has a great effect in design. In other words, gray scale control based on the external light strength can be performed without making users conscious of the photo-sensor attached to the display device.

Figure 40:
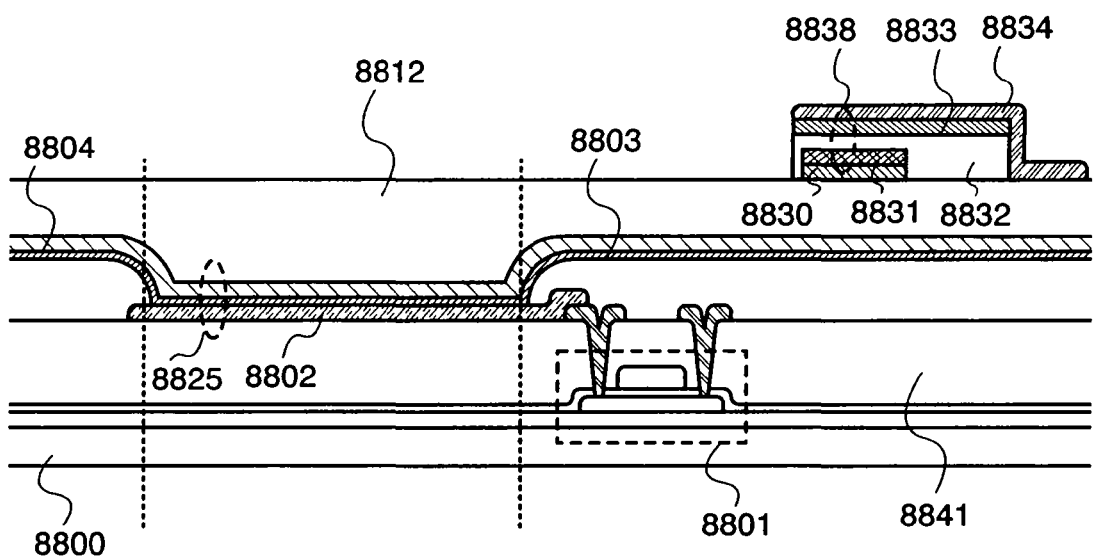
FIG. 40 is a view explaining a structure of a display device according to the present invention.

FIG. 40 is a diagram showing one mode in which the photo-sensor is formed united over the display panel. In FIG. 40, the case where a pixel is constituted by a light-emitting element for light-emission of electroluminescence and a TFT which controls the operation of the light-emitting element is shown.

In FIG. 40, a driving TFT 8801 formed over a light-transmitting substrate 8800, a first electrode 8802 (a pixel electrode) formed from a transparent material, an EL layer 8803 and a second electrode 8804 (an opposite electrode) formed from a transparent material are provided. The first electrode 8802 (a pixel electrode) is formed over an insulating film 8841. A light-emitting element 825 emits light upward (the arrow direction). Then, over an insulating film 8812 formed over the second electrode 8804, a photoelectric conversion element 8838 formed of a laminated body of a p-type layer 8831; an i-type layer 8832 which is virtually intrinsic; and an n-type layer 8833, an electrode 8830 connected to the p-type layer 8831, and an electrode 8834 connected to the n-type layer 8833 are provided. Note that the photoelectric conversion element 8838 may be formed over the insulating film 8841.

In this embodiment mode, the photoelectric conversion element 8838 is used as a photo-sensor element. The light-emitting element 8825 and the photoelectric conversion element 8838 are formed over the same substrate 8000, and the light emitted from the light-emitting element 8825 constitutes a projected image, which is viewed by the user. On the other hand, the photoelectric conversion element has functions of detecting external light and sending the detection signal to a controller. In such a manner, the light-emitting element and the photo-sensor (the photoelectric conversion element) can be formed over the same substrate, which contributes to miniaturization of the set.

Note that the content described in this embodiment mode can be arbitrarily combined with the content described in Embodiment Modes 1 to 9.

Embodiment Mode 11

In this embodiment mode, description is made on hardware for controlling the driving methods described in Embodiment Modes 1 to 10.

Figure 26:
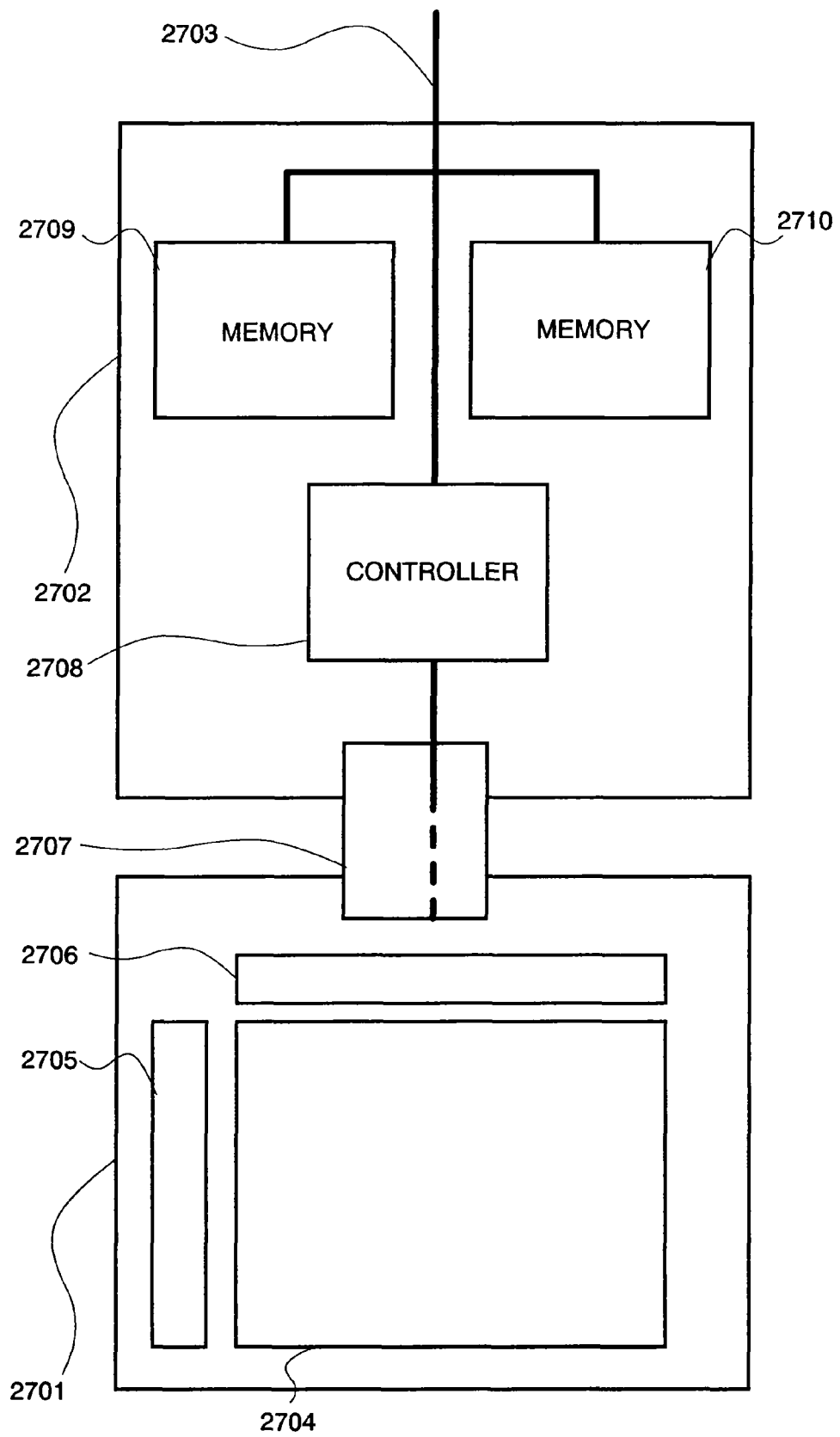
FIG. 26 is a diagram explaining a configuration of a display device according to the present invention.

FIG. 26 is a rough constitution diagram. A pixel array 2704 is arranged over a substrate 2701. In addition, a source driver 2706 and a gate driver 2705 are arranged in many cases. Besides, a power supply circuit, a pre-charge circuit, a timing generation circuit, or the like may be arranged. There is also a case where the source driver 2706 and the gate driver 2705 are not arranged. In this case, a circuit which is not provided over the substrate 2701 is formed on an IC in many cases. The IC is mounted on the substrate 2701 by COG (Chip On Glass) in many cases. Alternatively, the IC may be mounted on a connecting substrate 2707 which connects a peripheral circuit substrate 2702 and the substrate 2701.

A signal 2703 is input to the peripheral circuit substrate 2702, and a controller 2708 performs control to store the signal in a memory 2709, a memory 2710, or the like. In a case where the signal 2703 is an analog signal, the signal is stored in the memory 2709, the memory 2710, or the like in many cases after analog-digital conversion is performed. Then, the controller 2708 outputs a signal to the substrate 2701 by using the signal stored in the memory 2709, the memory 2710, or the like.

In order to realize the driving methods described in Embodiment Modes 1 to 9, the controller 2708 controls various pulse signals or the like and outputs a signal to the substrate 2701.

Note that the content described in this embodiment mode can be arbitrarily combined with the content described in Embodiment Modes 1 to 9.

Embodiment Mode 12

Figure 27:
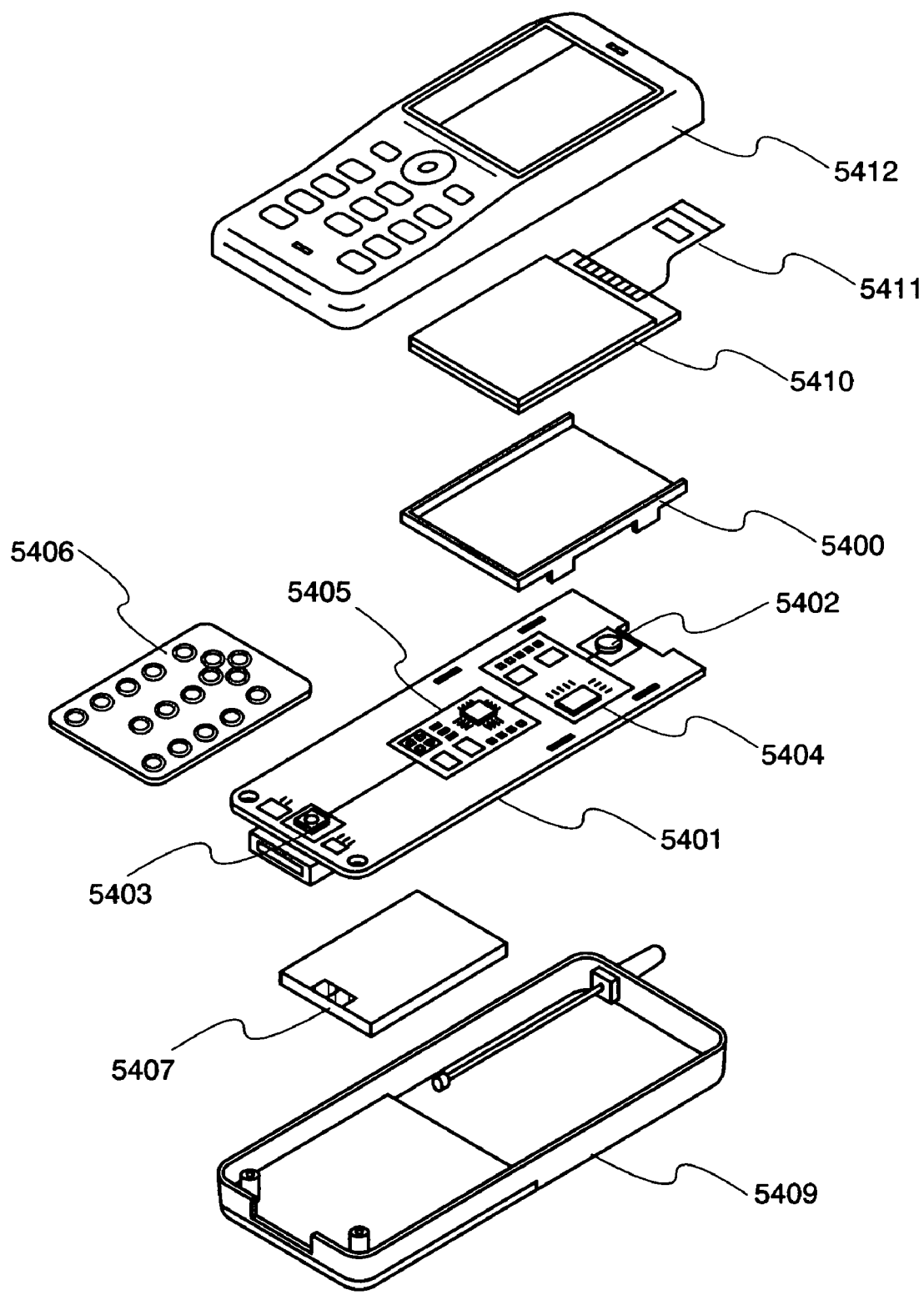
FIG. 27 is a view explaining an electronic device to which the present invention is applied.

A structure example of a cellular phone having a display device according to the present invention or a display device using the driving method according to the present invention in a display portion will be explained with reference to FIG. 27.

A display panel 5410 is incorporated in a housing 5400 so as to be detachable. The shape and size of the housing 5400 can be appropriately changed in accordance with the size of the display panel 5410. The housing 5400 to which the display panel 5410 is fixed is fitted in a printed wiring board 5401 and assembled as a module.

The display panel 5410 is connected to the printed wiring board 5401 through an FPC 5411. The printed wiring board 5401 is provided with a speaker 5402, a microphone 5403, a transmitting and receiving circuit 5404, and a signal processing circuit 5405 including a CPU, a controller, and the like. Such a module, an input means 5406, and a buttery 5407 are combined and stored using a chassis 5409. Note that a pixel portion of the display panel 5410 is arranged so as to be seen from a window formed in the chassis 5412.

Figure 28B:
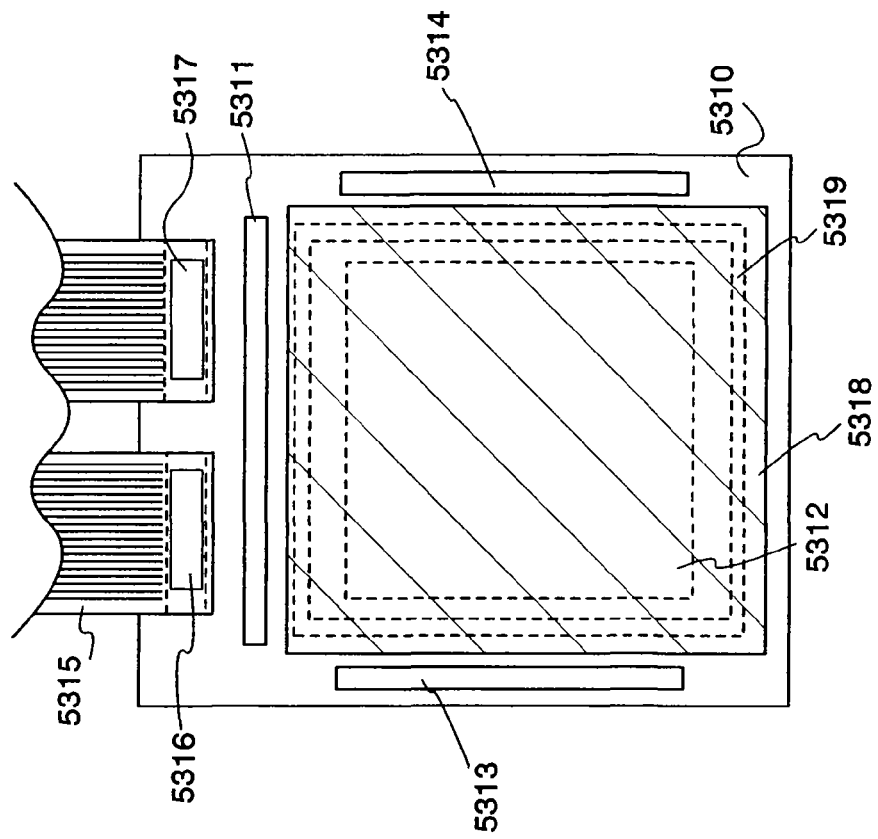
FIGS. 28A and 28B are diagrams explaining a configuration of a display device according to the present invention.
Figure 28A:
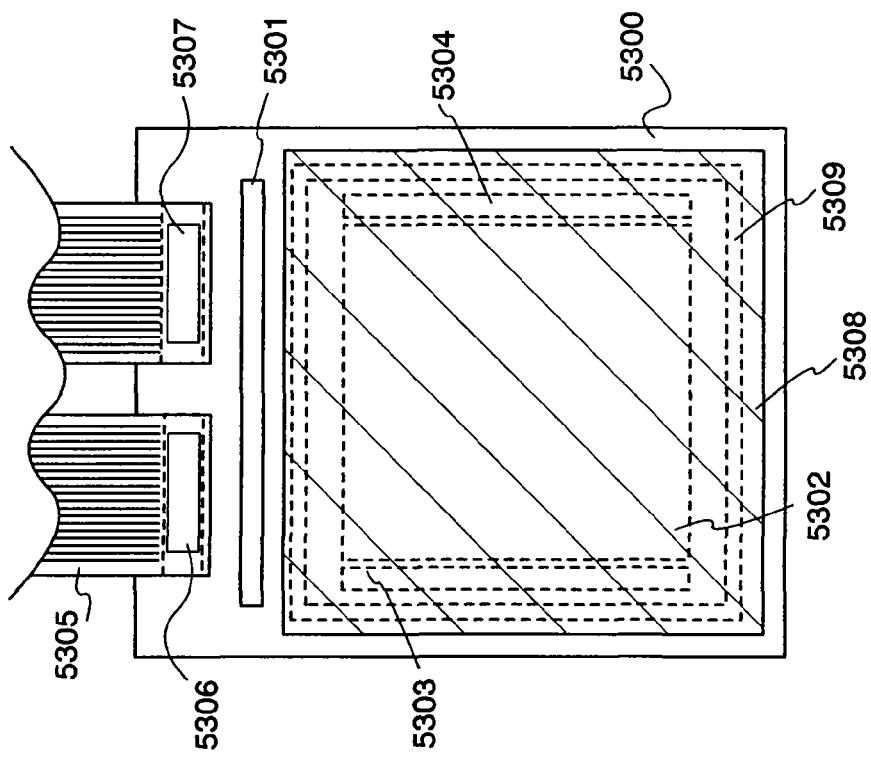

In the display panel 5410, the pixel portion and part of peripheral driver circuits (a driver circuit having a low operation frequency among a plurality of driver circuits) may be formed using TFTs in an integrated manner over a substrate, and another part of the peripheral driver circuits (a driver circuit having a high operation frequency among the plurality of driver circuits) may be formed on an IC chip. The IC chip may be mounted on the display panel 5410 by COG (Chip On Glass). The IC chip may alternatively be connected to a glass substrate using TAB (Tape Automated Bonding) or a printed wiring board. Note that FIG. 28A shows an example of a configuration of a display panel where part of peripheral driver circuits is integrated with a pixel portion over a substrate and an IC chip on which the another part of peripheral driver circuits is formed is mounted by COG or the like. The display panel shown in FIG. 28A has a substrate 5300, a signal line driver circuit 5301, a pixel portion 5302, first scanning line driver circuit 5303, second scanning driver circuit 5304, an FPC 5305, IC chips 5306 and 5307, a sealing substrate 5308, a sealing material 5309. The signal line driver circuit 5301 which is formed in an IC chip is mounted over the substrate 5300 as a COG or the like. By using the above configuration, power consumption of the display device can be reduced, and operating time per charge of a cellular phone handset can be made longer. In addition, cost reduction of a cellular phone handset can be achieved.

In addition, by converting the impedance of a signal set to a scanning line or a signal line by using a buffer, a write period for pixels of each row can be shortened. Accordingly, a high-definition display device can be provided.

Moreover, in order to further reduce power consumption, a pixel portion may be formed using TFIs over a glass substrate, and all signal line driver circuits may be formed on an IC chip, which may be mounted on a display panel by COG (Chip On Glass) or the like.

By using a display device of the present invention, it becomes possible to see a high-contrast clear image.

The structure described in this embodiment mode is an example of a cellular phone, and a display device according to the present invention can be applied not only to the cellular phone having the above structure but also to cellular phones having various kinds of structures.

Embodiment Mode 13

Figure 29:
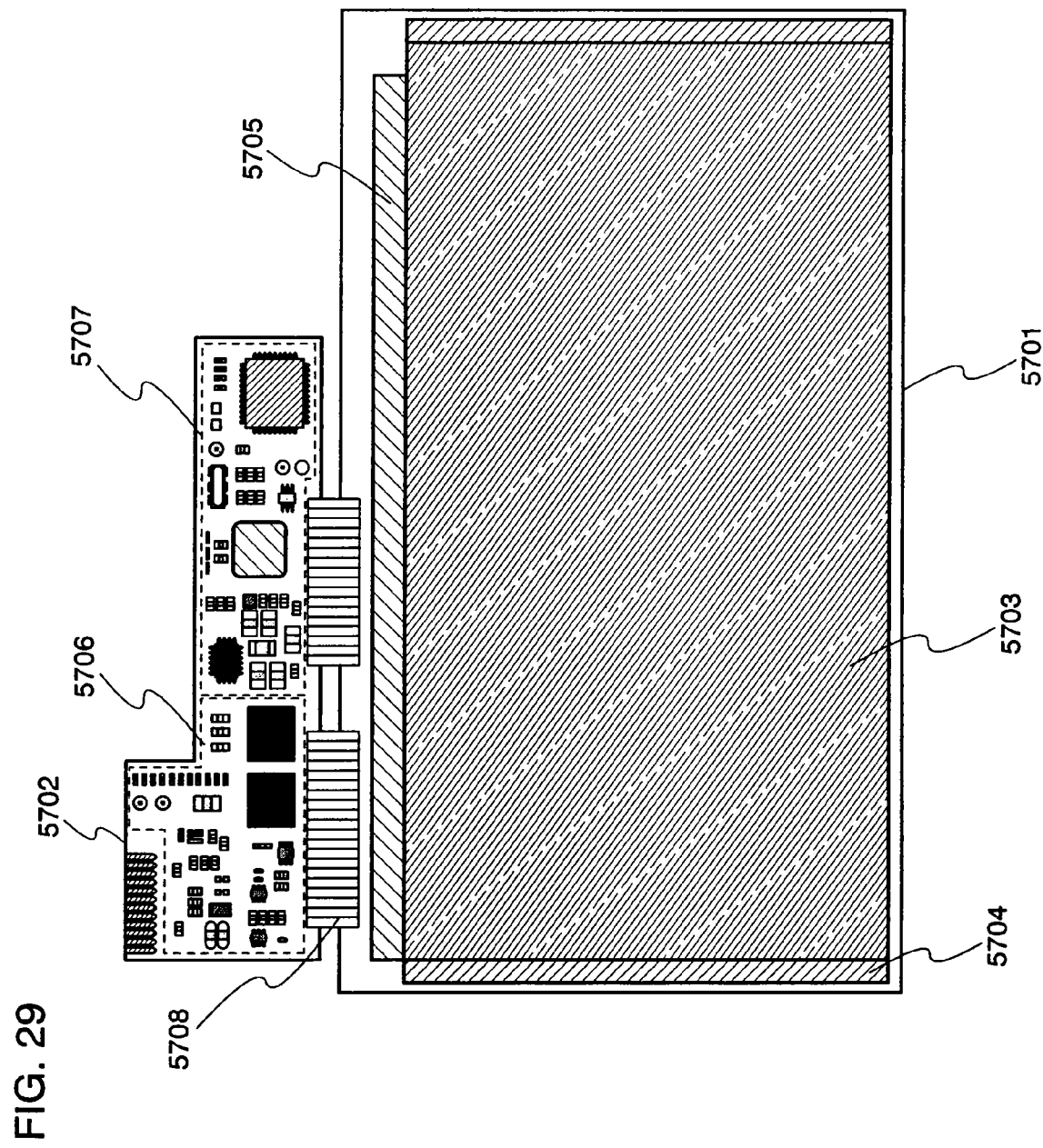
FIG. 29 is a diagram explaining a configuration of a display device according to the present invention.

FIG. 29 shows an EL module in which a display panel 5701 and a circuit board 5702 are combined. The display panel 5701 includes a pixel portion 5703, a scanning line driver circuit 5704, and a signal line driver circuit 5705. Over the circuit board 5702, for example, a control circuit 5706, a signal dividing circuit 5707, and the like are formed. The display panel 5701 and the circuit board 5702 are connected to each other by a connection wiring 5708. As the connection wiring, an FPC or the like can be used.

The control circuit 5706 corresponds to the controller 2708, the memory 2709, the memory 2710, or the like in Embodiment Mode 7. Mainly in the control circuit 4706, the appearance order of sub-frames or the like is controlled.

In the display panel 5701, the pixel portion and part of peripheral driver circuits (a driver circuit having a low operation frequency among a plurality of driver circuits) may be formed using TFTs in an integrated manner over a substrate, and another part of the peripheral driver circuits (a driver circuit having a high operation frequency among the plurality of driver circuits) may be formed on an IC chip. The IC chip may be mounted on the display panel 5701 by COG (Chip On Glass) or the like. The IC chip may alternatively be mounted on the display panel 5701 by using TAB (Tape Automated Bonding) or a printed wiring board. Note that FIG. 28A shows an example of a configuration of a display panel where part of peripheral driver circuits is integrated with a pixel portion over a substrate and an IC chip on which another part of the peripheral driver circuits is formed is mounted by COG or the like. By using the above configuration, power consumption of the display device can be reduced, and operating time per charge of a cellular phone handset can be made longer. In addition, cost reduction of a cellular phone handset can be achieved.

In addition, by converting the impedance of a signal set to a scanning line or a signal line by using a buffer, a write period for pixels of each row can be shortened. Accordingly, a high-definition display device can be provided.

Moreover, in order to further reduce power consumption, a pixel portion may be formed using TFTs over a glass substrate, and all signal line driver circuits may be formed on an IC chip, which may be mounted on a display panel by COG (Chip On Glass) or the like. The display panel shown in FIG. 28B has a substrate 5310, a signal line driver circuit 5311, a pixel portion 5312, first scanning line driver circuit 5313, second scanning driver circuit 5314, an FPC 5315, IC chips 5316 and 5317, a sealing substrate 5318, a sealing material 5319. The signal line driver circuit 5311, the first scanning driver circuit 5313 and the second scanning driver circuit 5314 which are formed in IC chips are mounted over the substrate 5310 as a COG or the like.

Note that a pixel portion may be formed using a TFT over a substrate, and all peripheral driver circuits may be formed on an IC chip, which may be mounted on a display panel by COG (Chip On Glass). Note that FIG. 28B shows an example of constitution where a pixel portion is formed over a substrate and an IC chip provided with a signal line driver circuit is mounted on the substrate by COG or the like.

Figure 30:
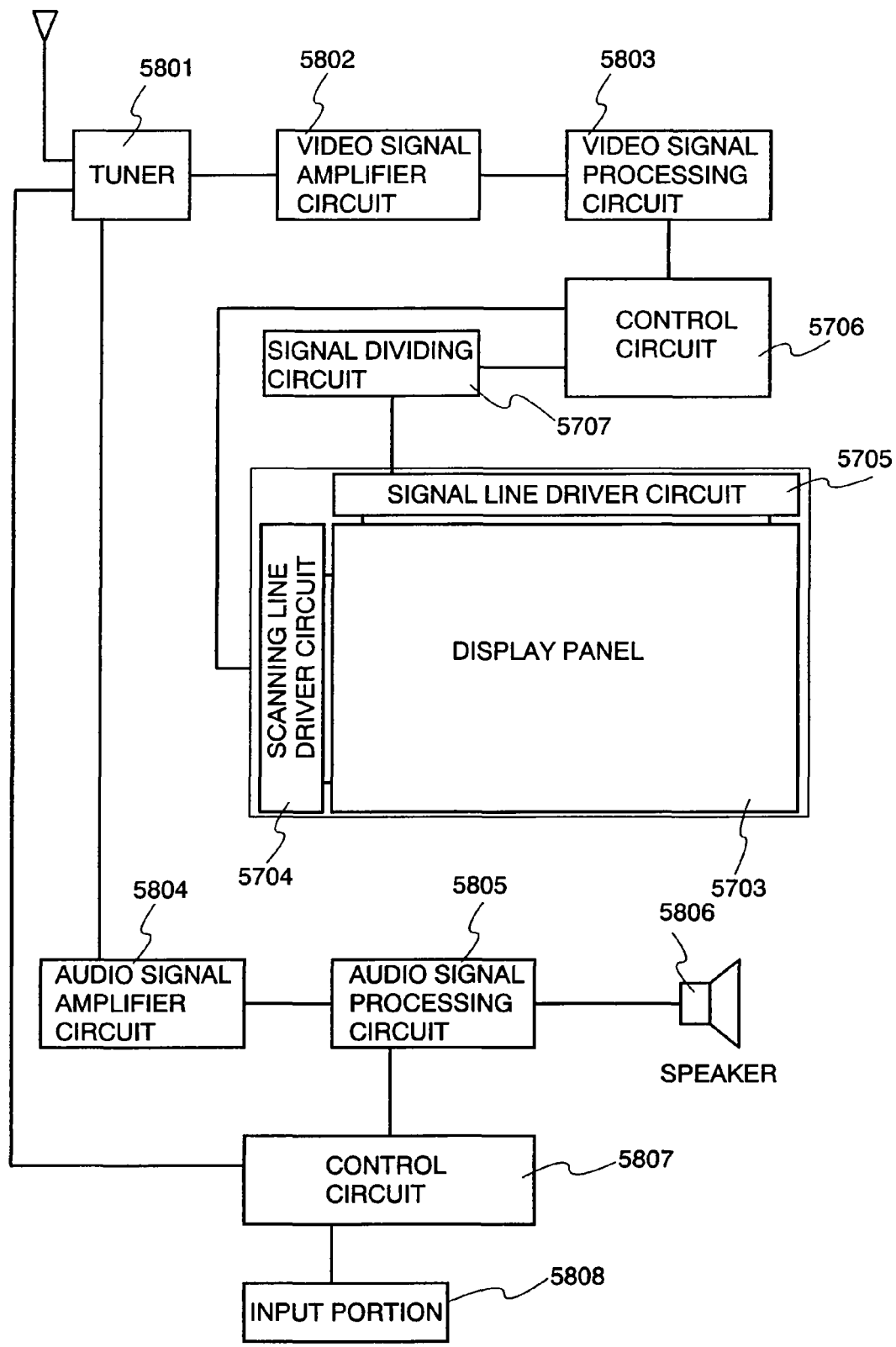
FIG. 30 is a diagram explaining a configuration of a display device according to the present invention.

An EL television receiver can be completed with the above EL module. FIG. 30 is a block diagram showing a main constitution of an EL television receiver. A tuner 5801 receives a video signal and an audio signal. The video signal is processed by a video signal amplifier circuit 5802, a video signal processing circuit 5803 for converting a signal output from the video signal amplifier circuit 5802 into a color signal corresponding to each color of red, green and blue, and the control circuit 5706 for converting the video signal into the input specification of a driver circuit. The control circuit 5706 outputs respective signals to the scanning line side and the signal line side. In a case of driving in a digital manner, a configuration in which the signal dividing circuit 5707 is provided on the signal line side to supply an input digital signal divided into m pieces may be adopted.

The audio signal among the signals received by the tuner 5801 is transmitted to an audio signal amplifier circuit 5804, an output of which is supplied to a speaker 5806 through an audio signal processing circuit 5805. A control circuit 5807 receives control information of a receiving station (reception frequency) or sound volume from an input portion 5808 and transmits signals to the tuner 5801 and the audio signal processing circuit 5805.

By incorporating the EL module into a chassis, a television receiver can be completed. A display portion is formed with the EL module. In addition, a speaker, a video input terminal, or the like are provided appropriately.

Of course, the present invention is not limited to the television receiver, and can be applied to various uses as a large-sized display medium such as an information display board at a train station, an airport, or the like, or an advertisement display board on the street, as well as a monitor of a personal computer.

By using the display device of the present invention as described above, it becomes possible to see a high-contrast clear image.

Note that the content described in this embodiment mode can be arbitrarily combined with the content described in Embodiment Modes 1 to 13.

Embodiment Mode 14

In this embodiment mode, examples of a photo-sensor and an amplifier will be shown.

Figure 44:
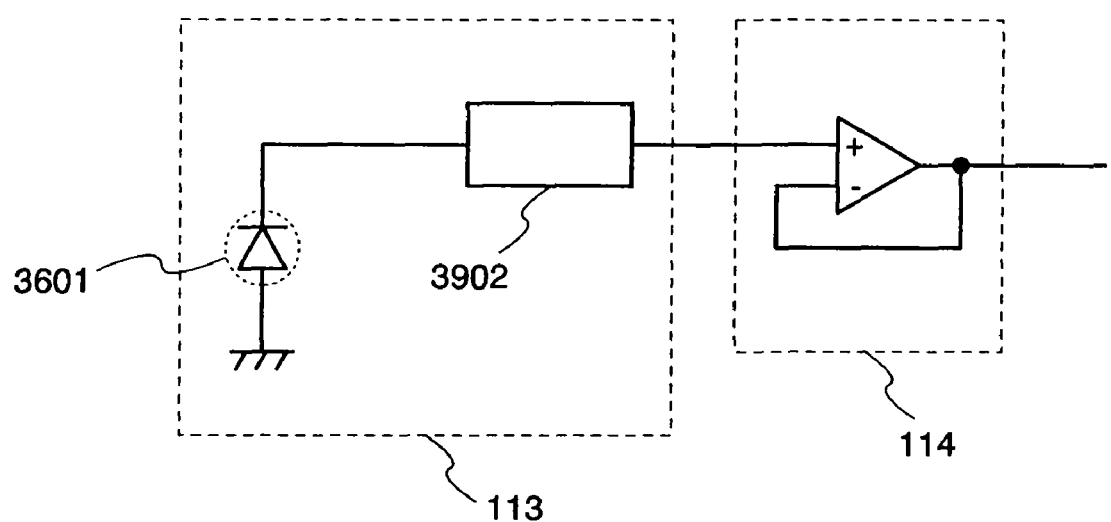
FIG. 44 is a diagram showing an example of a photo-sensor or an amplifier.

FIG. 44 shows a basic configuration diagram. A photoelectric conversion element 3601 is irradiated with light and current flows depending on illuminance. The current is converted into a voltage signal by a current-voltage conversion circuit 3902. In this manner, a photo-sensor 113 is formed to include the photoelectric conversion element 3601 and the current-voltage conversion circuit 3902. Then the signal outputted from the photo-sensor 113 is inputted into an amplifier 114. FIG. 44 shows a voltage follower circuit using an operational amplifier. However, the present invention is not limited thereto.

Figure 41:
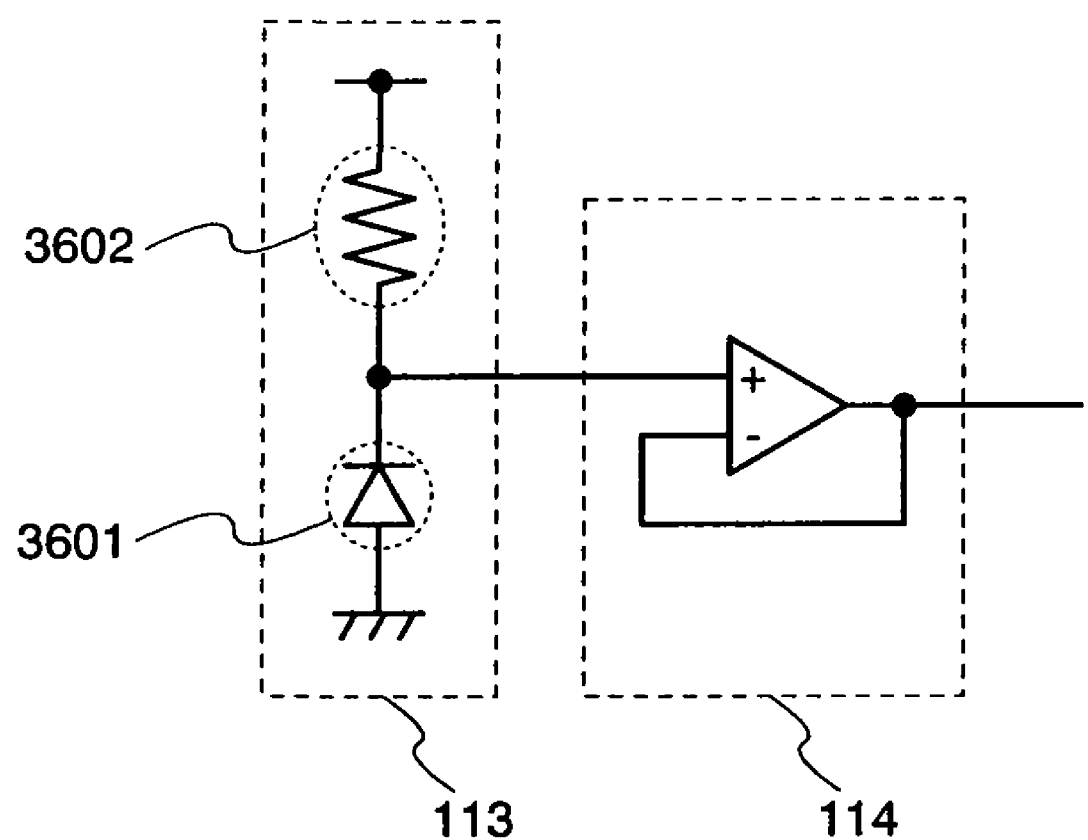
FIG. 41 is a diagram showing an example of a photo-sensor or an amplifier.

As shown in FIG. 41, a resistive element 3602 may be used as an example of the current-voltage conversion circuit 3902. However, the present invention is not limited thereto. The circuit may also be formed using an operational amplifier.

Figure 42:
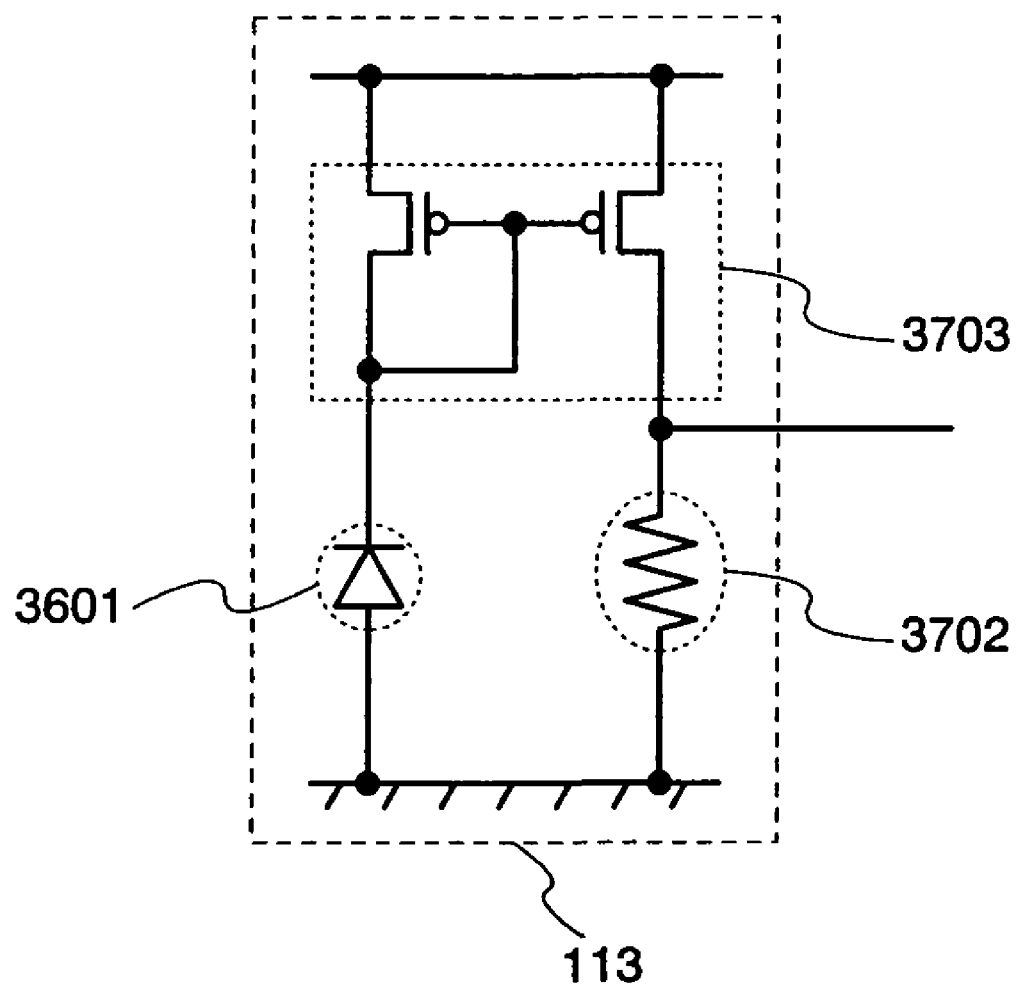
FIG. 42 is a diagram showing an example of a photo-sensor or an amplifier.

Although current flowing to the photoelectric conversion element 3601 is used in FIGS. 44 and 41, the current may also be amplified. For example, as shown in FIG. 42, current flowing to a resistive element 3702, which is a current-voltage conversion circuit, may be increased using a current mirror circuit 3703. Consequently, it is possible to improve sensitivity to light or to improve noise immunity.

Figure 43:
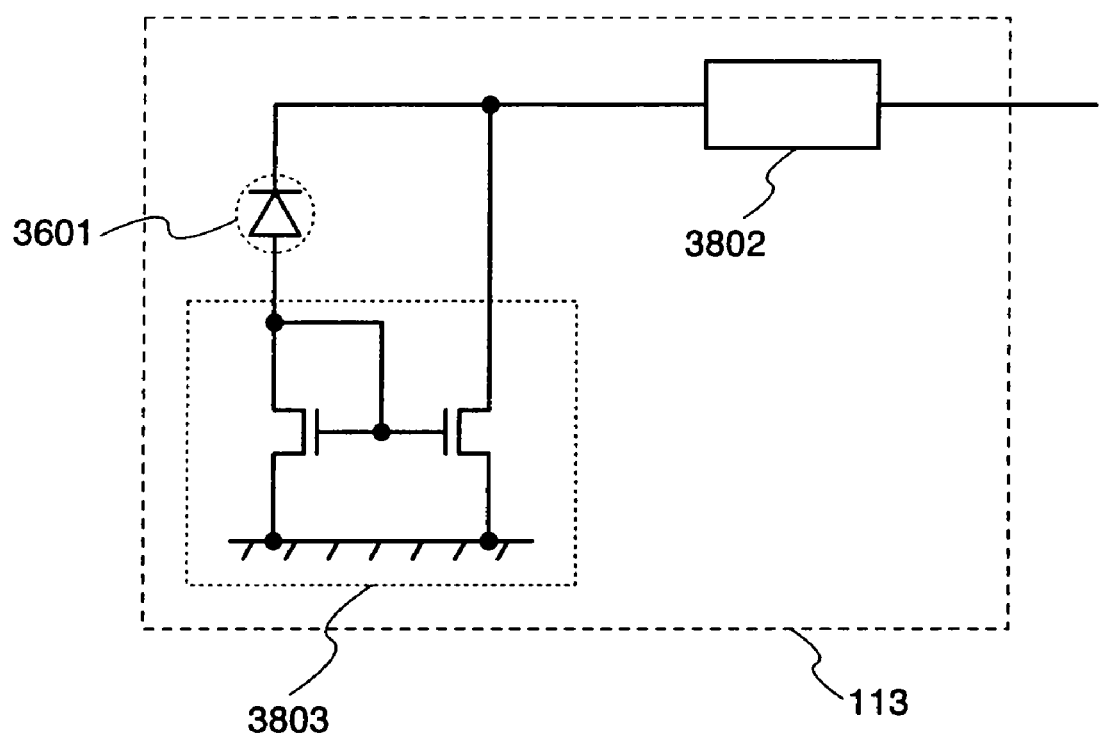
FIG. 43 is a diagram showing an example of a photo-sensor or an amplifier.

In addition, as shown in FIG. 43, all current flowing to the photoelectric conversion element 3601 and the current mirror circuit 3803 may be made to flow to the current-voltage conversion circuit 3802 so that, further, sensitivity to light is improved or resistance to noise is improved. Accordingly, it is possible to a wiring connected to the photoelectric conversion element 3601 and the output of the current mirror circuit can be made into one; thus, the number of connection terminals can be reduced.

Note that the content described in this embodiment mode can be arbitrarily combined with the content described in Embodiment Modes 1 to 14.

Embodiment Mode 15

The present invention can be applied to various electronic devices. Specifically, it can be applied to a display portion of an electronic device. Examples of such an electronic device are as follows: a camera such as a video camera or a digital camera, a goggle type display, a navigation system, an audio reproducing device (such as a car audio or an audio component), a computer, a game machine, a portable information terminal (such as a mobile computer, a cellular phone, a portable game machine, or an electronic book), an image reproducing device provided with a recording medium reading portion (specifically, a device which can reproduce a recording medium such as a digital versatile disc (DVD) and includes a light-emitting device capable of displaying images thereof), and the like.

Figure 31A:
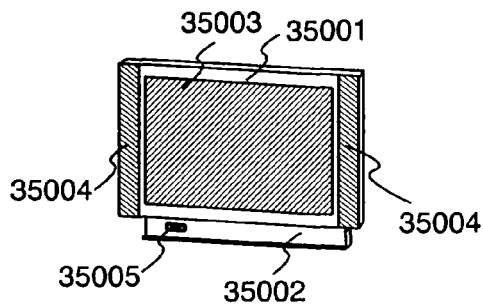
FIGS. 31A to 31H are views each explaining an electronic device to which the present invention is applied.

FIG. 31A shows a light-emitting device, which includes a chassis 35001, a supporting stand 35002, a display portion 35003, a speaker portion 35004, a video input terminal 35005, and the like. The display device of the present invention can be used for the display portion 35003. Note that the light-emitting device includes in its category all light-emitting devices used for displaying information, for example, for a personal computer, for TV broadcast reception, or for advertisement display. The light-emitting device using the present invention for the display portion 35003 makes it possible to see a high-contrast clear image.

Figure 31B:
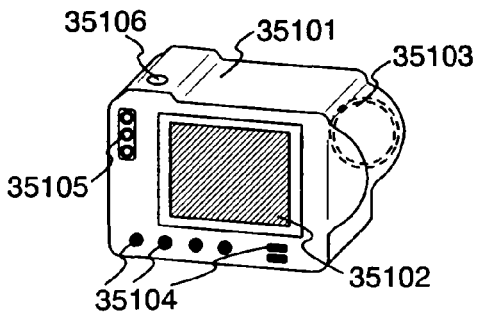

FIG. 31B shows a camera, which includes a main body 35101, a display portion 35102, an image receiving portion 35013, an operation key 35104, an external connection port 35105, a shutter 35106, and the like.

The camera using the present invention for the display portion 35102 makes it possible to see a high-contrast clear image.

Figure 31C:
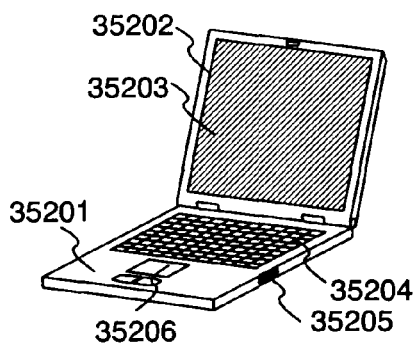

FIG. 31C shows a computer, which includes a main body 35201, a chassis 35202, a display portion 35203, a keyboard 35204, an external connection port 35205, a pointing mouse 35206, and the like. The computer using the present invention for the display portion 35203 makes it possible to see a high-contrast clear image.

Figure 31D:
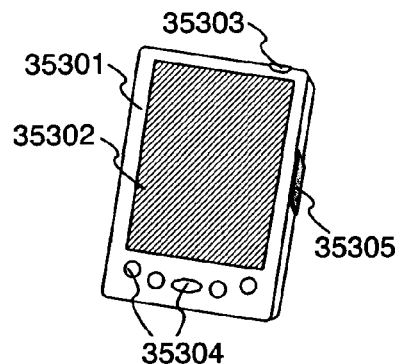

FIG. 31D shows a mobile computer, which includes a main body 35301, a display portion 35302, a switch 35303, operation keys 35304, an infrared port 35305, and the like. The mobile computer using the present invention for the display portion 35302 makes it possible to see a high-contrast clear image.

Figure 31E:
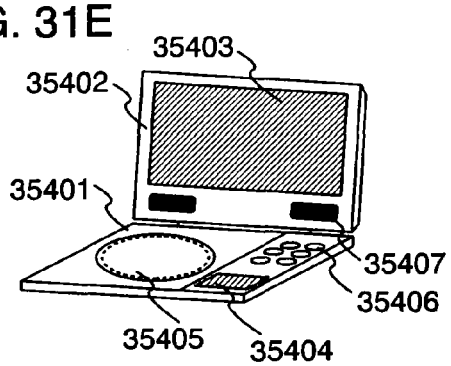

FIG. 31E shows a portable image reproducing device provided with a recording medium reading portion (specifically, a DVD reproducing device), which includes a main body 35401, a chassis 35402, a display portion A 35403, a display portion B 35404, a recording medium (DVD or the like) reading portion 35405, operation keys 35406, a speaker portion 35407, and the like. The display portion A 35403 mainly displays image information, and the display portion B 35404 mainly displays character information. The image reproducing device using the present invention for the display portion A 35403 and the display portion B 35404 makes it possible to see a high-contrast clear image.

Figure 31F:
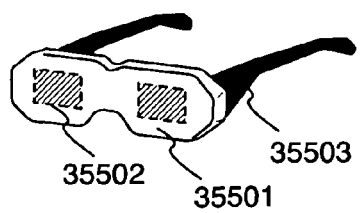

FIG. 31F shows a goggle type display, which includes a main body 35501, a display portion 35502, an arm portion 35503, and the like. The goggle type display using the present invention for the display portion 35502 makes it possible to see a high-contrast clear image.

Figure 31G:
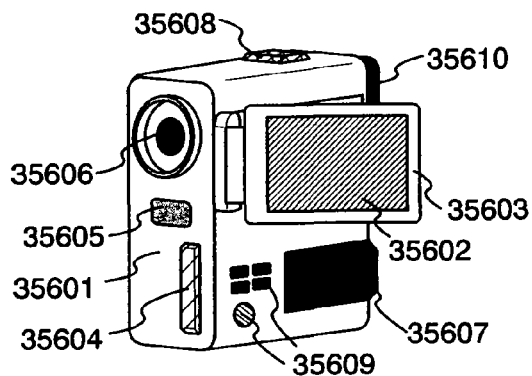

FIG. 31G shows a video camera, which includes a main body 35601, a display portion 35602, a chassis 35603, an external connection port 35604, a remote control receiving portion 35605, an image receiving portion 35606, a battery 35607, an audio input portion 35608, operation keys 35609, an eye piece portion 35610, and the like. The video camera using the present invention for the display portion 35602 makes it possible to see a high-contrast clear image.

Figure 31H:
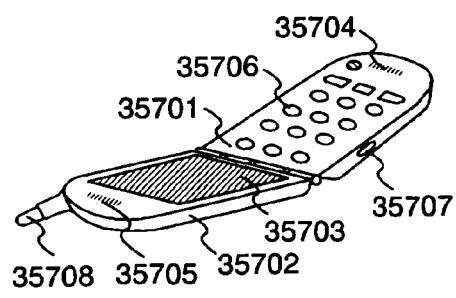

FIG. 31H shows a cellular phone handset, which includes a main body 35701, a chassis 35702, a display portion 35703, an audio input portion 35704, an audio output portion 35705, operation keys 35706, an external connection port 35707, an antenna 35708, and the like. The cellular phone handset using the present invention for the display portion 35703 makes it possible to see a high-contrast clear image.

As described above, the applicable range of the present invention is so wide that the present invention can be applied to electronic devices of various fields. In addition, the electronic device of this embodiment mode may use a display device having any of the structures described in Embodiment Modes 1 to 14.

The present application is based on Japanese Patent Application Serial No. 2005-148837 filed on May 20, 2005 in Japanese Patent Office, the entire contents of which are hereby incorporated by reference.

TABLE 1

| Brightness (lux) | Rough Indication of Brightness | (lux) |
|---|---|---|
| 1,000,000 | Toyama Beach in midsummer | >100,000 |
| | Sunlight of Sunny day in Daytime | 100,000 |
| | Sunlight of Sunny day at 10 a.m. | 65,000 |
| | Sunlight of Sunny day at 3 p.m. | 35,000 |
| | Sunlight of Cloudy day in Daytime | 32,000 |
| | Sunlight of Cloudy day at 10 a.m. | 25,000 |
| 10,000 | Sunlight of Cloudy day after 1 hour from sunrise | 2,000 |
| 1,000 | Sunlight of Sunny day at 1 hour before sunset | 1,000 |
| | Lighting of Pachinko Parlors | 1,000 |
| | Lighting of Department Store | 500-700 |
| | Fluorescent Lamp of Office | 400-500 |
| | Sunlight at Sunrise/Sunset | 300 |
| | Two 30 W Fluorescent Lamps in eight tatami mats room | 300 |
| | Arcade at night | 150-200 |
| 100 | Under Fluorescent Lamp | 50-100 |
| | 30 cm away from Lighter | 15 |
| 10 | 20 cm away form candle | 10-15 |
| | Civil Twilight (Zenith Distance of Sun 96 degree) | 5 |
| 1 | Moonlight | 0.5-1 |
| | Nautical Twilight (Zenith Distance of Sun 102 degree) | 0.01 |
| | Astronomic Twilight (Zenith Distance of Sun 108 degree) | 0.001 |

TABLE 2

|  |  | 500~1,500 [lx] | | ~10,000 [lx]~ ←in the | | ~100,000 [lx]~ ←in the | |  |
|---|---|---|---|---|---|---|---|---|
|  |  | inside room→ | ←inside lighted hall → | open air of cloudy day→ |  | open air of sunny day→ | Power consumption |
| EL panel (2.0 QVGA) | 2-tone | Good visibility is obtained with respect to natural image and text. | ◎~○ | Good visibility is obtained with respect to text. | ○ | Visibility of text can be kept. | ○~Δ | ◎ |
|  | 8-tone |  |  | In low contrast, visibility decreases, when background color is close to the contrast. |  | In low contrast, visibility decreases. In low contrast, Visibility decreases. | Δ | ◎ |
|  | natural image (>64-tone) |  |  | In low contrast, visibility decreases, when peripheral display part is Halftone. | Δ | Visibility becomes deteriorated. In low contrast, visibility decreases. | Δ~X | ○ |
| Transmissive LCD Panel (1.9QVGA) |  | Good visibility is obtained with respect to natural image and text. However, contrast decreases compared with that of EL panel. | ◎~○ | Same as above. Visibility of text is on equality with EL Panel. However, visibility of natural image has no advantage over EL Panel. | Δ~X | Visibility becomes deteriorated. Sometime, viewers can not have visual under Direct sunshine. | X | ○~Δ |
| Semi-Transmissive LCD Panel (2.1QCIF+) |  | Good visibility is obtained with respect to natural image and text. However, contrast decreases compared with that of EL panel. | ○ | Comparatively good visibility of Natural Image is obtained. Contrast does not decrease. Color does not shift. | ○ | Comparatively good visibility is kept, since reflection component of external light increases. | ○ | ○ |
| Reflection LCD Panel |  | Visibility decreases eminently. In low contrast, visibility decreases. | Δ~X | In low contrast, visibility decreases when peripheral region is Halftone. | ○ | Comparatively good visibility is kept, since reflection component of external light increases. | ○ | ◎ |

What is claimed is:

1. A display device comprising:
   a plurality of pixels formed over a substrate; and
   a source driver comprising a shift register, a digital data processing circuit, and an analog digital switching circuit interposed between the shift register and the digital data processing circuit,
   wherein the display device includes at least a first display mode and a second display mode,
   wherein an analog signal is supplied to the plurality of pixels in the first display mode,
   wherein a digital signal is supplied to the plurality of pixels in the second display mode, and
   wherein the first and the second display modes are switched depending on an external light intensity.

2. A display device according to claim 1, wherein the external light is detected by a photosensor.

3. A display device according to claim 1, wherein the plurality of pixels are arranged in matrix.

4. A display device according to claim 1, wherein the display device is an EL display device.

5. A display device according to claim 1, wherein the display device is incorporated in at least one selected from the group consisting of a video camera, a digital camera, a computer, an image reproducing device, a goggle type display, and a cellular phone.

6. A display device comprising:
   a plurality of pixels formed over a substrate, each of the plurality of pixels including a light-emitting element; and
   a source driver comprising a shift register, a digital data processing circuit, and an analog digital switching circuit interposed between the shift register and the digital data processing circuit,
   wherein the display device includes at least a first display mode and a second display mode,
   wherein an analog signal is supplied to the plurality of pixels in the first display mode,
   wherein a digital signal is supplied to the plurality of pixels in the second display mode,
   wherein the display modes are switched depending on an external light intensity, and
   wherein a voltage supplied to the light-emitting element is different in the first and the second display modes.

7. A display device according to claim 6, wherein the external light is detected by a photosensor.

8. A display device according to claim 6, wherein the plurality of pixels are ranged in matrix.

9. A display device according to claim 6, wherein the display device is an EL display device.

10. A display device according to claim 6, wherein the display device is incorporated in at least one selected from the group consisting of a video camera, a digital camera, a computer, an image reproducing device, a goggle type display, and a cellular phone.

11. A display device comprising:
- a plurality of pixels formed over a substrate, each of the plurality of pixels including a light-emitting element and a transistor; and
- a source driver comprising a shift register, a digital data processing circuit, and an analog digital switching circuit interposed between the shift register and the digital data processing circuit,
- wherein the display device includes at least a first display mode and a second display mode,
- wherein a first electrode of the light-emitting element and one of source and drain electrodes of the transistor are electrically connected with each other,
- wherein an analog signal is supplied to the plurality of pixels in the first display mode,
- wherein a digital signal is supplied to the plurality of pixels in the second display mode,
- wherein the first and the second display modes are switched depending on an external light intensity, and
- wherein a voltage between a second electrode of the light-emitting element and the other of the source and drain electrodes of the transistor is different in the first and the second display modes.

12. A display device according to claim 11, wherein the external light is detected by a photosensor.

13. A display device according to claim 11, wherein the plurality of pixels are arranged in matrix.

14. A display device according to claim 11, wherein the display device is an EL display device.

15. A display device according to claim 11, wherein the display device is incorporated in at least one selected from the group consisting of a video camera, a digital camera, a computer, an image reproducing device, a goggle type display, and a cellular phone.

16. A display device comprising:
- a photosensor;
- a display mode switching control circuit electrically connected to the photosensor;
- a plurality of pixels; and
- a source driver comprising a shift register, a digital data processing circuit, and an analog digital switching circuit interposed between the shift register and the digital data Processing circuit, wherein a video signal is input to the analog digital switching circuit.

17. A display device according to claim 16, wherein the plurality of pixels are arranged in matrix.

18. A display device according to claim 16, wherein the display device is an EL display device.

19. A display device according to claim 16, wherein the display device is incorporated in at least one selected from the group consisting of a video camera, a digital camera, a computer, an image reproducing device, a goggle type display, and a cellular phone.

20. A display device comprising:
- a photosensor;
- a display mode switching control circuit electrically connected to the photosensor;
- a plurality of pixels; and
- a source driver comprising a shift register, a digital data processing circuit, and an analog digital switching circuit interposed between the shift register and the digital data processing circuit, wherein a video signal is input to the analog digital switching circuit, and
- wherein the display mode switching control circuit supplies a display mode control signal to the analog digital switching circuit.

21. A display device according to claim 20, wherein the plurality of pixels are arranged in matrix.

22. A display device according to claim 20, wherein the display device is an EL display device.

23. A display device according to claim 20, wherein the display device is incorporated in at least one selected from the group consisting of a video camera, a digital camera, a computer, an image reproducing device, a goggle type display, and a cellular phone.

24. A display device according to claim 1, wherein the digital data processing circuit includes a latch circuit.

25. A display device according to claim 6, wherein the digital data processing circuit includes a latch circuit.

26. A display device according to claim 11, wherein the digital data processing circuit includes a latch circuit.

27. A display device according to claim 16, wherein the digital data processing circuit includes a latch circuit.

28. A display device according to claim 20, wherein the digital data processing circuit includes a latch circuit.

* * * * *